(12) United States Patent
Park et al.

(10) Patent No.: US 11,600,688 B2
(45) Date of Patent: Mar. 7, 2023

(54) DISPLAY DEVICE

(71) Applicant: Samsung Display Co., LTD., Yongin-si (KR)

(72) Inventors: Jun Hyun Park, Suwon-si (KR); Dong Woo Kim, Yongin-si (KR); Sung Jae Moon, Seongnam-si (KR); Kang Moon Jo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 9 days.

(21) Appl. No.: 16/834,460

(22) Filed: Mar. 30, 2020

(65) Prior Publication Data

US 2020/0321427 A1   Oct. 8, 2020

(30) Foreign Application Priority Data

Apr. 5, 2019  (KR) .......................... 10-2019-0040194
Jun. 26, 2019  (KR) .......................... 10-2019-0076536

(51) Int. Cl.
*H01L 27/32* (2006.01)
(52) U.S. Cl.
CPC ...... *H01L 27/3279* (2013.01); *H01L 27/3276* (2013.01)
(58) Field of Classification Search
CPC .................................................. H01L 27/3276
See application file for complete search history.

(56) References Cited

U.S. PATENT DOCUMENTS

| | | | |
|---|---|---|---|
| 2003/0127650 A1* | 7/2003 | Park | H01L 29/78675 257/72 |
| 2015/0102324 A1* | 4/2015 | Lee | H01L 51/0097 257/40 |
| 2017/0323904 A1* | 11/2017 | Kim | H01L 29/7869 |
| 2018/0069069 A1* | 3/2018 | Ebisuno | H01L 27/323 |

FOREIGN PATENT DOCUMENTS

| | | |
|---|---|---|
| JP | 2017173505 | 9/2017 |
| KR | 100472502 | 3/2005 |
| KR | 101189146 | 10/2012 |
| KR | 1020150033790 | 4/2015 |
| KR | 1020150075512 | 7/2015 |
| KR | 1020170049705 | 5/2017 |
| KR | 1020170078075 | 7/2017 |
| KR | 1020180034856 | 4/2018 |
| KR | 1020180036853 | 4/2018 |
| KR | 1020180047589 | 5/2018 |
| KR | 1020180077954 | 7/2018 |

* cited by examiner

*Primary Examiner* — Farun Lu
(74) *Attorney, Agent, or Firm* — Cantor Colburn LLP

(57) ABSTRACT

A display device includes a substrate, a metal layer disposed on the substrate, a first conductive layer including a lower pattern disposed on the metal layer, an active layer disposed on the first conductive layer, a second conductive layer disposed on the active layer and including a first gate electrode, a pixel electrode disposed on the second conductive layer, and an emission layer and a common electrode disposed on the pixel electrode.

17 Claims, 28 Drawing Sheets

DISPLAY DEVICE

This application claims priority to Korean Patent Application No. 10-2019-0040194, filed on Apr. 5, 2019, and Korean Patent Application No. 10-2019-0076536, filed on Jun. 26, 2019, and all the benefits accruing therefrom under 35 U.S.C. § 119, the contents of which in their entirety are herein incorporated by reference.

BACKGROUND

(a) Field

Exemplary embodiments of the invention relate to a display device.

(b) Description of the Related Art

A display device displays an image, and recently, a light emitting diode display has been attracting attention as a self-emitting display.

The light emitting diode display has a self-luminous characteristic. Unlike a liquid crystal display ("LCD"), a separate light source is unnecessary, so the light emitting diode display may have a reduced thickness and a reduced weight. In addition, the light emitting diode display exhibits high-quality characteristics such as low power consumption, high luminance, and high reaction speed.

Generally, the light emitting diode display includes a plurality of pixels, and each pixel includes a plurality of transistors and a light-emitting element. The plurality of transistors is connected to signal lines and may transmit a driving current to the light-emitting element. Each transistor may include an active pattern including a channel region and a conductive region.

The light-emitting element includes an anode and a cathode, and the anode is connected to the transistor of the pixel, thereby receiving a driving current.

SUMMARY

Exemplary embodiments provide a display device with improved image quality by reducing a resistance for a predetermined signal through a metal layer while maintaining a thickness of a lower pattern to be less than a predetermined level.

Also, exemplary embodiments provide a display device with a reduced non-display area in the display panel and improved reliability in the non-display area.

An exemplary embodiment of a display device includes a substrate, a metal layer disposed on the substrate, a first conductive layer including a lower pattern disposed on the metal layer, an active layer disposed on the first conductive layer, a second conductive layer disposed on the active layer and including a first gate electrode, a pixel electrode disposed on the second conductive layer, and an emission layer and a common electrode disposed on the pixel electrode.

In an exemplary embodiment, the metal layer may overlap an entirety of the surface of the substrate.

In an exemplary embodiment, an opening overlapping the active layer may be defined in the metal layer.

In an exemplary embodiment, a third conductive layer disposed between the second conductive layer and the pixel electrode and including a common voltage line, a driving voltage line, and a data line may be further included.

In an exemplary embodiment, the metal layer may include at least one of a first voltage metal layer connected to the driving voltage line and a second voltage metal layer connected to the common voltage line.

In an exemplary embodiment, the metal layer may include the first voltage metal layer and the second voltage metal layer, and the first voltage metal layer and the second voltage metal layer may be spaced apart from each other.

In an exemplary embodiment, an opening overlapping the active layer may be defined in the first voltage metal layer and the second voltage metal layer.

In an exemplary embodiment, the data line may include a first data line, a second data line, and a third data line, and the metal layer may include at least one among a first sub-metal layer connected to the first data line, a second sub-metal layer connected to the second data line, and a third sub-metal layer connected to the third data line.

In an exemplary embodiment, the metal layer may include the first sub-metal layer, the second sub-metal layer, and the third sub-metal layer, and an opening overlapping the active layer may be defined in the first sub-metal layer, the second sub-metal layer, and the third sub-metal layer.

In an exemplary embodiment, the first sub-metal layer, the second sub-metal layer, and the third sub-metal layer may be spaced apart from each other.

In an exemplary embodiment, a display device in an exemplary embodiment includes a substrate, a metal layer disposed on the substrate, a first conductive layer including a lower pattern disposed on the metal layer, an active layer disposed on the first conductive layer, a second conductive layer disposed on the active layer and including a first gate electrode, a pixel electrode disposed on the second conductive layer, and an emission layer and a common electrode disposed on the pixel electrode, where a thickness of the metal layer is about 6000 angstroms to about 10,000 angstroms.

An exemplary embodiment of a display device includes a substrate including a display area and a non-display area, a light-emitting element disposed in the display area, a gate driver disposed in the non-display area and including a plurality of transistors, and a first metal layer overlapping a plurality of transistors.

In an exemplary embodiment, the display device may further include a second metal layer overlapping the display area and disposed in a same layer as the first metal layer.

In an exemplary embodiment, the first metal layer may have an overall plate shape overlapping the plurality of transistors disposed in a matrix direction.

In an exemplary embodiment, each of the plurality of transistors may include a semiconductor layer, a gate electrode overlapping the semiconductor layer, and a source electrode and a drain electrode connected to the semiconductor layer.

In an exemplary embodiment, the display device may include a gate line including the gate electrode, a first signal line including the source electrode, and a second signal line including the drain electrode, the gate line, the first signal line, and the second signal line extend in a first direction, and the semiconductor layer may extend in a second direction different from the first direction.

In an exemplary embodiment, the display device may include a plurality of semiconductor layers repeatedly disposed along the first direction, and the first metal layer may overlap the plurality of semiconductor layers.

In an exemplary embodiment, the display device may include a plurality of semiconductor layers repeatedly disposed along the first direction, and the first metal layer may include a plurality of first auxiliary metal layers respectively overlapping the plurality of semiconductor layers.

In an exemplary embodiment, each of the plurality of first auxiliary metal layers may extend in the second direction in a plan view.

In an exemplary embodiment, the plurality of first auxiliary metal layers may be repeatedly disposed along the first direction.

In an exemplary embodiment, the plurality of auxiliary metal layers may be spaced apart from each other.

In an exemplary embodiment, a width of one among the plurality of first auxiliary metal layers may be larger than a width of one among the plurality of semiconductor layers.

An exemplary embodiment of a display device includes a substrate including a display area and a non-display area, a light-emitting element disposed in the display area, a gate driver including a plurality of first transistors disposed in the non-display area, and a first metal layer overlapping at least some among the plurality of first transistors, each of the plurality of first transistors includes a gate electrode, a semiconductor layer, a source electrode, and a drain electrode, and a width of the first metal layer is larger than the width of the semiconductor layer.

In an exemplary embodiment, the first metal layer may be electrically connected to the gate electrode.

In an exemplary embodiment, a thickness of the first metal layer may be about 1000 angstroms to about 4000 angstroms.

In an exemplary embodiment, a planar area of the first metal layer may be larger than a planar area of the semiconductor layer.

In an exemplary embodiment, the semiconductor layer may completely overlap the first metal layer.

In an exemplary embodiment, a second transistor disposed on the display area and a second metal layer overlapping the second transistor may be further included.

In an exemplary embodiment, a width of the second metal layer may be larger than a width of a semiconductor layer included in the second transistor.

In an exemplary embodiment, the plurality of first transistors may be electrically connected to each other.

In an exemplary embodiment, the first metal layer may include a plurality of first auxiliary metal layers extending along a second direction while being disposed to be spaced apart along a first direction, and the plurality of auxiliary metal layers may be applied with the same voltage.

In the exemplary embodiments, a display device having improved image quality may be provided by reducing the resistance of the signal through the metal layer while maintaining a smaller thickness of the underlying pattern than a predetermined level.

Also, in the exemplary embodiments, the display device of which the non-display area is reduced in the display panel and the reliability is improved in the non-display area may be provided.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
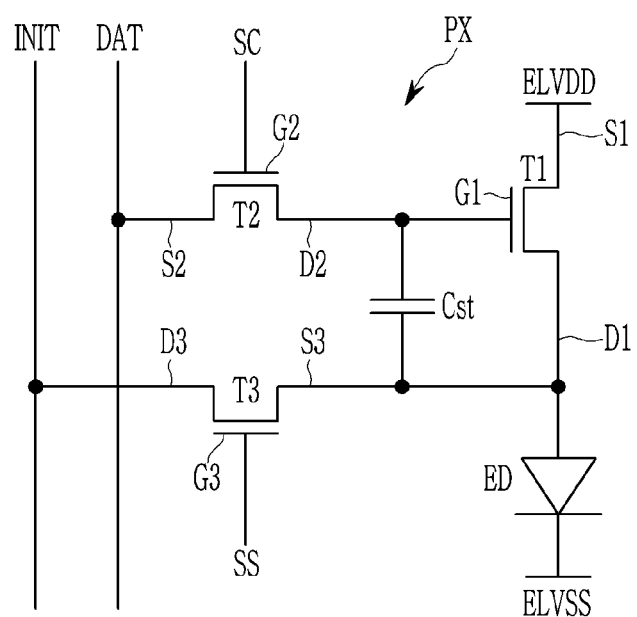
FIG. 1 is a circuit diagram of an exemplary embodiment of one pixel of a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

Descriptions of parts not related to the invention are omitted, and like reference numerals designate like elements throughout the specification.

Further, since sizes and thicknesses of constituent members shown in the accompanying drawings are arbitrarily given for better understanding and ease of description, the invention is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it may be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means viewing the object portion from the top, and the phrase "in a cross-section" means viewing a cross-section of which the object portion is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Throughout this specification and the claims which follow, a plan view means a view when observing a surface parallel to two directions (e.g., a direction DR1 and a direction DR2) crossing each other, and a cross-sectional view means a view when observing a surface cut in a direction (e.g., a direction DR3) perpendicular to the surface parallel to the direction DR1 and the direction DR2. Also, to overlap two constituent elements means that two constituent elements are overlapped in the direction DR3 (e.g., a direction perpendicular to an upper surface of the substrate) unless stated otherwise.

Now, one pixel of a display device in an exemplary embodiment is described with reference to FIG. 1. FIG. 1 is a circuit diagram illustrating an exemplary embodiment of one pixel PX of a display device according to the invention.

The display device in an exemplary embodiment according to the invention may include a plurality of pixels PX, and one pixel PX may include a plurality of transistors T1, T2, and T3, a capacitor Cst, and at least one light emitting diode ("LED") ED as a light-emitting element. In the illustrated exemplary embodiment, an example in which the pixel PX includes a single LED ED is mainly described.

The plurality of transistors T1, T2, and T3 includes a first transistor T1, a second transistor T2, and a third transistor T3. Source and drain electrodes described below are for distinguishing two electrodes disposed on opposite sides of a channel of each transistor T1, T2, and T3, and the two terms may be interchanged.

A gate electrode G1 of the first transistor T1 is connected to one terminal of the capacitor Cst, a source electrode S1 of the first transistor T1 is connected to a driving voltage line transmitting a driving voltage ELVDD, and a drain electrode D1 of the first transistor T1 is connected to an anode of the LED ED and the other terminal of the capacitor Cst. The first transistor T1 receives a data voltage DAT according to a switching operation of the second transistor T2, and may supply a driving current to the LED ED depending on the voltage stored in the capacitor Cst.

A gate electrode G2 of the second transistor T2 is connected to a first scan line transmitting a first scan signal SC, a source electrode S2 of the second transistor T2 is connected to a data line transmitting the data voltage DAT or a reference voltage, and a drain electrode D2 of the second transistor T2 is connected to one terminal of the capacitor Cst and the gate electrode G1 of the first transistor T1. The second transistor T2 may be turned on depending on the first scan signal SC to transmit the reference voltage or the data voltage DAT to the gate electrode G1 of the first transistor T1 and one terminal of the capacitor Cst.

A gate electrode G3 of the third transistor T3 is connected to a second scan line transmitting a second scan signal SS, a source electrode S3 of the third transistor T3 is connected to the other terminal of the capacitor Cst, the drain electrode D1 of the first transistor T1, and the anode of the LED ED, and a drain electrode D3 of the third transistor T3 is connected to an initialization voltage line transmitting an initialization voltage INIT. The third transistor T3 may be turned on depending on the second scan signal SS to transmit the initialization voltage INIT to the anode of the LED ED and the other terminal of the capacitor Cst, thereby initializing the voltage of the anode of the LED ED.

One terminal of the capacitor Cst is connected to the gate electrode G1 of the first transistor T1, and the other terminal is connected to the source electrode S3 of the third transistor T3 and the anode of the LED ED. The cathode of the LED ED is connected to a common voltage line transmitting a common voltage ELVSS.

The LED ED may emit light depending on the driving current generated by the first transistor T1.

An exemplary embodiment of the operation of the circuit shown in FIG. 1, particularly, an exemplary embodiment of the operation during one frame, will now be described. In this example, it is described that the transistors T1, T2, and T3 are N-channel transistors, but they are not limited thereto.

If one frame starts, in an initialization period, the first scan signal SC of a high level and the second scan signal SS of a high level are supplied to turn on the second transistor T2 and the third transistor T3. The reference voltage from the data line is supplied to the gate electrode G1 of the first transistor T1 and one terminal of the capacitor Cst through the turned-on second transistor T2, and the initialization voltage INIT is supplied to the drain electrode D1 of the first transistor T1 and the anode of the LED ED through the turned-on third transistor T3. Accordingly, during the initialization period, the drain electrode D1 of the first transistor T1 and the anode of the LED ED are initialized into the initialization voltage INIT. At this time, the capacitor Cst stores a voltage difference between the reference voltage and the initialization voltage INIT.

Next, in a sensing period, when the second scan signal SS becomes a low level in a state in which the first scan signal SC of a high level is maintained, the second transistor T2 maintains the turn-on state and the third transistor T3 is turned off. The gate electrode G1 of the first transistor T1 and one terminal of the capacitor Cst maintain the reference voltage through the turned-on second transistor T2, and the drain electrode D1 of the first transistor T1 and the anode of the LED ED are disconnected from the initialization voltage INIT through the turned-off third transistor T3. Accordingly, the first transistor T1 is turned off when the current flows from the source electrode S1 to the drain electrode D1, and then the voltage of the drain electrode D1 becomes "the reference voltage Vth". Vth represents a threshold voltage of the first transistor T1. At this time, the voltage difference between the gate electrode G1 and the drain electrode D1 of the first transistor T1 is stored in the capacitor Cst, and the sensing of the threshold voltage Vth of the first transistor T1 is completed. By generating the data signal compensated by reflecting the sensed characteristic information during the sensing period, a characteristic deviation of the first transistor T1 which may be different for each pixel may be externally compensated.

Next, in a data input period, when the first scan signal SC of a high level is supplied and the second scan signal SS of a low level is supplied, the second transistor T2 is turned on and the third transistor T3 is turned off. The data voltage DAT from the data line is supplied to one terminal of the capacitor Cst and the gate electrode G1 of the first transistor T1 via the second turned-on transistor T2. In this case, the anode of the drain electrode D1 and the LED ED of the first transistor T1 may substantially maintain the potential in the sensing period by the first transistor T1 in the turn-off state.

Next, in a light emission period, the first transistor T1 turned on by the data voltage DAT transmitted to the gate electrode G1 generates the driving current according to the data voltage DAT, and the LED ED may be emitted by the driving current.

Figure 2:
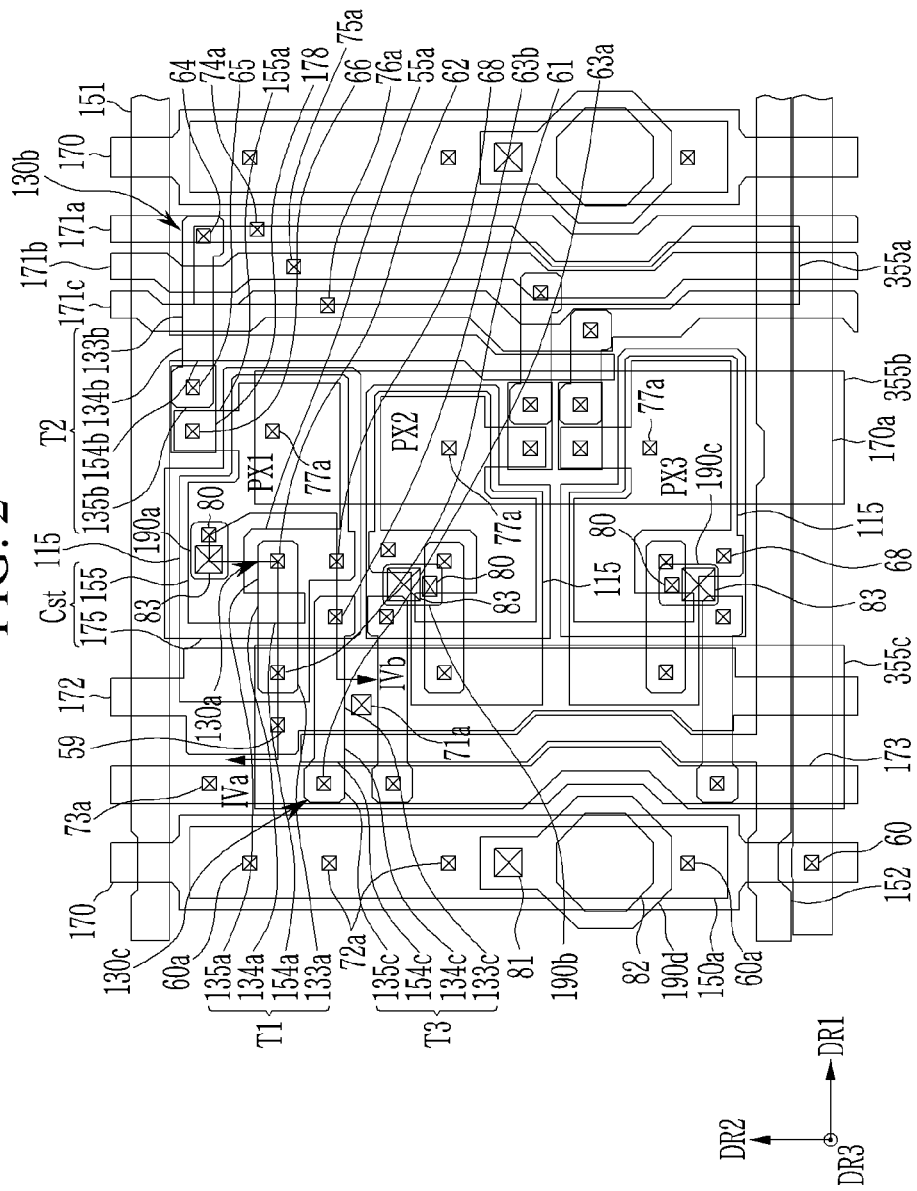
FIG. 2 is a plan view for an exemplary embodiment of a plurality of pixels of a display device according to the invention.
Figure 3:
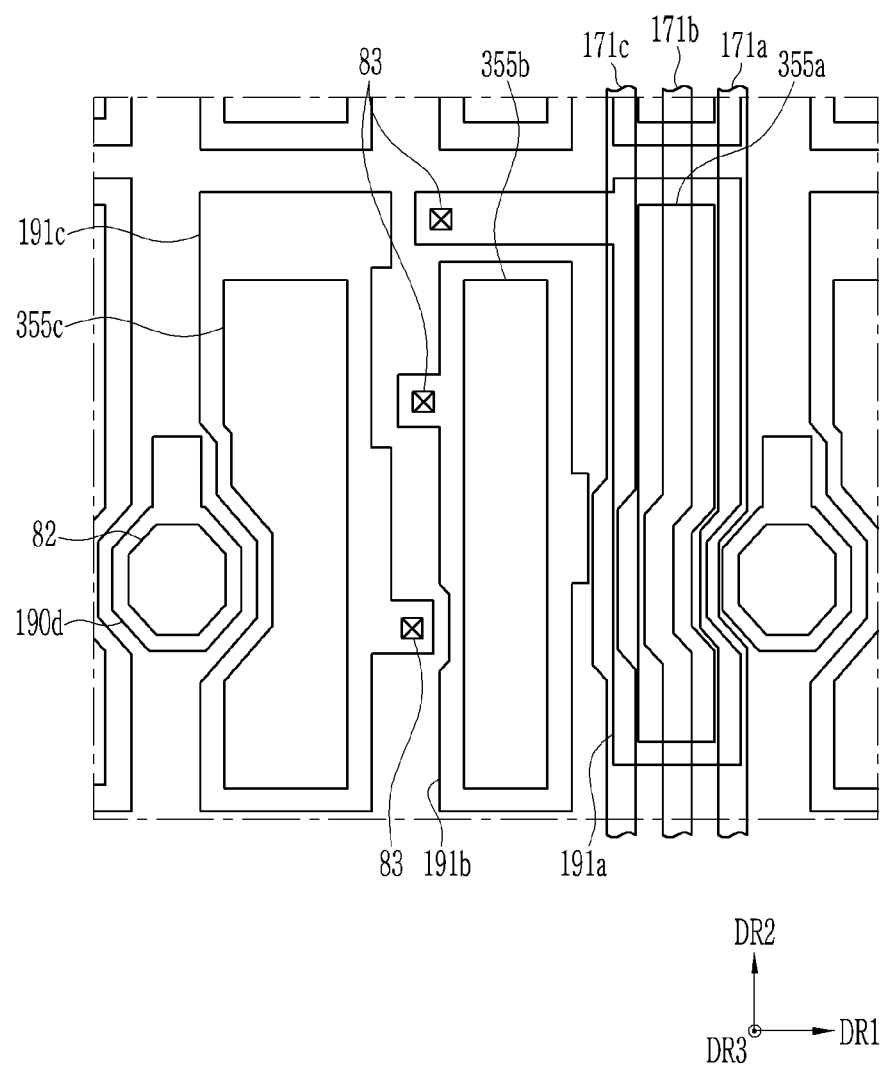
FIG. 3 is a plan view of an exemplary embodiment of a pixel electrode layer and a plurality of data lines of a display device according to the invention.
Figure 4:
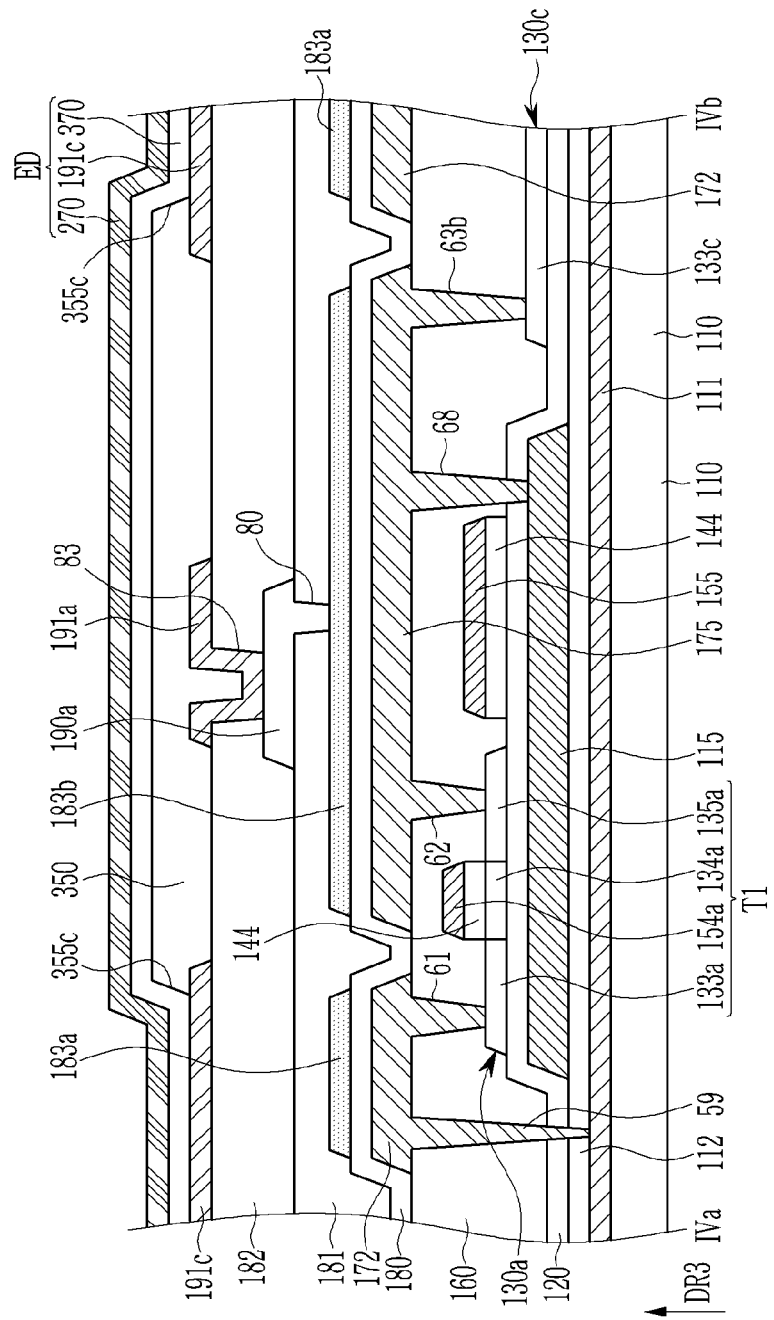
FIG. 4 is a cross-sectional view of a display device shown in FIG. 2 taken along line IVa-IVb.

The detailed structure of the display device in an exemplary embodiment of according to the invention is now described with reference to FIGS. 2 to 4 along with FIG. 1. FIG. 2 is a plan view of an exemplary embodiment of a plurality of pixels of a display device according to the invention, FIG. 3 is a plan view of an exemplary embodiment of a pixel electrode layer and a plurality of data lines of a display device according to the invention, and FIG. 4 is a cross-sectional view of a display device shown in FIG. 2 taken along line IVa-IVb.

Here, each of the plurality of pixels PX1, PX2, and PX3 may mean a part or region where the plurality of transistors T1, T2, and T3 and the capacitor Cst among constituent elements included in the above-described one pixel PX are disposed.

The display device in an exemplary embodiment may include a substrate 110. In an exemplary embodiment, the substrate 110 may include an insulating material such as glass, plastic, or the like, and may have flexibility.

A metal layer 111 may be disposed on the substrate 110. The metal layer 111 in an exemplary embodiment may overlap the entire surface of the substrate 110.

In an exemplary embodiment, the metal layer 111 may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and alloys of these metals, or a metal-like material, for example. The metal layer 111 may include a single layer or multiple layers.

In an exemplary embodiment, the thickness of the metal layer 111 may be about 6000 angstroms to about 10,000 angstroms, for example. The metal layer 111 may have a considerably large thickness. As the thickness of the metal layer 111 increases, the better the performance of the transistors included in the pixel may be improved and the image quality may be improved. Even when the thickness of the metal layer 111 is increased, a step by the metal layer 111 does not occur, so that the formation of other conductive layers may be facilitated and the reliability may be improved.

An insulating layer 112 may be disposed on the metal layer 111. The insulating layer 112 may include an inorganic insulating material, may include an organic insulating material, or may include both an inorganic insulating material and an organic insulating material. A capacitance formation between the metal layer 111 and another conductive layer may be controlled through the insulating layer 112.

Next, on the insulating layer 112, a first conductive layer (115, 170a) including a lower pattern 115 and a transverse common voltage line 170a may be disposed. Each lower pattern 115 may be disposed in each pixel PX1, PX2, and PX3. The transverse common voltage line 170a may extend approximately in a first direction DR1. The lower pattern 115 may include various conductive metals or semiconductor materials having equivalent conductive characteristics.

A buffer layer 120 of an insulating layer may be disposed on the first conductive layer (115, 170a).

An active layer including a plurality of active patterns (also referred to as "active layers") 130a, 130b, and 130c may be disposed on the buffer layer 120. The active patterns 130a, 130b, and 130c disposed in the respective pixels PX1, PX2, and PX3 may include channel regions 134a, 134b, and 134c forming channels of the plurality of above-described transistors T1, T2, and T3, and a conductive region connected thereto. The conductive region of each of the active patterns 130a, 130b, and 130c may include source regions 133a, 133b, and 133c and drain regions 135a, 135b, and 135c of the respective transistors T1, T2, and T3.

In each pixel PX1, PX2, and PX3, the plurality of active patterns 130a, 130b, and 130c may be spaced apart from each other, but are not limited thereto. In an exemplary embodiment, the active pattern 130a and the active pattern 130c may be connected to each other, for example. FIG. 2 shows an example in which the active pattern 130a and the active pattern 130c are connected to each other.

In an exemplary embodiment, the active layer may include a semiconductor material such as amorphous silicon, polysilicon, or an oxide semiconductor.

An insulating pattern 144 of a first insulating layer may be disposed on the active layer. The insulating pattern 144 may overlap the channel regions 134a, 134b, and 134c of the active patterns 130a, 130b, and 130c, and may be disposed on the channel regions 134a, 134b, and 134c. The insulating pattern 144 may not substantially overlap the conductive regions of the active patterns 130a, 130b, and 130c.

A second conductive layer (151, 152, 155, 154b, and 154c) may be disposed on the insulating pattern 144.

The second conductive layer (151, 152, 155, 154b, and 154c) may include a first scan line 151 for transmitting the above-described first scan signal SC, a second scan line 152 for transmitting a second scan signal SS, a driving gate electrode 155, a second gate electrode 154b, and a third gate electrode 154c. The gate electrode G1, the gate electrode G2, and the gate electrode G3 in the above-described circuit diagram may respectively correspond to a first gate electrode 154a, the second gate electrode 154b, and the third gate electrode 154c included in the driving gate electrode 155. The driving gate electrode 155 may be also referred to as a first gate electrode.

The first and second scan lines 151 and 152 may be extended in the first direction DR1. At the top and bottom of the plurality of pixels PX1, PX2, and PX3 of one group, a first scan line 151 and a second scan line 152 may be respectively disposed.

Each driving gate electrode 155 may be disposed corresponding to each pixel PX1, PX2, and PX3. The driving gate electrode 155 disposed at each pixel PX1, PX2, and PX3 may include a first gate electrode 154a protruded above or below and a protrusion 155a protruded below or above. The first gate electrode 154a intersects the active pattern 130a and overlaps the channel region 134a of the active pattern 130a.

The plurality of second gate electrodes 154b corresponding to the plurality of pixels PX1, PX2, and PX3 is connected to each other to be entirely extended in the second direction DR2 and connected to the first scan line 151. The second gate electrode 154b intersects the active pattern 130b of each pixel PX1, PX2, and PX3 and overlaps the channel region 134b of the active pattern 130b.

The plurality of third gate electrodes 154c corresponding to the plurality of pixels PX1, PX2, and PX3 is connected to each other to be entirely extended in second direction DR2, and are connected to the second scan line 152. The third gate electrode 154c intersects the active pattern 130c of each pixel PX1, PX2, and PX3, and overlaps the channel region 134c of the active pattern 130c.

The second conductive layer (151, 152, 155, 154b, and 154c) may further include a conductive pattern 150a overlapping a common voltage line 170 to be described later.

A second insulating layer 160 may be disposed on the second conductive layer (151, 152, 155, 154b, and 154c). A plurality of contact holes (60, 61, 62, 63a, 63b, 64, 65, 66, and 68) may be defined in the buffer layer 120 and/or the second insulating layer 160. A third conductive layer (171a, 171b, 171c, 172, 170, 173, 175, and 178) may be disposed on the second insulating layer 160. The third conductive layer (171a, 171b, 171c, 172, 170, 173, 175, and 178), based on the plurality of pixels PX1, PX2, and PX3 of one group, may include a plurality of data lines 171a, 171b, and 171c, a driving voltage line 172, a common voltage line 170, an initialization voltage line 173, a capacitor electrode 175, and a plurality of connecting members 178.

The common voltage line 170 may be electrically connected to the transverse common voltage line 170a through the contact hole 60 of the second insulating layer 160. The conductive pattern 150a of the second conductive layer is electrically connected to the common voltage line 170 through a contact hole 60a of the second insulating layer 160, thereby lowering the resistance of the common voltage line 170. In another exemplary embodiment, the conductive pattern 150a may be omitted.

The driving voltage line 172 is electrically connected to the source region 133a of the active pattern 130a through the contact hole 61 of the second insulating layer 160.

Also, the driving voltage line 172 may be electrically connected to the metal layer 111 through a contact hole 59 penetrating the second insulating layer 160, the buffer layer 120, and the insulating layer 112. That is, the metal layer 111 may reduce the signal resistance due to the driving voltage line 172 while being electrically connected to the driving voltage line 172.

Also, since the metal layer 111 is disposed on the entire surface of the substrate 110, it may be provided with the considerably large thickness without a burden of the step. As the thickness increases, the signal resistance due to the metal layer 111 may be easily reduced. In addition, since the metal layer 111 may be provided without a separate mask, the manufacturing process may be simplified and the cost and time desired for the process may be reduced.

The initialization voltage line 173 is electrically connected to the drain region 135c of the active pattern 130c through the contact hole 63a of the second insulating layer 160.

The plurality of data lines 171a, 171b, and 171c may be arranged adjacent to each other in the first direction DR1. Other configurations of the third conductive layer may not be disposed between the plurality of data lines 171a, 171b, and 171c. Each data line 171a, 171b, and 171c is electrically connected to the source region 133b of the active pattern 130b through the contact hole 64 of the second insulating layer 160. Each data line 171a, 171b, and 171c, as shown in FIGS. 2 and 3, may be curved at least one.

One capacitor electrode 175 may be disposed at each pixel PX1, PX2, and PX3. The capacitor electrode 175 may be disposed between the driving voltage line 172 and each data line 171a, 171b, and 171c in a plan view. The capacitor electrode 175 may overlap the corresponding driving gate electrode 155 with the second insulating layer 160 therebetween to form the capacitor Cst. The driving gate electrode 155 may be also referred to as a first capacitor electrode and the capacitor electrode 175 may be also referred to as a second capacitor electrode.

The capacitor electrode 175 is electrically connected to the drain region 135a of the active pattern 130a through the contact hole 62 of the second insulating layer 160, and is electrically connected to the source region 133c and the active pattern 130c through the contact hole 63b of the second insulating layer 160. Also, the capacitor electrode 175 is electrically connected to the lower pattern 115 through the contact hole 68 of the second insulating layer 160 and the buffer layer 120. For the contact between the capacitor electrode 175 and the drain region 135a of the active pattern 130a, an opening 55a overlapping the contact hole 62 is defined in the driving gate electrode 155 such that the driving gate electrode 155 may have a shape enclosing the periphery of the contact hole 62, however it is not limited thereto.

The connecting member 178 is electrically connected to the drain region 135b of the active pattern 130b through the contact hole 65 in each pixel PX1, PX2, and PX3, and is electrically connected to the protrusion 155a of the driving gate electrode 155 through the contact hole 66, resultantly the drain region 135b of the active pattern 130b and the protrusion 155a of the driving gate electrode 155 may be electrically connected to each other.

In a plan view, the data lines 171a, 171b, and 171c, the driving voltage line 172, the common voltage line 170, and the initialization voltage line 173 may be respectively extended approximately in the second direction DR2, thereby intersecting the first scan line 151 and the second scan line 152. The plurality of data lines 171a, 171b, and 171c, the driving voltage line 172, and the initialization voltage line 173 may be disposed between two adjacent common voltage lines 170.

The plurality of pixels PX1, PX2, and PX3 of one group shown in FIG. 2 may be arranged in the second direction DR2 to be adjacent to each other, and may be repeatedly disposed in the first direction DR1 and the second direction DR2. The common voltage line 170 may be disposed on both the left and right sides of the plurality of pixels PX1, PX2, and PX3, and the first scan line 151 and the second scan line 152 may be disposed on the upper and lower sides, respectively.

When the plurality of pixels PX1, PX2, and PX3 of one repeated group includes three pixels PX1, PX2, and PX, three data lines 171a, 171b, and 171c, one driving voltage line 172, and one initialization voltage line 173 may be disposed between two adjacent common voltage lines 170.

In an exemplary embodiment, at least one of the first conductive layer (115 and 170a), the second conductive layer (151, 152, 155, 154b, and 154c), and the third conductive layer (171a, 171b, 171c, 172, 170, 173, 175, and 178) may include at least one among the metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and alloys thereof. Each of the first conductive layer, the second conductive layer, and the third conductive layer may include a single layer or multiple layers. In an exemplary embodiment, the third conductive layer may have a multilayer structure including a lower layer including titanium and an upper layer including copper, for example.

The first transistor T1 includes the channel region 134a, the source region 133a and the drain region 135a, and the first gate electrode 154a. The source region 133a of the first transistor T1 is electrically connected to the driving voltage line 172, thereby receiving the driving voltage.

The lower pattern 115 corresponding to the first transistor T1 overlaps the channel region 134a between the channel region 134a of the first transistor T1 and the substrate 110 to prevent external light from reaching the channel region 134a, thereby reducing a leakage current and characteristic deterioration. The lower pattern 115 is electrically connected to the drain region 135a of the first transistor T1 through the capacitor electrode 175.

The second transistor T2 includes the channel region 134b, the source region 133b, the drain region 135b, and the second gate electrode 154b. The source region 133b of the second transistor T2 of each pixel PX1, PX2, and PX3 is electrically connected to the data line 171a, 171b, and 171c, thereby receiving the data voltage or the reference voltage. The drain region 135b of the second transistor T2 may be electrically connected to the first gate electrode 154a through the driving gate electrode 155.

The third transistor T3 includes the channel region 134c, the source region 133c, the drain region 135c, and the third gate electrode 154c. The drain region 135c of the third transistor T3 may receive the initialization voltage from the transverse initialization voltage line 153.

A third insulating layer 180 may be disposed on the third conductive layer. A plurality of contact holes (71a, 72a, 73a, 74a, 75a, 76a, and 77a) is defined in the third insulating layer 180 on the third conductive layer.

A fourth conductive layer may be disposed on the third insulating layer 180. The fourth conductive layer may include a plurality of conductive patterns having the approximately similar plan shape to the conductive pattern of the third conductive layer (171a, 171b, 171c, 172, 170, 173, 175, and 178) such as the data lines 171a, 171b, and 171c, the driving voltage line 172, the common voltage line 170, the initialization voltage line 173, and the capacitor electrode 175 disposed under the fourth conductive layer and may be electrically connected to the conductive pattern of the corresponding third conductive layer (171a, 171b, 171c, 172, 170, 173, 175, and 178).

In an exemplary embodiment, the data lines 171a, 171b, and 171c may be electrically connected to the corresponding conductive pattern disposed in the fourth conductive layer through the contact holes 74a, 75a, and 76a, respectively, the driving voltage line 172 may be electrically connected to the corresponding conductive pattern 183a disposed in the sixth conductive layer through the contact hole 71a, the common voltage line 170 may be electrically connected to the corresponding conductive pattern disposed in the fourth conductive layer through the contact hole 72a, the initialization voltage line 173 may be electrically connected to the corresponding conductive pattern disposed in the fourth conductive layer through the contact hole 73a, and the capacitor electrode 175 may be electrically connected to the corresponding conductive pattern 183b disposed in fourth conductive layer through the contact hole 77a, for example.

The conductive patterns of the fourth conductive layer transmit the same voltage as that of the connected third conductive layer, thereby reducing the resistance. In another exemplary embodiment, the fourth conductive layer may be omitted.

A fourth insulating layer 181 may be disposed on the fourth conductive layer. A contact hole 80 may be defined in the fourth insulating layer 181 on the conductive pattern 183b connected to the capacitor electrode 175, and a contact hole 81 may be defined in the fourth insulating layer 181 on the common voltage line 170.

On the fourth insulating layer 181, a fifth conductive layer (190a, 190b, 190c, and 190d) including a plurality of ohmic contacts 190a, 190b, 190c, and 190d may be disposed. In an exemplary embodiment, the fifth conductive layer (190a, 190b, 190c, and 190d) may be omitted.

Each ohmic contact (or each contact member) 190a, 190b, and 190c may be disposed in each pixel PX1, PX2, and PX3 and in contact with and electrically connected to the corresponding conductive pattern 183b through the contact hole 80. Accordingly, each ohmic contact (or each contact member) 190a, 190b, and 190c may be electrically connected to the capacitor electrode 175 electrically connected to the conductive pattern 183b.

The ohmic contact (or the contact member) 190d may be in contact with and electrically connected to the common voltage line 170 through the contact hole 81.

The ohmic contacts 190a, 190b, 190c, and 190d may improve adherence between the conductive pattern of the contacted fourth conductive layer and the other conductive layer, respectively, and prevent oxidation of the fourth conductive layer. Particularly, when the fourth conductive layer includes copper, the oxidation of copper may be prevented. For this purpose, the fifth conductive layer (190a, 190b, 190c, and 190d) may include a conductive material that may prevent the corrosion of the fourth layer, for example, when the fourth conductive layer includes copper, the conductive material to prevent the copper corrosion by capping the fourth conductive layer. In an exemplary embodiment, the fifth conductive layer (190a, 190b, 190c, and 190d) may include a conductive material such as a metal oxide such as indium tin oxide ("ITO") or indium zinc oxide ("IZO").

A fifth insulating layer 182 may be disposed on the fifth conductive layer (190a, 190b, 190c, and 190d). A contact hole 83 may be defined in the fifth insulating layer 182 on each ohmic contact (or the contact member) 190a, 190b, and 190c.

In a plan view and a cross-sectional view, the center of the contact hole 83 may not match the center of the contact hole 80. The contact hole 83 and the contact hole 80, in a plan view, may not overlap each other or may partially overlap each other.

The contact hole 83 and the contact hole 80 both overlap with corresponding ohmic contacts 190a, 190b, and 190c of each of the pixels PX1, PX2, and PX3.

In an exemplary embodiment, at least one of the insulating layer 112, the buffer layer 120, the first insulating layer 121 (refer to FIG. 15) including the insulating pattern 144, the second insulating layer 160, the third insulating layer 180, the fourth insulating layer 181, and the fifth insulating layer 182 may include an inorganic insulating material and/or an organic insulating material such as a silicon nitride (SiNx), a silicon oxide (SiOx), and a silicon oxynitride (SiON), for example. In the exemplary embodiment, the fifth insulating layer 182 may include an inorganic insulating material and/or an organic insulating material such as a polyimide, an acryl-based polymer, a siloxane-based polymer, or the like, and may have a substantially flat upper surface.

On the fifth insulating layer 182, a pixel electrode layer (191a, 191b, and 191c) including a plurality of pixel electrodes 191a, 191b, and 191c as a sixth conductive layer may be disposed.

Referring to FIGS. 2 and 3, a plurality of pixels PX1, PX2, and PX3 of one group repeated in a plan view (or the first transistors T1 of the plurality of pixels PX1, PX2, and PX3) is arranged in the second direction DR2 and the plurality of pixel electrodes 191a, 191b, and 191c respectively corresponding to the pixels PX1, PX2, and PX3 may be arranged to be approximately adjacent to each other in the first direction DR1. The arrangement and structure of the pixels PX1, PX2, and PX3 and the pixel electrodes 191a, 191b, and 191c corresponding thereto are not limited thereto. A plan size and shape of the pixel electrodes 191a, 191b, and 191c may be varied, but are not limited thereto.

The plurality of pixel electrodes 191a, 191b, and 191c may be electrically connected to the ohmic contacts (or the contact member) 190a, 190b, and 190c electrically connected to the capacitor electrode 175 through the contact hole 83 of the fifth insulating layer 182, respectively. Each pixel electrode 191a, 191b, and 191c is electrically connected to the drain region 135a of the first transistor T1 via the ohmic contacts (or the contact member) 190a, 190b, and 190c, the conductive pattern 183b, and the capacitor electrode 175, thereby receiving the voltage from the first transistor T1.

In an exemplary embodiment, the pixel electrode 191a may be connected to the first transistor T1 of the pixel PX1, the pixel electrode 191b may be connected to the first transistor T1 of the pixel PX2, and the pixel electrode 191c may be connected to the first transistor T1 of the pixel PX3, for example.

The pixel electrodes 191a, 191b, and 191c may include a semi-transmissive conductive material or a reflective conductive material.

A sixth insulating layer 350 may be disposed on the fifth insulating layer 182. Openings 355a, 355b, and 355c are defined in the sixth insulating layer 350 on the pixel electrodes 191a, 191b, and 191c, respectively.

The sixth insulating layer 350 may include an organic insulating material such as a polyacryl-based resin, a polyimide-based resin, or the like.

An emission layer 370 may be disposed in the sixth insulating layer 350 and the pixel electrode layer. The emission layer 370 may include portions disposed in the openings 355a, 355b, and 355c of the sixth insulating layer 350. The emission layer 370 may include an organic emission material or an inorganic emission material. The emission layer 370 may include a portion disposed above the sixth insulating layer 350 as shown, and the portion over at least a portion of the sixth insulating layer 350 may not be covered by the emission layer 370.

A contact hole 82 may be defined in the sixth insulating layer 350 and the emission layer 370 on the ohmic contacts 190d.

A common electrode 270 is disposed above the emission layer 370. The common electrode 270 may be disposed continuously over a plurality of pixels PX1, PX2, and PX3. The common electrode 270 may be electrically connected to the common voltage line 170 by contacting the ohmic contacts 190d through the contact hole 82, thereby receiving a common voltage.

The common electrode 270 may include a conductive transparent material. The pixel electrodes 191a, 191b, and 191c of each pixel PX1, PX2, and PX3, the emission layer 370, and the common electrode 270 together form the LED ED, and one of the pixel electrodes 191a, 191b, and 191c, and the common electrode 270 becomes the cathode and the other becomes the anode. Previously, the example in which the pixel electrodes 191a, 191b, and 191c are the anode was described.

In a plan view, the region where the openings 355a, 355b, and 355c of the sixth insulating layer 350 are defined may define an emission region of each pixel PX1, PX2, and PX3.

Referring to FIGS. 2 and 3, the plurality of openings 355a, 355b, and 355c respectively corresponding to the plurality of pixel electrodes 191a, 191b, and 191c respectively connected to the plurality of pixels PX1, PX2, and PX3 of one group may be arranged to be adjacent to each other in the first direction DR1.

Figure 5:
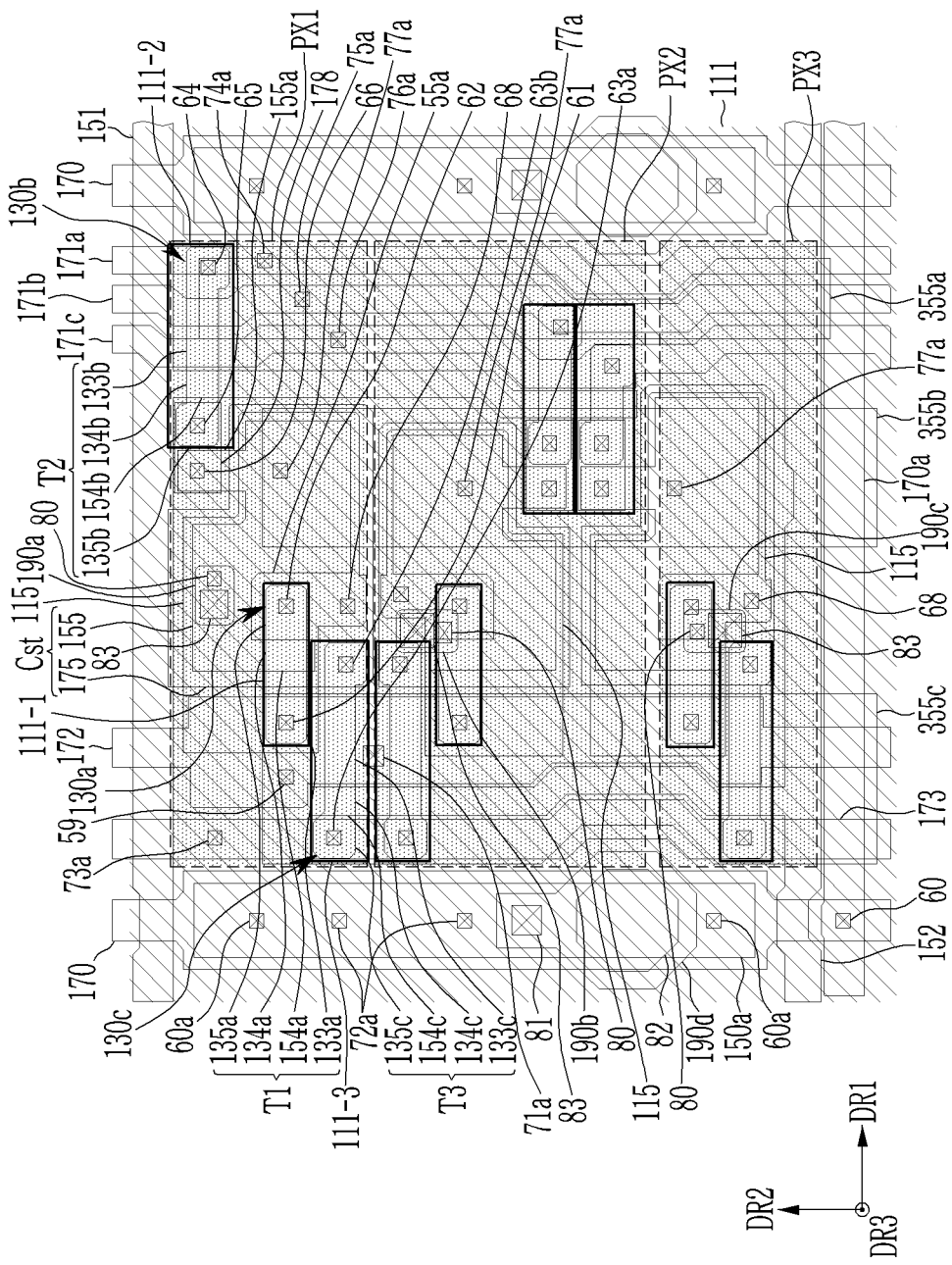
FIG. 5 is a plan view of an exemplary embodiment of a plurality of pixels of a display device according to the invention.
Figure 6A:
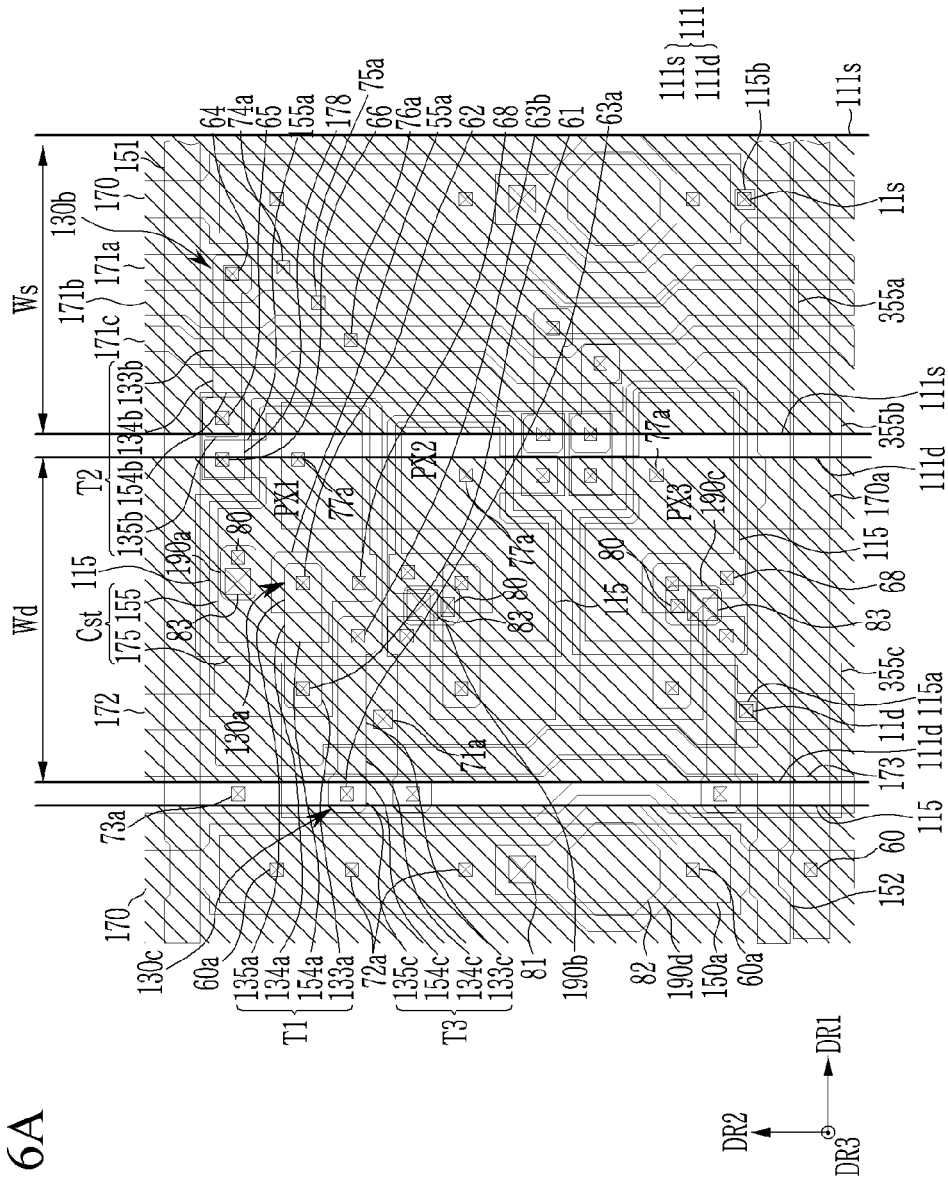
FIG. 6A is a plan view of an exemplary embodiment of a plurality of pixels of a display device according to the invention.
Figure 6B:
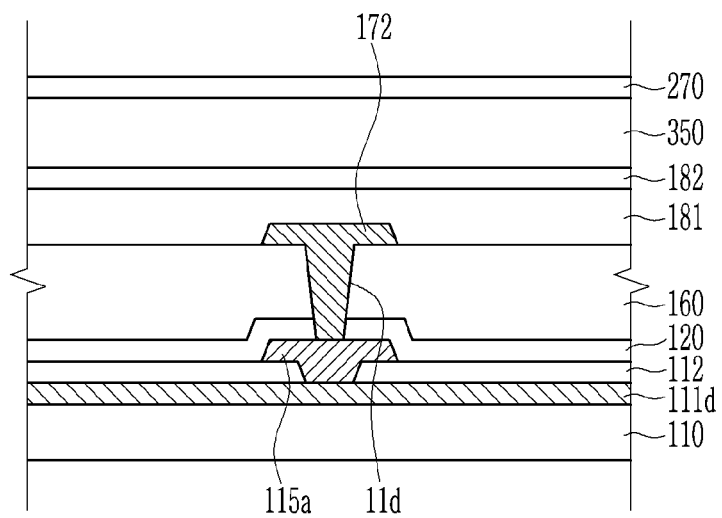
FIG. 6B is a cross-sectional view of a partial region of FIG. 6A.
Figure 7:
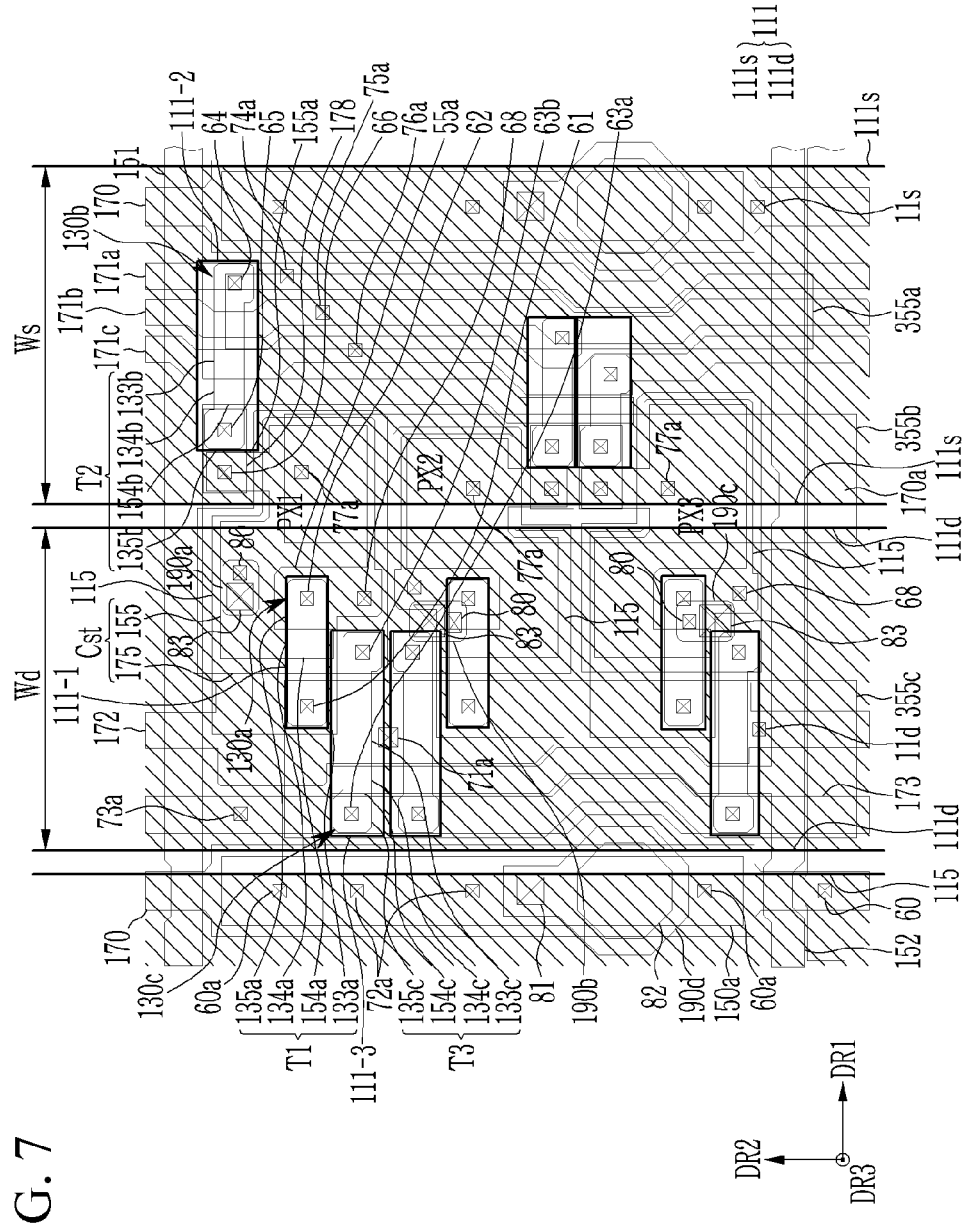
FIG. 7 is a plan view of an exemplary embodiment of a plurality of pixels of a display device according to the invention.

Next, the display device in an exemplary embodiment is described with reference to FIGS. 5 to 7. FIG. 5 is a plan view of an exemplary embodiment of a plurality of pixels of a display device according to the invention, FIG. 6A is a plan view of an exemplary embodiment of a plurality of pixels of a display device according to the invention, FIG. 6B is a cross-sectional view of a partial region of FIG. 6A, and FIG. 7 is a plan view of an exemplary embodiment of a plurality of pixels of a display device according to the invention. Descriptions of the same constituent elements as those described above are omitted.

Referring to FIG. 5, openings 111-1, 111-2, and 111-3 overlapping the active layer may be defined in a metal layer 111 in an exemplary embodiment. In detail, a first opening 111-1 overlapping the first active pattern 130a, a second opening 111-2 overlapping the second active pattern 130b, and a third opening 111-3 overlapping the third active pattern 130c may be defined in the metal layer 111.

The metal layer 111 in an exemplary embodiment may be electrically connected to the driving voltage line 172, but it does not overlap the active patterns 130a, 130b, and 130c through the openings 111-1, 111-2, and 111-3 defined in the metal layer 111, thereby the transistor performance may not be affected.

Next, referring to FIGS. 6A and 6B, the metal layer 111 in an exemplary embodiment may include a first voltage metal layer 111d and a second voltage metal layer 111s. The first voltage metal layer 111d and the second voltage metal layer 111s may be spaced apart from each other. The first voltage metal layer 111d and the second voltage metal layer 111s may have a stripe shape extending along the second direction DR2.

The first voltage metal layer 111d may have a first width Wd, and the second voltage metal layer 111s may have a second width Ws in a plan view. At this time, the first width Wd and the second width Ws may be substantially the same.

However, the invention is not limited thereto, and may be changed depending on the pixel width, structure, and the like.

The first voltage metal layer 111d may be connected to the driving voltage line 172 through a contact hole 11d. The first voltage metal layer 111d may be supplied with the driving voltage. The second voltage metal layer 111s may be connected to the common voltage line 170, the transverse common voltage line 170a, or the conductive pattern 150a through a contact hole 11s. The second voltage metal layer 111s may receive the common voltage.

The first voltage metal layer 111d may have any stacking structure for applying the driving voltage, and the second voltage metal layer 111s may have any stacking structure for receiving the common voltage.

In an exemplary embodiment, as shown in FIG. 6B, the driving voltage line 172 may be connected to a connecting member 115a included in the first conductive layer through the contact hole 11d passing through the second insulating layer 160 and the buffer layer 120, and the connecting member 115a may be connected to the first voltage metal layer 111d through a contact hole passing through the insulating layer 112, for example. The first voltage metal layer 111d and the driving voltage line 172 may be connected through the connecting member 115a disposed in the same layer as the lower pattern 115. However, without limitation, the driving voltage line 172 may be connected directly to the first voltage metal layer 111d through the contact hole 11d.

Similarly, the common voltage line 170 may be connected to the connecting member 115b included in the first conductive layer through the contact hole 11s passing through the second insulating layer 160 and the buffer layer 120, and the connecting member 115b may be connected to the second voltage metal layer 111s through the contact hole passing through the insulating layer 112. The second voltage metal layer 111s and the common voltage line 170 may be connected through a connecting member disposed in the same layer as the lower pattern 115. However, it is not limited thereto, and the common voltage line 170 may be connected directly to the second voltage metal layer 111s through the contact hole 11s.

Next, referring to FIG. 7, the metal layer 111 in an exemplary embodiment may include a first voltage metal layer 111d and a second voltage metal layer 111s. The first voltage metal layer 111d and the second voltage metal layer 111s may be spaced apart from each other. The first voltage metal layer 111d and the second voltage metal layer 111s may have a stripe shape extending along the second direction DR2.

The first voltage metal layer 111d may have a first width Wd, and the second voltage metal layer 111s may have a second width Ws in a plan view. At this time, the first width Wd and the second width Ws may be substantially the same. However, the invention is not limited thereto, and may be changed depending on the pixel width, structure, and the like.

The first voltage metal layer 111d may be connected to the driving voltage line 172 through the contact hole 11d. The first voltage metal layer 111d may be supplied with the driving voltage. The second voltage metal layer 111s may be connected to the common voltage line 170, the transverse common voltage line 170a, or the conductive pattern 150a through the contact hole 11s. The second voltage metal layer 111s may receive the common voltage.

The openings 111-1, 111-2, and 111-3 overlapping the active layer may be defined in the metal layer 111 in an exemplary embodiment. In detail, a first opening 111-1 overlapping the first active pattern 130a, a second opening 111-2 overlapping the second active pattern 130b, and a third opening 111-3 overlapping the third active pattern 130c may be defined in the metal layer 111.

The metal layer 111 may receive a predetermined voltage. The metal layer 111 in an exemplary embodiment is not overlapped with the active layer through the openings 111-1, 111-2, and 111-3, so that the transistor performance may not be affected.

Figure 8:
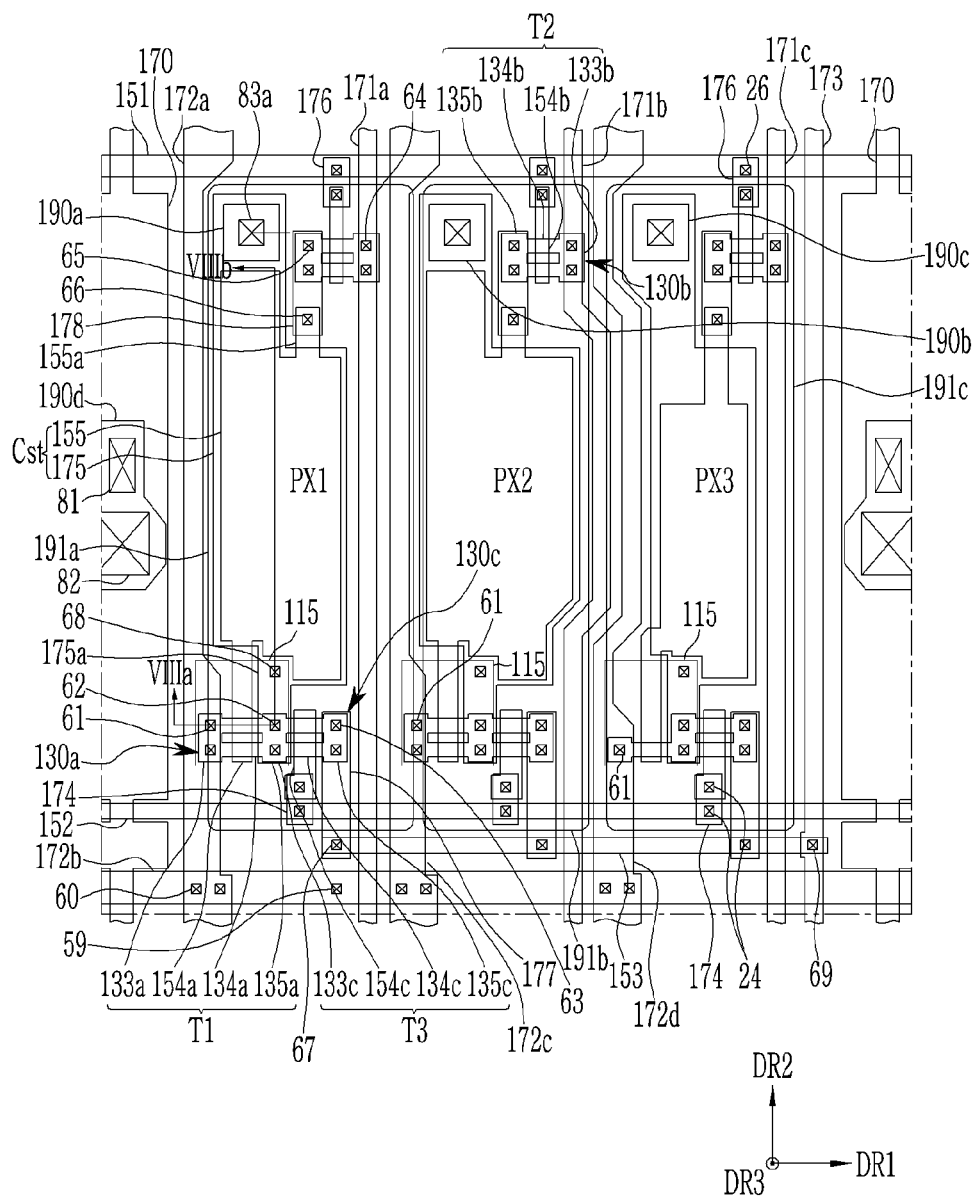
FIG. 8 is a plan view of an exemplary embodiment of a plurality of pixels of a display device according to the invention.
Figure 9:
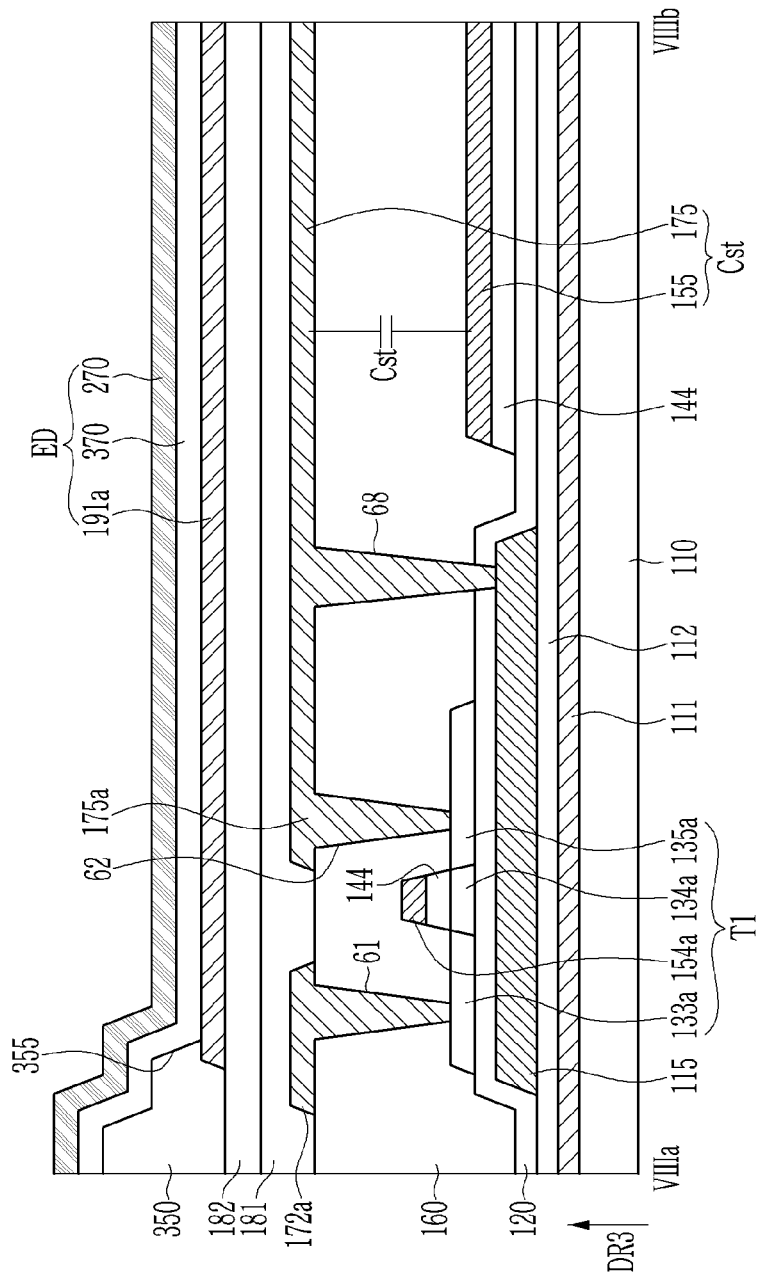
FIG. 9 is a cross-sectional view of a display device shown in FIG. 8 taken along line XIIIa-XIIIb.

Next, the display device in an exemplary embodiment is described with reference to FIGS. 8 and 9. FIG. 8 is a plan view of an exemplary embodiment of a plurality of pixels of a display device according to the invention, and FIG. 9 is a cross-sectional view of a display device shown in FIG. 8 taken along line XIIIa-XIIIb. Descriptions of the same constitution as the constituent elements described above may be omitted.

The display device in an exemplary embodiment may include the substrate 110. In an exemplary embodiment, the substrate 110 may include an insulating material such as glass, plastic, or the like, and may have flexibility.

The metal layer 111 may be disposed on the substrate 110. The metal layer 111 in an exemplary embodiment may overlap the entire surface of the substrate 110.

In an exemplary embodiment, the metal layer 111 may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and alloys of these metals, or a metal-like material, for example. The metal layer 111 may include a single layer or multiple layers.

The thickness of the metal layer 111 may be about 6000 angstroms to about 10,000 angstroms. The metal layer 111 may have a considerably large thickness. As the thickness of the metal layer 111 increases, the better the performance of the transistors included in the pixel may be improved and the image quality may be improved. Even when the thickness of the metal layer 111 is increased, the step by the metal layer 111 does not occur, so that the formation of other conductive layers may be facilitated and the reliability may be improved.

An insulating layer 112 may be disposed on the metal layer 111. The insulating layer 112 may include an inorganic insulating material, may include an organic insulating material, or may include both an inorganic insulating material and an organic insulating material. Capacitance formation between the metal layer 111 and another conductive layer may be controlled through the insulating layer 112.

Next, a first conductive layer including a plurality of a lower pattern 115 may be disposed on the insulating layer 112. The lower pattern 115 may be also referred to as a conductive pattern. The first conductive layer may include a variety of conductive metals or semiconductor materials with equivalent conductive characteristics.

A buffer layer 120 is disposed on the lower pattern 115 and the insulating layer 112.

On the buffer layer 120, an active layer (130a, 130b, and 130c) including a plurality of active patterns 130a, 130b, and 130c is disposed. That is, the lower pattern 115 may be disposed between the substrate 110 and the active layer (130a, 130b, and 130c). The active patterns 130a, 130b, and 130c disposed in the respective pixels PX1, PX2, and PX3 may include channel regions 134a, 134b, and 134c forming channels of the plurality of above-described transistors T1, T2, and T3, and a conductive region connected thereto. The conductive region of each of the active patterns 130a, 130b, and 130c may include source regions 133a, 133b, and 133c and drain regions 135a, 135b, and 135c of the respective transistors T1, T2, and T3.

In each pixel PX1, PX2, and PX3, the active pattern 130a and the active pattern 130c may be connected to each other or spaced apart from each other. FIG. 8 shows an example in which the active pattern 130a and the active pattern 130c are connected to each other. In this case, the drain region 135a of the active pattern 130a may be the source region 133c of the active pattern 130c.

In an exemplary embodiment, the active layer (130a, 130b, and 130c) may include a semiconductor material such as amorphous silicon, polysilicon, or an oxide semiconductor.

An insulating pattern 144 of a first insulating layer may be disposed on the active layer (130a, 130b, and 130c). The insulating pattern 144 may overlap the channel regions 134a, 134b, and 134c of the active patterns 130a, 130b, and 130c, and may be disposed on the channel regions 134a, 134b, and 134c. The insulating pattern 144 may not substantially overlap the conductive regions of the active patterns 130a, 130b, and 130c.

A second conductive layer (151, 152, 153, 172b, 155, 154b, and 154c) may be disposed on the insulating pattern 144. The second conductive layer (151, 152, 153, 172b, 155, 154b, and 154c) may include a first scan line 151 capable of transmitting the first scan signal SC as above-described, a second scan line 152 capable of transmitting the second scan signal SS, a transverse initialization voltage line 153 capable of transmitting the initialization voltage MIT, a transverse driving voltage line 172b capable of transmitting the driving voltage ELVDD, a driving gate electrode 155, a second gate electrode 154b, a third gate electrode 154c, and the like. The gate electrode G1, the gate electrode G2, and the gate electrode G3 in the above-described circuit diagram may respectively correspond to the first gate electrode 154a, the second gate electrode 154b, and the third gate electrode 154c included in a driving gate electrode 155.

The first and second scan lines 151 and 152, the transverse initialization voltage line 153, and the transverse driving voltage line 172b may extend in the first direction DR1, respectively.

In a plan view, the driving gate electrode 155 may be disposed between the first scan line 151 and the second scan line 152.

The second gate electrode 154b is spaced apart from the first scan line 151 and may approximately extend in a second direction DR2. In an alternative exemplary embodiment, the second gate electrode 154b may be directly connected to the first scan line 151.

The third gate electrode 154c is spaced apart from the second scan line 152, and may approximately extend in the second direction DR2. In an alternative exemplary embodiment, the third gate electrode 154c may be directly connected to the second scan line 152.

The driving gate electrode 155 disposed at each pixel PX1, PX2, and PX3 may include a protrusion 155a protruding upward and a first gate electrode 154a protruding downward and extending generally in the second direction DR2.

The first gate electrode 154a intersects the active pattern 130a and overlaps the channel region 134a of the active pattern 130a. The second gate electrode 154b intersects the active pattern 130b and overlaps the channel region 134b of the active pattern 130b. The third gate electrode 154c intersects the active pattern 130c and overlaps the channel region 134c of the active pattern 130c.

The transverse driving voltage line 172b may be connected to the first metal layer 111 through the contact hole 59.

A second insulating layer 160 may be disposed on the second conductive layer (151, 152, 153, 172b, 155, 154b, and 154c). A plurality of contact holes 24, 26, 60, 61, 62, 63, 64, 65, 66, 67, 68, and 69 may be defined in the buffer layer 120 and/or the second insulating layer 160.

A third conductive layer (171a, 171b, 171c, 172a, 172b, 172d, 170, 173, 175, 174, 176, 177, and 178) may be disposed on the second insulating layer 160. The third conductive layer (171a, 171b, 171c, 172a, 172b, 172d, 170, 173, 175, 174, 176, 177, and 178) may include a plurality of data lines 171a, 171b, and 171c, a plurality of driving voltage lines 172a, 172c, and 172d, a common voltage line 170, an initialization voltage line 173, a capacitor electrode 175, and a plurality of connecting members 174, 176, 177, and 178.

In a plan view, the data lines 171a, 171b, and 171c, the driving voltage lines 172a, 172c, and 172d, the common voltage line 170, and the initialization voltage line 173 may respectively approximately extend in the second direction DR2 and intersect the first scan line 151 and the second scan line 152.

The plurality of pixels PX1, PX2, and PX3 of one group shown in FIG. 8 may be arranged to be adjacent in the first direction DR1, and may be disposed to be repeated in the first direction DR1 and the second direction DR2. The common voltage line 170 may be disposed on both of the left and right sides of plurality of pixels PX1, PX2, and PX3, respectively. When the plurality of pixels PX1, PX2, and PX3 in the repeated group includes three pixels PX1, PX2, and PX3, three data lines 171a, 171b, and 171c, three driving voltage lines 172a, 172c, and 172d, and at least one initialization voltage line 173 may be disposed between two adjacent common voltage lines 170.

Each of the data lines 171a, 171b, and 171c is electrically connected to the source region 133b of the active pattern 130b through the contact hole 64 of the second insulating layer 160 (two contact holes 64 are shown in each of the pixels PX1, PX2, and PX3 in FIG. 8).

Each of the driving voltage lines 172a, 172c, and 172d may be disposed corresponding to each pixel PX1, PX2, and PX3.

The driving voltage lines 172a, 172c, and 172d are electrically connected to the source region 133a of the active pattern 130a through the contact hole 61 of the second insulating layer 160 (in FIG. 8, two contact holes 61 are shown in the pixels PX1 and PX2 and one contact hole 61 is shown in the pixel PX3). In addition, the driving voltage lines 172a, 172c, and 172d are electrically connected to the transverse driving voltage line 172b through the contact hole 60 of the second insulating layer 160. Thus, the transverse driving voltage line 172b may transmit the driving voltage along with the driving voltage lines 172a, 172c, and 172d, and the driving voltage across the entire display device is transmitted in both of the first direction DR1 and the second direction DR2 with a mesh shape.

The initialization voltage line 173 is electrically connected to the transverse initialization voltage line 153 through the contact hole 69 of the second insulating layer 160. Thus, the transverse initialization voltage line 153 may transmit the initialization voltage along with the initialization voltage line 173, and even when one initialization voltage line 173 is provided for three pixels PX1, PX2, and PX3, the initialization voltage may be transmitted to all three pixels PX1, PX2, and PX3 through the transverse initialization voltage line 153.

One capacitor electrode 175 may be disposed at each pixel PX1, PX2, and PX3. The capacitor electrode 175 may overlap the corresponding driving gate electrode 155 via the second insulating layer 160 therebetween, thereby forming the capacitor Cst.

The capacitor electrode 175 may include a protrusion 175a that is downwardly extended. The protrusion 175a is electrically connected to the drain region 135a of the active pattern 130a (or the source region 133c of the active pattern 130c) through the contact hole 62 of the second insulating layer 160 (two contact holes 62 are shown at each pixel PX1, PX2, and PX3 in FIG. 8). Also, the capacitor electrode 175 is electrically connected to the lower pattern 115 through the contact hole 68 of the second insulating layer 160 and the buffer layer 120.

The connecting member 174 may be electrically connected to the second scan line 152 and the third gate electrode 154c through the contact hole 24 of the second insulating layer 160 to electrically connect the second scan line 152 and the third gate electrode 154c to each other.

The connecting member 176 may be electrically connected to the first scan line 151 and the second gate electrode 154b through the contact hole 26 of the second insulating layer 160 to electrically connect the first scan line 151 and the second gate electrode 154b to each other.

In each of the pixels PX1, PX2, and PX3, the connecting member 177 is electrically connected to the drain region 135c of the active pattern 130c through the contact hole 63 of the second insulating layer 160 (two contact holes 63 are shown at each pixel PX1, PX2, and PX3 in FIG. 8) and electrically connected to the transverse initialization voltage line 153 through the contact hole 67 of the second insulating layer 160, thereby the drain region 135c of the active pattern 130c may be electrically connected to the transverse initialization voltage line 153.

The transverse initialization voltage line 153 extends in the first direction DR1 across three pixels PX1, PX2, and PX3, but may be disposed between two adjacent common voltage lines 170, thereby it may not intersect the two common voltage lines 170. The transverse initialization voltage line 153 intersects three adjacent data lines 171a, 171b, and 171c, and may extend only to the initialization voltage line 173.

The connecting member 178 is electrically connected to the drain region 135b of the active pattern 130b in each of the pixels PX1, PX2, and PX3 through the contact hole 65 (in FIG. 8, two contact holes 65 are shown in each of the pixels PX1, PX2, and PX3) of the second insulating layer 160, and is electrically connected to the protrusion 155a of the driving gate electrode 155 through the contact hole 66 of the second insulating layer 160, thereby the drain region 135b of the active pattern 130b and the protrusion 155a of the driving gate electrode 155 may be electrically connected to each other.

In an exemplary embodiment, at least one among the first conductive layer including the lower pattern 115, the second conductive layer (151, 152, 153, 172b, 155, 154b, and 154c), and the third conductive layer (171a, 171b, 171c, 172a, 172b, 172d, 170, 173, 175, 174, 176, 177, and 178) may include at least one of metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and alloys thereof. Each of the first conductive layer, the second conductive layer, and the third conductive layer may include a single layer or multiple layers. In an exemplary embodiment, the third conductive layer may have a multilayer structure including an underlying layer including titanium and an overlying layer including copper, for example.

The first transistor T1 includes the channel region 134a, the source region 133a, the drain region 135a, and the first gate electrode 154a. The source region 133a of the first transistor T1 is electrically connected to the driving voltage lines 172a, 172c, and 172d, thereby receiving the driving voltage.

The lower pattern 115 corresponding to the first transistor T1 overlaps the channel region 134a in an area between the channel region 134a of the first transistor T1 and the substrate 110 to prevent external light from reaching the channel region 134a, thereby reducing a leakage current and a characteristic deterioration. The lower pattern 115 is electrically connected to the drain region 135a of the first transistor T1 via the capacitor electrode 175.

The transverse driving voltage line 172b is electrically connected to the metal layer 111 through the contact hole 59 passing through the buffer layer 120 and the insulating layer 112. That is, the metal layer 111 may reduce the resistance of the driving voltage line 172b while being electrically connected to the driving voltage line 172b.

Also, since the metal layer 111 is disposed on the entire surface of the substrate 110, it may be provided with a considerably thick thickness without any burden on the step. As the thickness increases, the signal resistance due to the metal layer 111 may be easily reduced. In addition, since the metal layer 111 may be provided without a separate mask, the manufacturing process may be simplified and the cost and time desired for the process may be reduced.

The second transistor T2 includes the channel region 134b, the source region 133b, the drain region 135b, and the second gate electrode 154b. The source region 133b of the second transistor T2 is electrically connected to the data lines 171a, 171b, and 171c, thereby receiving the data voltage or the reference voltage. The drain region 135b of the second transistor T2 may be electrically connected to the first gate electrode 154a through the driving gate electrode 155.

The third transistor T3 includes the channel region 134c, the source region 133c, the drain region 135c, and the third gate electrode 154c. The drain region 135c of the third transistor T3 may receive the initialization voltage from the transverse initialization voltage line 153.

A third insulating layer 181 may be disposed on the second insulating layer 160 and the third conductive layer (171a, 171b, 171c, 172a, 172b, 172d, 170, 173, 175, 174, 176, 177, and 178). A contact hole 83a may be defined in the third insulating layer 181 on the capacitor electrode 175 and a contact hole 81 may be defined in the third insulating layer 181 on the common voltage line 170.

A fourth conductive layer (190a, 190b, 190c, and 190d) including a plurality of ohmic contacts (or contact members) 190a, 190b, 190c, and 190d may be disposed on the third insulating layer 181. The fourth conductive layer (190a, 190b, 190c, and 190d) may be omitted in another exemplary embodiment.

Each of the ohmic contacts (or contact members) 190a, 190b, and 190c is disposed in each of the pixels PX1, PX2, and PX3, and may be in contact with the capacitor electrode 175 through the contact hole 83a to be electrically connected.

The ohmic contact 190d may be electrically connected to the common voltage line 170 through a contact hole 81.

The ohmic contacts (or contact members) 190a, 190b, 190c, and 190d may improve the adherence of the capacitor electrode 175 and the common voltage line 170 of the third conductive layer (171a, 171b, 171c, 172a, 172b, 172d, 170, 173, 175, 174, 176, 177, and 178) which are respectively in contact thereto and other conductive layers, and may prevent oxidation of the third conductive layer. In the exemplary embodiment, when the upper layer of the third conductive layer (171a, 171b, 171c, 172a, 172b, 172d, 170, 173, 175, 174, 176, 177, and 178) includes copper, the oxidation of copper may be prevented. For this purpose, the fourth conductive layer (190a, 190b, 190c, and 190d) may include a conductive material that may prevent the corrosion of the upper layer of the third conductive layer (171a, 171b, 171c, 172a, 172b, 172d, 170, 173, 175, 174, 176, 177, and 178), and for example, when the upper layer of the third conductive layer (171a, 171b, 171c, 172a, 172b, 172d, 170, 173, 175, 174, 176, 177, and 178) includes copper, the conductive material may prevent the copper corrosion by capping the upper layer of the third conductive layer (171a, 171b, 171c, 172a, 172b, 172d, 170, 173, 175, 174, 176, 177, and 178). In an exemplary embodiment, the fourth conductive layer (190a, 190b, 190c, and 190d) may include a conductive material such as a metal oxide such as ITO or IZO.

A fourth insulating layer 182 may be disposed on the third insulating layer 181 and the fourth conductive layer (190a, 190b, 190c, and 190d). Referring to FIGS. 8 and 9, a contact hole 83b may be defined in the fourth insulating layer 182 on each of the ohmic contacts (or contact members) 190a, 190b, and 190c and may overlap the contact hole 83a.

At least one among the insulating layer 112, the buffer layer 120, the first insulating layer including the insulating pattern 144, the second insulating layer 160, the third insulating layer 181, and the fourth insulating layer 182 may include an inorganic insulating material and/or an organic insulating material such as a silicon nitride (SiNx), a silicon oxide (SiOx), a silicon oxynitride (SiON), and the like. In the exemplary embodiment, the fourth insulating layer 182 may include the inorganic insulating material and/or the organic insulating material such as a polyimide, an acryl-based polymer, a siloxane-based polymer, or the like, and may have a substantially flat upper surface.

On the fourth insulating layer 182, a pixel electrode layer (191a, 191b, and 191c) including a plurality of pixel electrodes 191a, 191b, and 191c may be disposed as a fifth conductive layer (191a, 191b, and 191c). Each pixel electrode 191a, 191b, and 191c may be disposed corresponding to each pixel PX1, PX2, and PX3 as shown in FIG. 8. The sizes and shapes of the pixel electrodes 191a, 191b, and 191c disposed on the three pixels PX1, PX2, and PX3 may differ in a plan view, but are not limited thereto. In an exemplary embodiment, the pixel PX2 represents green, the pixel PX1 represents red, and the pixel PX3 represents blue, but they are not limited thereto.

Each of the pixel electrodes 191a, 191b, and 191c may be in contact with the corresponding ohmic contacts (or contact members) 190a, 190b, and 190c through the contact hole 83b of the fourth insulating layer 182, and may be electrically connected to the capacitor electrode 175 through the ohmic contacts (or contact members) 190a, 190b, and 190c. Thus, each of the pixel electrodes 191a, 191b, and 191c may be electrically connected to the drain region 135a of the first transistor T1 to receive the voltage from the first transistor T1.

The pixel electrode layer (191a, 191b, and 191c) may include a transflective conductive material or a reflective conductive material.

A fifth insulating layer 350 may be disposed on the fourth insulating layer 182. An opening 355 may be defined in the fifth insulating layer 350 above the pixel electrodes 191a, 191b, and 191c. In an exemplary embodiment, the fifth insulating layer 350 may include the organic insulating material such as a polyacryl-based resin or a polyimide resin.

An emission layer 370 is disposed on the fifth insulating layer 350 and the pixel electrode layer (191a, 191b, and 191c). The emission layer 370 may include a portion disposed within the opening 355 of the fifth insulating layer 350. The emission layer 370 may include an organic light emission material or an inorganic light emission material. In an alternative exemplary embodiment, at least part of the fifth insulating layer 350 may not be covered by the emission layer 370.

A contact hole 82 may be defined in the fifth insulating layer 350 and the emission layer 370 on the ohmic contacts (or the contact member) 190d.

A common electrode 270 is disposed on the emission layer 370. The common electrode 270 may be disposed continuously over a plurality of pixels PX1, PX2, and PX3. The common electrode 270 may be electrically connected to the common voltage line 170 by contacting the ohmic contact (or the contact member) 190d through the contact hole 82 to receive the common voltage.

The common electrode 270 may include a conductive transparent material.

The pixel electrodes 191a, 191b, and 191c, the emission layer 370, and the common electrode 270 of each of the pixels PX1, PX2, and PX3 together form the LED ED, and one of the pixel electrodes 191a, 191b, and 191c, and the common electrode 270, becomes a cathode and the other becomes an anode. In the exemplary example above, the pixel electrodes 191a, 191b, and 191c become the anode.

Figure 10:
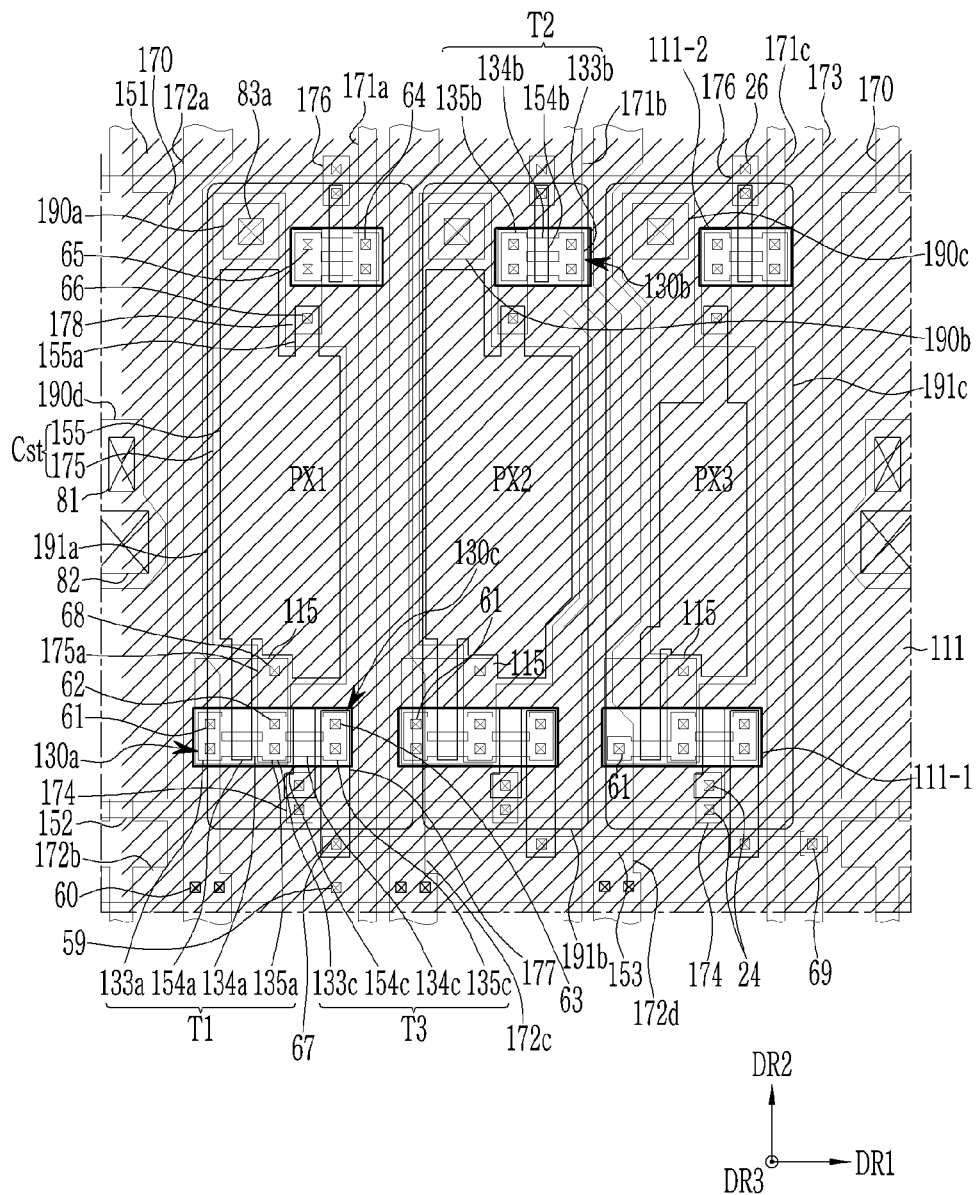
FIG. 10 is a plan view of an exemplary embodiment of a plurality of pixels of a display device according to the invention.
Figure 11:
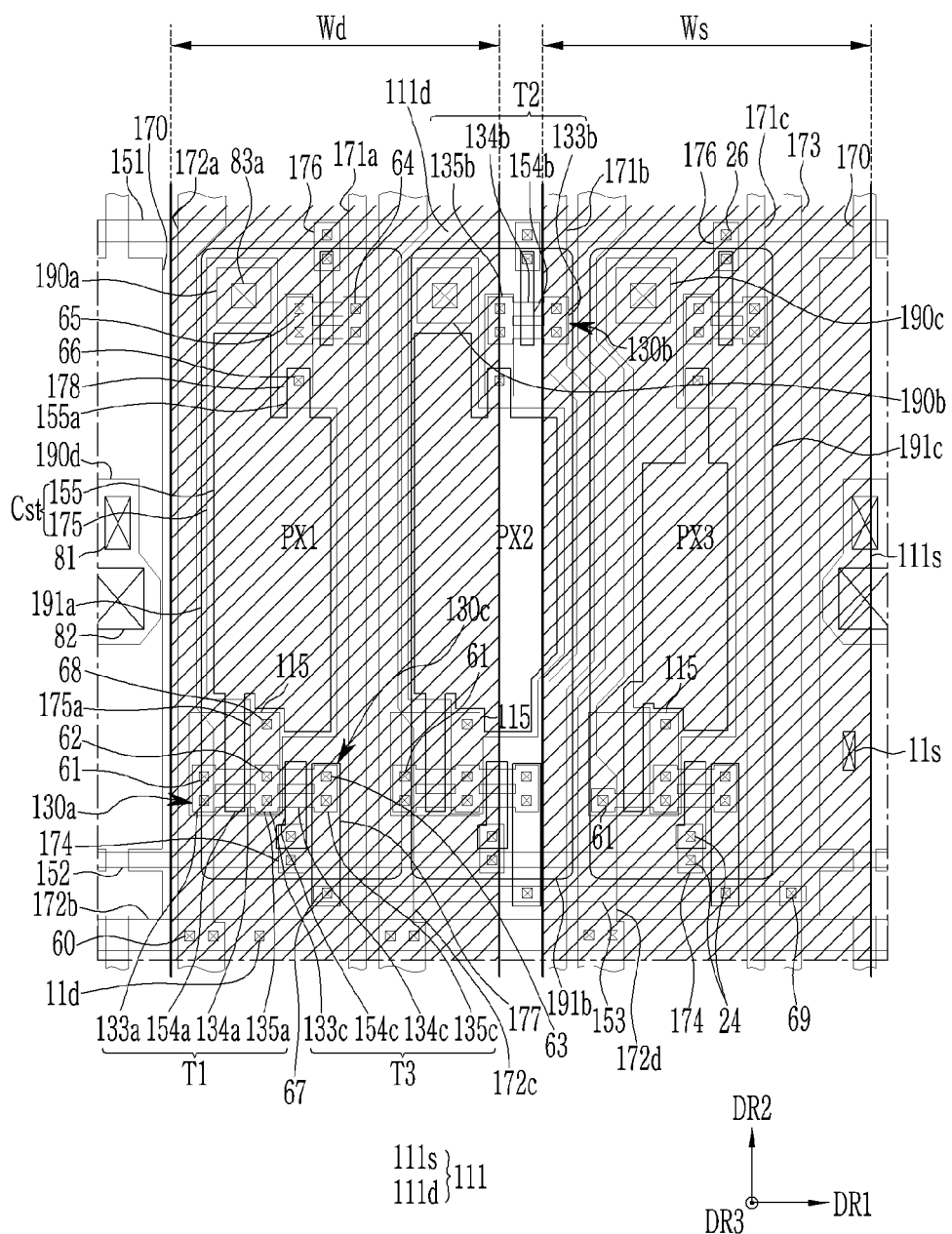
FIG. 11 is a plan view of an exemplary embodiment of a plurality of pixels of a display device according to the invention.
Figure 12:
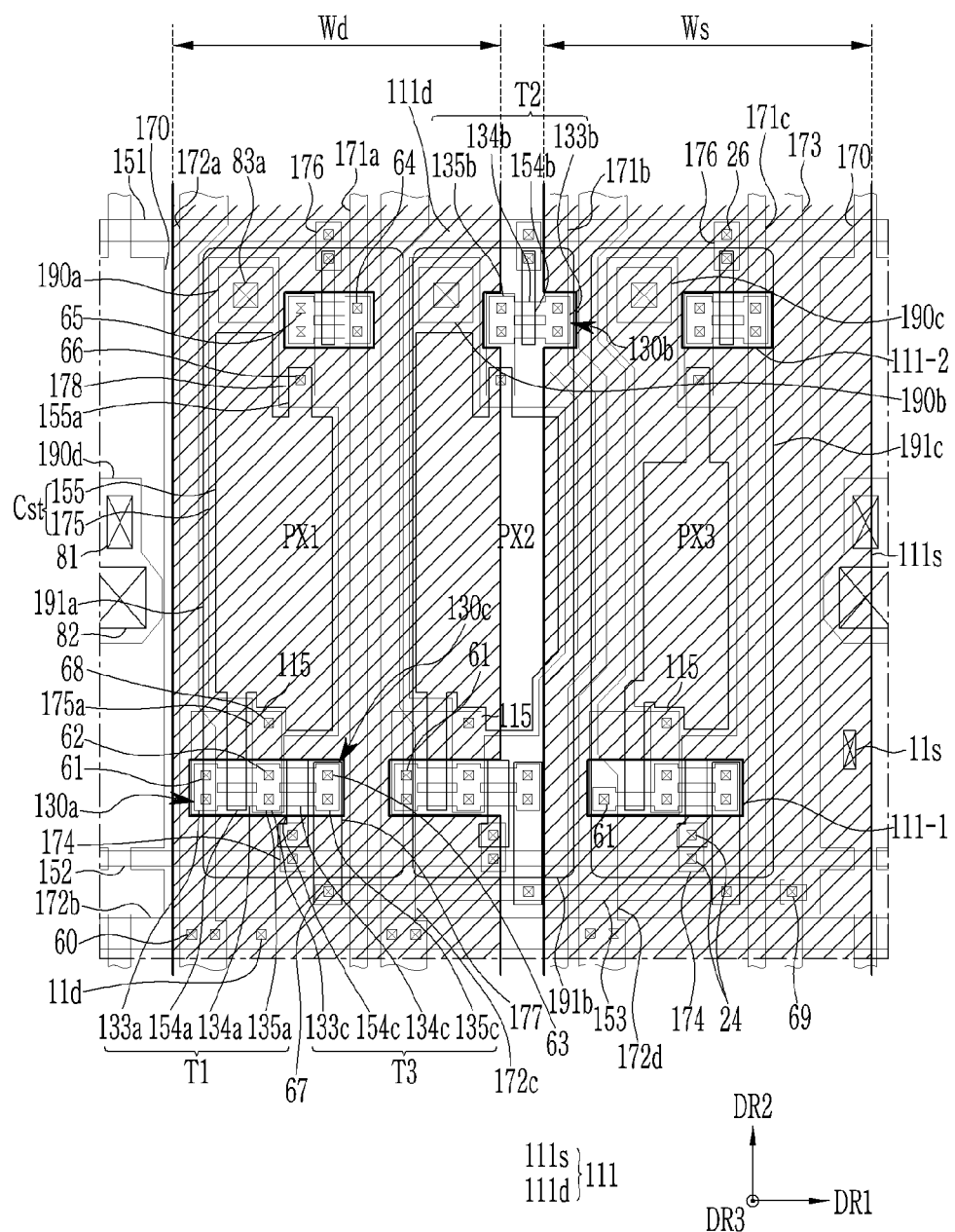
FIG. 12 is a plan view of an exemplary embodiment of a plurality of pixels of a display device according to the invention.
Figure 13:
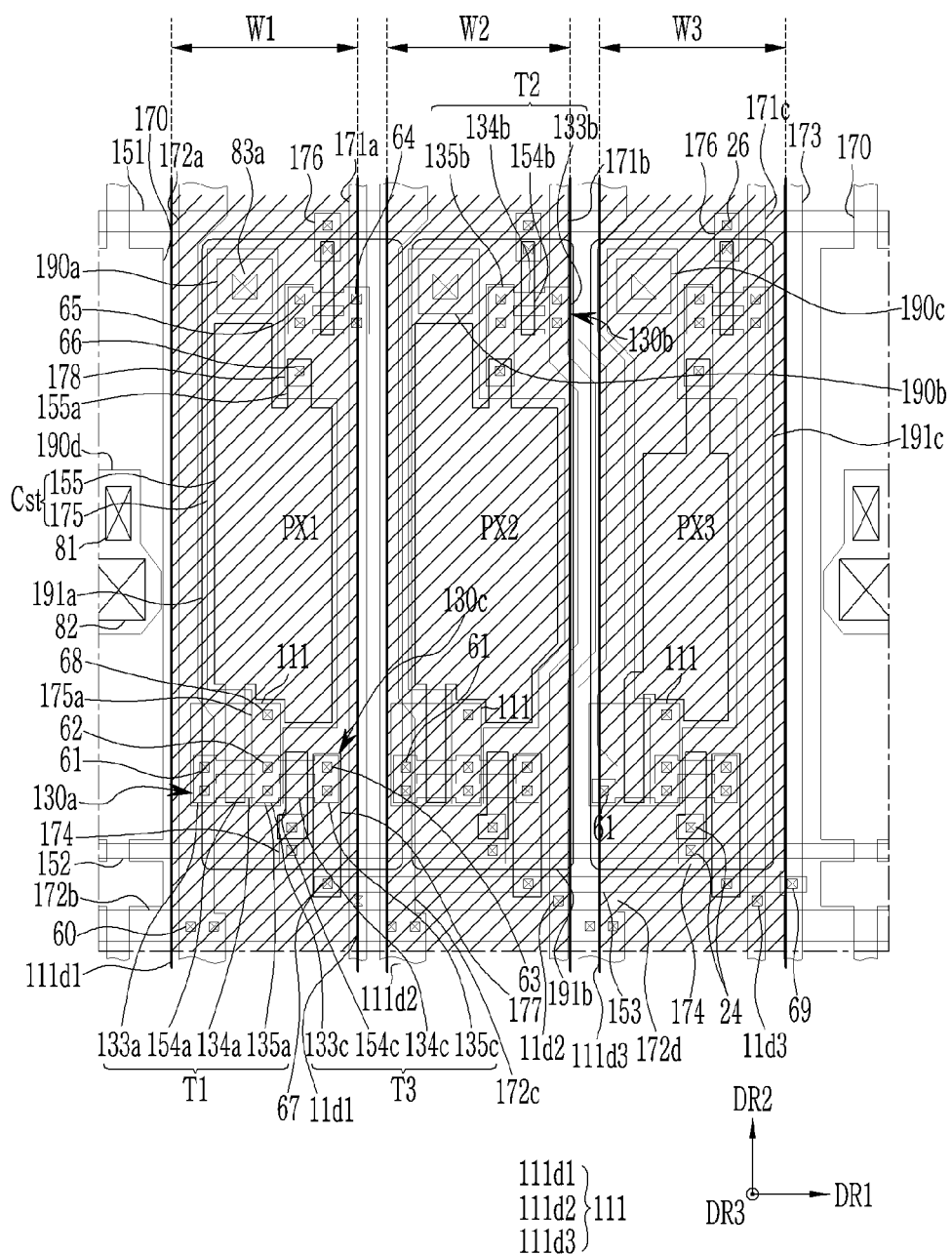
FIG. 13 is a plan view of an exemplary embodiment of a plurality of pixels of a display device according to the invention.
Figure 14:
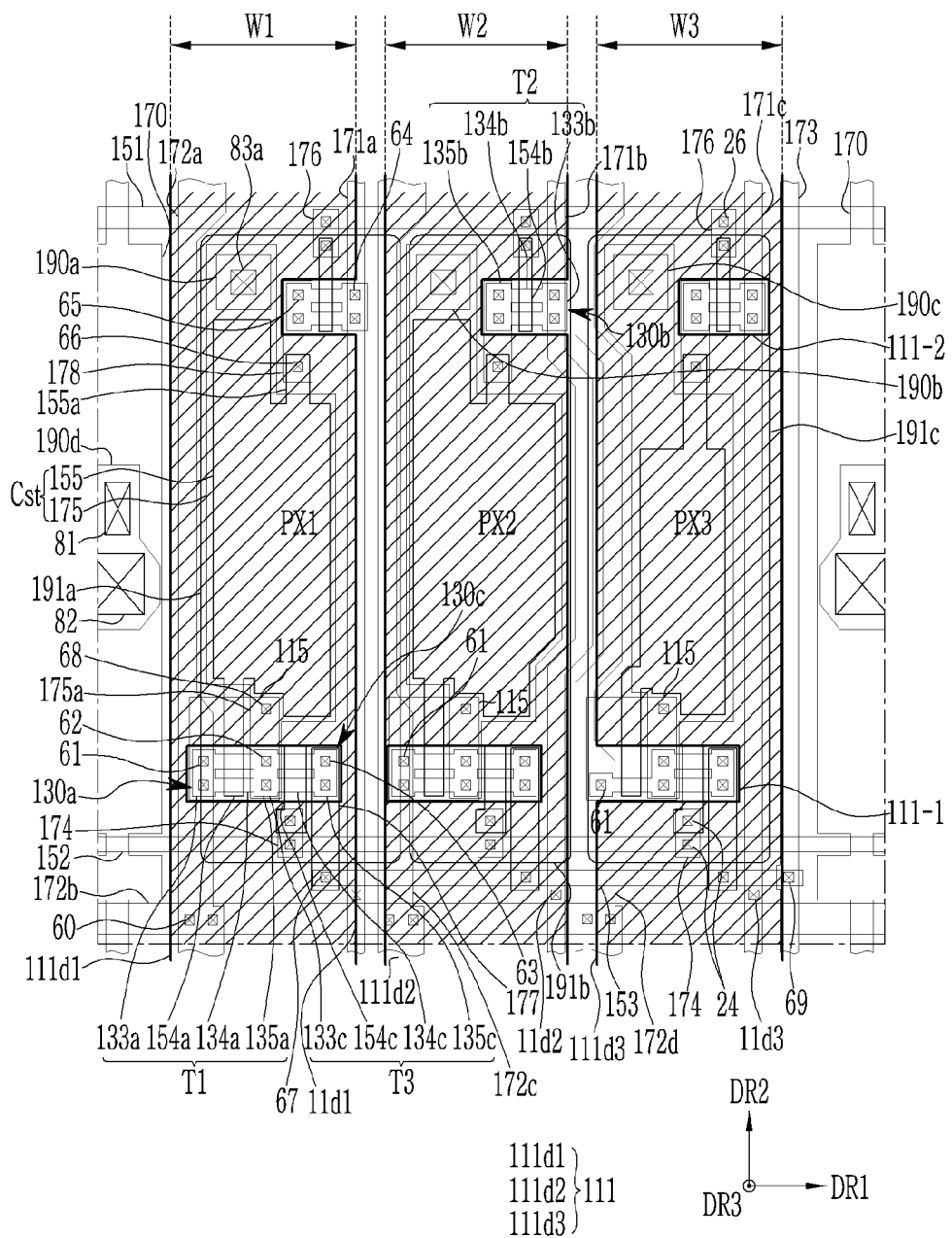
FIG. 14 is a plan view of an exemplary embodiment of a plurality of pixels of a display device according to the invention.

Next, the display device in an exemplary embodiment is described with reference to FIGS. 10 to 14. FIG. 10 is a plan view of an exemplary embodiment of a plurality of pixels of a display device according to the invention, FIG. 11 is a plan view of an exemplary embodiment of a plurality of pixels of a display device according to the invention, FIG. 12 is a plan view of an exemplary embodiment of a plurality of pixels of a display device according to the invention, FIG. 13 is a plan view of an exemplary embodiment of a plurality of pixels of a display device according to the invention, and FIG. 14 is a plan view of an exemplary embodiment of a plurality of pixels of a display device according to the invention. Descriptions of the same constituent elements as those of the above-mentioned constituent elements are omitted.

First, referring to FIG. 10, openings 111-1 and 111-2 overlapping the active layer may be defined in the metal layer 111 in an exemplary embodiment. Specifically, a first opening 111-1 overlapping the first active pattern 130a and the third active pattern 130c, and a second opening 111-2 overlapping the second active pattern 130b may be defined in the metal layer 111.

The metal layer 111 is connected to the transverse driving voltage line 172b through the contact hole 59 to receive a predetermined voltage. The metal layer 111 in an exemplary embodiment does not overlap the active layer through the openings 111-1 and 111-2, so that the transistor performance may not be affected.

Next, referring to FIG. 11, the metal layer 111 in an exemplary embodiment may include a first voltage metal layer 111d and a second voltage metal layer 111s. The first voltage metal layer 111d and the second voltage metal layer 111s may be spaced apart from each other. The first voltage metal layer 111d and the second voltage metal layer 111s may have a stripe shape extending along the second direction DR2.

The first voltage metal layer 111d has a first width Wd, and the second voltage metal layer 111s has a second width Ws in a plan view. At this time, the first width Wd and the second width Ws may be substantially the same. However, the invention is not limited thereto, and may be changed depending on the pixel width, structure, and the like.

The first voltage metal layer 111d may be connected to the transverse driving voltage line 172b through the contact hole 11d. The first voltage metal layer 111d may be supplied with the driving voltage. The second voltage metal layer 111s may be connected to the common voltage line 170 through the contact hole 11s. The second voltage metal layer 111s may receive the common voltage.

Next, referring to FIG. 12, the metal layer 111 in an exemplary embodiment may include a first voltage metal layer 111d and a second voltage metal layer 111s. The first voltage metal layer 111d and the second voltage metal layer 111s may be spaced apart from each other. The first voltage metal layer 111d and the second voltage metal layer 111s may have a stripe shape extending along the second direction DR2.

The openings 111-1 and 111-2 overlapping the active layer may be defined in the metal layer 111 in an exemplary embodiment. In detail, a first opening 111-1 overlapping the first active pattern 130a and the third active pattern 130c, and a second opening 111-2 overlapping the second active pattern 130b may be defined in the metal layer 111. In an exemplary embodiment, an opening overlapping a portion of the active patterns 130a, 130b, and 130c may be defined in the metal layer 111.

The metal layer 111 may receive a predetermined voltage such as the driving voltage or the common voltage. The metal layer 111 in an exemplary embodiment does not overlap the active layer through the openings 111-1 and 111-2, so that the transistor performance may not be affected.

Next, referring to FIG. 13, the metal layer 111 in an exemplary embodiment may include a first sub-metal layer 111d1, a second sub-metal layer 111d2, and a third sub-metal layer 111d3. The first sub-metal layer 111d1 in an exemplary embodiment may be connected to the first data line 171a through the contact hole 11d1, the second sub-metal layer 111d2 may be connected to the second data line 171b through the contact hole 11d2, and the third sub-metal layer 111d3 may be connected to the third data line 171c through the contact hole 11d3. The first sub-metal layer 111d1 may receive the first data voltage transmitted through the first data line 171a. The second sub-metal layer 111d2 may receive the second data voltage transmitted through the second data line 171b. The third sub-metal layer 111d3 may receive the third data voltage transmitted through the third data line 171c. Although not shown, each data line may be connected to a metal layer by a separate conductive layer between the data line and the metal layer.

The first sub-metal layer 111d1, the second sub-metal layer 111d2, and the third sub-metal layer 111d3 may be spaced apart from each other. The first sub-metal layer 111d1, the second sub-metal layer 111d2, and the third sub-metal layer 111d3 may have a stripe shape extending along the second direction DR2.

In a plan view, the first sub-metal layer 111d1 may have a first width W1, the second sub-metal layer 111d2 may have a second width W2, and the third sub-metal layer 111d3 may have a third width W3. At this time, the first width W1, the second width W2, and the third width W3 may be substantially the same, but the invention is not limited thereto, and may be changed depending on the width, structure, etc. of each pixel.

Next, referring to FIG. 14, openings 111-1 and 111-2 overlapping the active layer may be defined in the metal layer 111 in an exemplary embodiment. In detail, a first opening 111-1 overlapping the first active pattern 130a and the third active pattern 130c, and a second opening 111-2 overlapping the second active pattern 130b may be defined in the metal layer 111. An opening overlapping a portion of the active patterns 130a, 130b, and 130c may be defined in the metal layer 111 in an exemplary embodiment. The shape of the openings 111-1 and 111-2 defined in the metal layer 111 may be changed by the active patterns 130a, 130b, and 130c.

The metal layer 111 may receive a predetermined voltage such as the data voltage. The metal layer 111 in an exemplary embodiment does not overlap the active layer through the openings 111-1 and 111-2, so that the transistor performance may not be affected.

Figure 15:
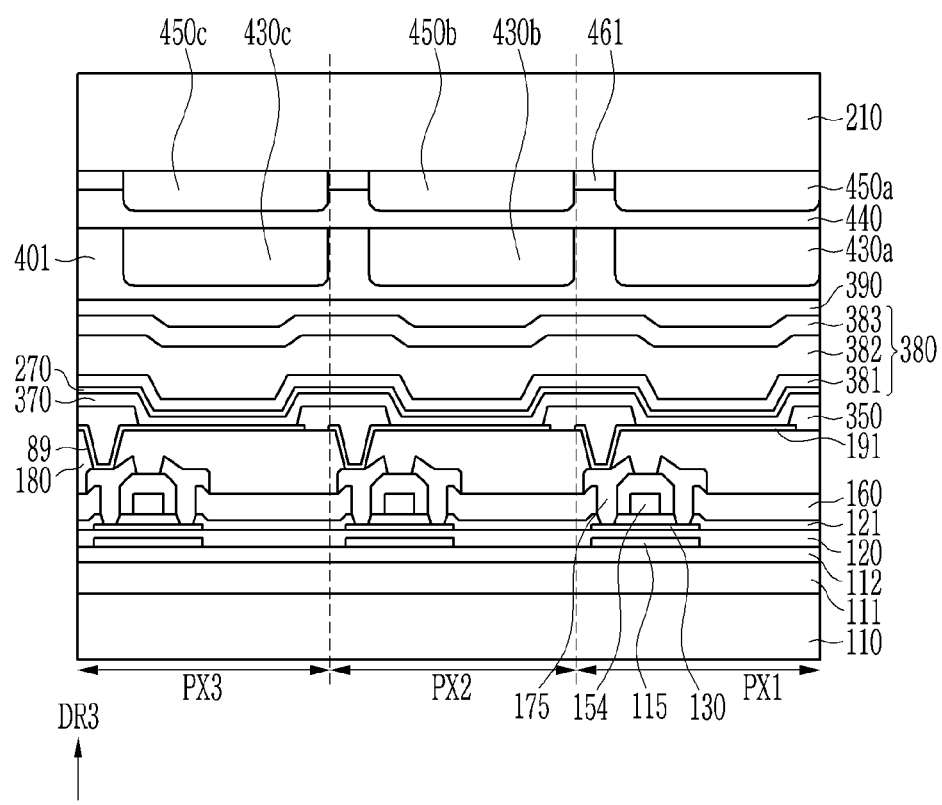
FIG. 15 is a plan view of an exemplary embodiment of a plurality of pixels of a display device according to the invention.

Next, the display device in an exemplary embodiment is described with reference to FIG. 15. FIG. 15 is a plan view of an exemplary embodiment of a plurality of pixels of a display device according to the invention.

On the substrate 110, a metal layer 111 and an insulating layer 112 overlapping the entire surface of the substrate 110 may be disposed. The specification describes an exemplary embodiment in which the metal layer 111 and the insulating layer 112 according to the exemplary embodiment of FIG. 2 are applied, however it is not limited thereto, and any of the above-described exemplary embodiments is applicable.

A first conductive layer including a lower pattern 115 may be disposed on the insulating layer 112.

A buffer layer 120 may be disposed on the first conductive layer and an active layer 130 may be disposed thereon.

A first insulating layer 121 may be disposed on the active layer 130. The first insulating layer 121 may be the same layer as the insulating pattern 144 described above, but unlike the insulating pattern 144, the first insulating layer 121 may be disposed on an entire area on the substrate 110 and partially removed. That is, the first insulating layer 121 may be also disposed on the buffer layer 120, unlike the insulating pattern 144. In an alternative exemplary embodiment, a structure such as the insulating pattern 144 may be disposed instead of the first insulating layer 121.

On the first insulating layer 121, a second conductive layer including a gate electrode 154 is disposed, and a second insulating layer 160 may be disposed thereon.

On the second insulating layer 160, a third conductive layer including a capacitor electrode 175 may be disposed, and a third insulating layer 180 may be disposed thereon.

On the third insulating layer 180, a pixel electrode layer including a plurality of pixel electrodes 191 may be disposed. The pixel electrode 191 may be electrically connected to the capacitor electrode 175 through a contact hole 89 of the third insulating layer 180.

On the third insulating layer 180, a sixth insulating layer 350 may be disposed, and an emission layer 370 and a common electrode 270 may be sequentially disposed on the pixel electrode layer and the sixth insulating layer 350. In an exemplary embodiment, the emission layer 370 may include an emission material that emits a first color light that may be blue light, for example.

An encapsulation layer 380 including a plurality of insulating layers 381, 382, and 383 may be disposed on the common electrode 270. The insulating layer 381 and the insulating layer 383 may include an inorganic insulating material, and the insulating layer 382 disposed between the insulating layer 381 and the insulating layer 383 may include an organic insulating material.

On the encapsulation layer 380, a filling layer 390 including a filler may be disposed. A covering layer 401 including an insulating material, and a plurality of color conversion layers 430a and 430b and a transmissive layer 430c may be disposed on the filling layer 390.

The transmissive layer 430c may pass incident light. That is, the transmissive layer 430c may transmit the first color light which may be blue light. The transmissive layer 430c may include a polymer material that transmits the first color light. In an exemplary embodiment, the region in which the transmissive layer 430c is disposed may correspond to a light emitting region emitting blue light, for example, and the transmissive layer 430c may pass the incident first color light as it is without including a separate semiconductor nanocrystal.

The color conversion layers 430a and 430b may include different semiconductor nanocrystals from each other. In an exemplary embodiment, the first color light incident on the color conversion layer 430a may be converted to a second color light by the semiconductor nanocrystal included in the color conversion layer 430b and may then be emitted, for example. The first color light incident on the color conversion layer 430b may be converted to a third color light by the semiconductor nanocrystal included in the color conversion layer 430b and may then be emitted.

The semiconductor nanocrystal may include at least one of a phosphor and a quantum dot material that converts the incident first color light into the second color light or the third color light.

A core of the quantum dot may be one of a Group II-VI compound, a Group III-V compound, a Group IV-VI compound, a Group IV element, a Group IV compound, and a combination thereof.

In an exemplary embodiment, the Group II-VI compound may be at least one of a binary compound including CdSe, CdTe, ZnS, ZnSe, ZnTe, ZnO, HgS, HgSe, HgTe, MgSe, MgS, and a combination thereof, a ternary compound including CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a quaternary compound including HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

In an exemplary embodiment, the Group III-V compound may be at least one of a binary compound including GaN, GaP, GaAs, GaSb, AlN, AlP, AlAs, AlSb, InN, InP, InAs, InSb, and a combination thereof, a ternary compound including GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof, and a quaternary compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

In an exemplary embodiment, the Group IV-VI compound may be at least one of a binary compound including SnS, SnSe, SnTe, PbS, PbSe, PbTe, and a combination thereof, a ternary compound including SnSeS, SnSeTe, SnالسTe, PbSeS, PbSeTe, PbSTe, SnPbS, SnPbSe, SnPbTe, and a combination thereof, and a quaternary compound including SnPbSSe, SnPbSeTe, SnPbSTe, and a combination thereof. The Group IV element may include one of Si, Ge, and a combination thereof. The Group IV combination may be a binary compound including SiC, SiGe, and a combination thereof.

In this case, the binary compound, the ternary compound, or the quaternary compound may exist in particles at a uniform concentration, or may exist in the same particle divided into states where concentration distributions are partially different. Further, the color conversion media layer may have a core/shell structure where one quantum dot surrounds another quantum dot. An interface between the core and the shell may have a concentration gradient, such that a concentration of an element existing in the shell is gradually reduced toward the center thereof.

In some exemplary embodiments, the quantum dot may have a core-shell structure including the core including the nanocrystal described above and a shell surrounding the core. The shell of the quantum dot serves as a protective layer to prevent chemical denaturation of the core and/or to serve as a charging layer to impart electrophoretic characteristics to the quantum dot. The shell may be a single layer or a multiple layer. The interface between the core and the shell may have a concentration gradient in which the concentration of the elements existing in the shell decreases toward the center. Examples of the shells of the quantum dot include metal or non-metal oxides, semiconductor compounds, or combinations thereof.

In an exemplary embodiment, the metal or nonmetal oxide may be a binary compound such as SiO2, Al2O3, TiO2, ZnO, MnO, Mn2O3, Mn3O4, CuO, FeO, Fe2O3, Fe3O4, CoO, Co3O4, and NiO, or a ternary compound such as MgAl2O4, CoFe2O4, NiFe2O4, and CoMn2O4, for example, but the invention is not limited thereto.

In an exemplary embodiment, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, for example, however the invention is not limited thereto.

In an exemplary embodiment, the quantum dot may have a full width at half maximum ("FWHM") of an emission wavelength spectrum of about 45 nanometers (nm) or less, preferably about 40 nm or less, and more preferably about 30 nm or less, for example, and in this range, color purity or color reproducibility may be improved. Also, since the light emitted through the quantum dot is emitted in all directions, the light viewing angle may be improved.

Further, a form of the quantum dot is one generally used in the art and is not particularly limited, but more specifically, forms such as spherical, pyramidal, multi-arm-shaped, or cubic nanoparticles, nanotubes, nanowires, nanofibers, and nanoplate-shaped particles may be used.

The quantum dot may adjust the color of emitted light depending on the particle size, so the quantum dot may have various luminescent colors such as blue, red, and green.

An insulating layer 440 may be disposed on the plurality of color conversion layers 430a and 430b and the transmissive layer 430c, and a plurality of color filters 450a, 450b, and 450c and a light blocking member 461 may be disposed thereon. In another exemplary embodiment, a plurality of color filters 450a, 450b, and 450c may be omitted.

The color filter 450a may represent a second color light, the color filter 450b may represent a third color light, and the color filter 450c may represent a first color light.

The light blocking member 461 may be disposed between neighboring color filters 450a, 450b, and 450c.

A substrate 210 may be disposed on the plurality of color filter 450a, 450b, and 450c and the light blocking member 461. That is, the plurality of color conversion layers 430a and 430b and the plurality of color filters 450a, 450b, and 450c may be disposed between the substrate 110 and the substrate 210.

In another exemplary embodiment of the invention, the emission layer 370 may include the quantum dot instead of the plurality of color conversion layers 430a and 430b and the transmissive layer 430c.

Figure 16:
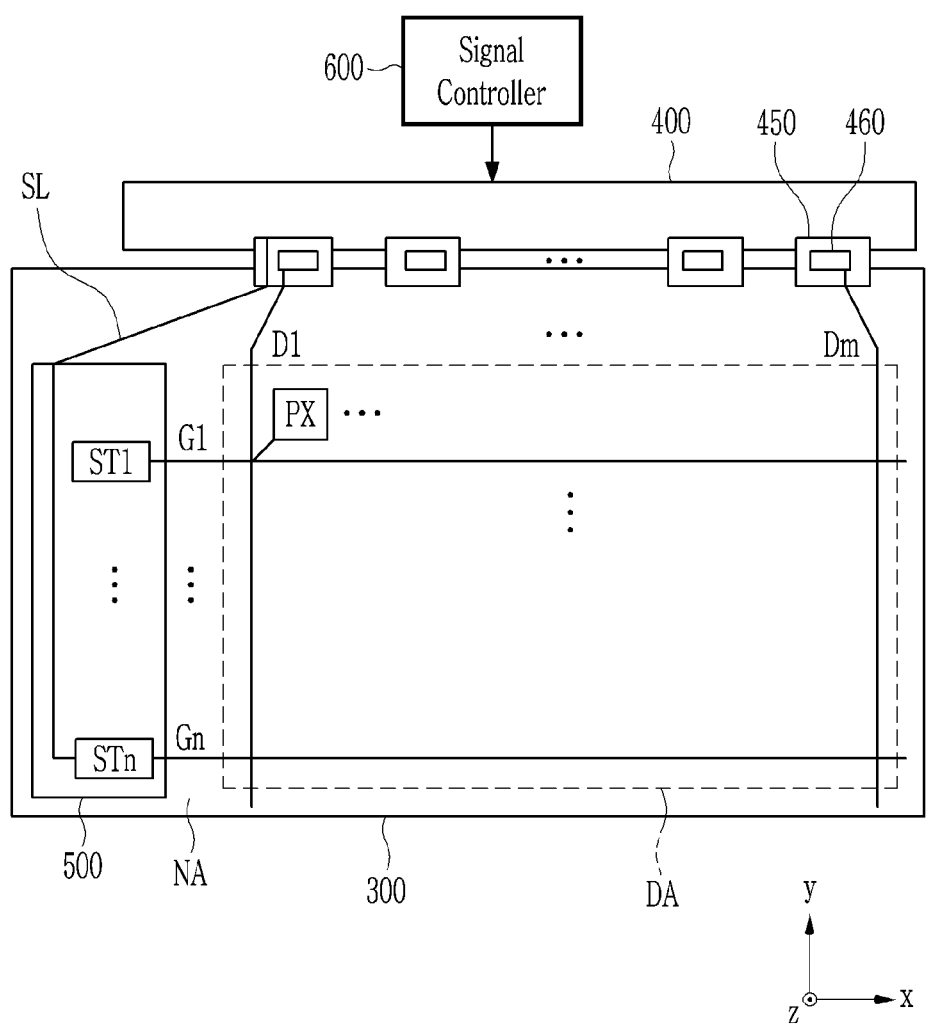
FIG. 16 is a view schematically showing an exemplary embodiment of a configuration of a display device according to the invention.
Figure 17:
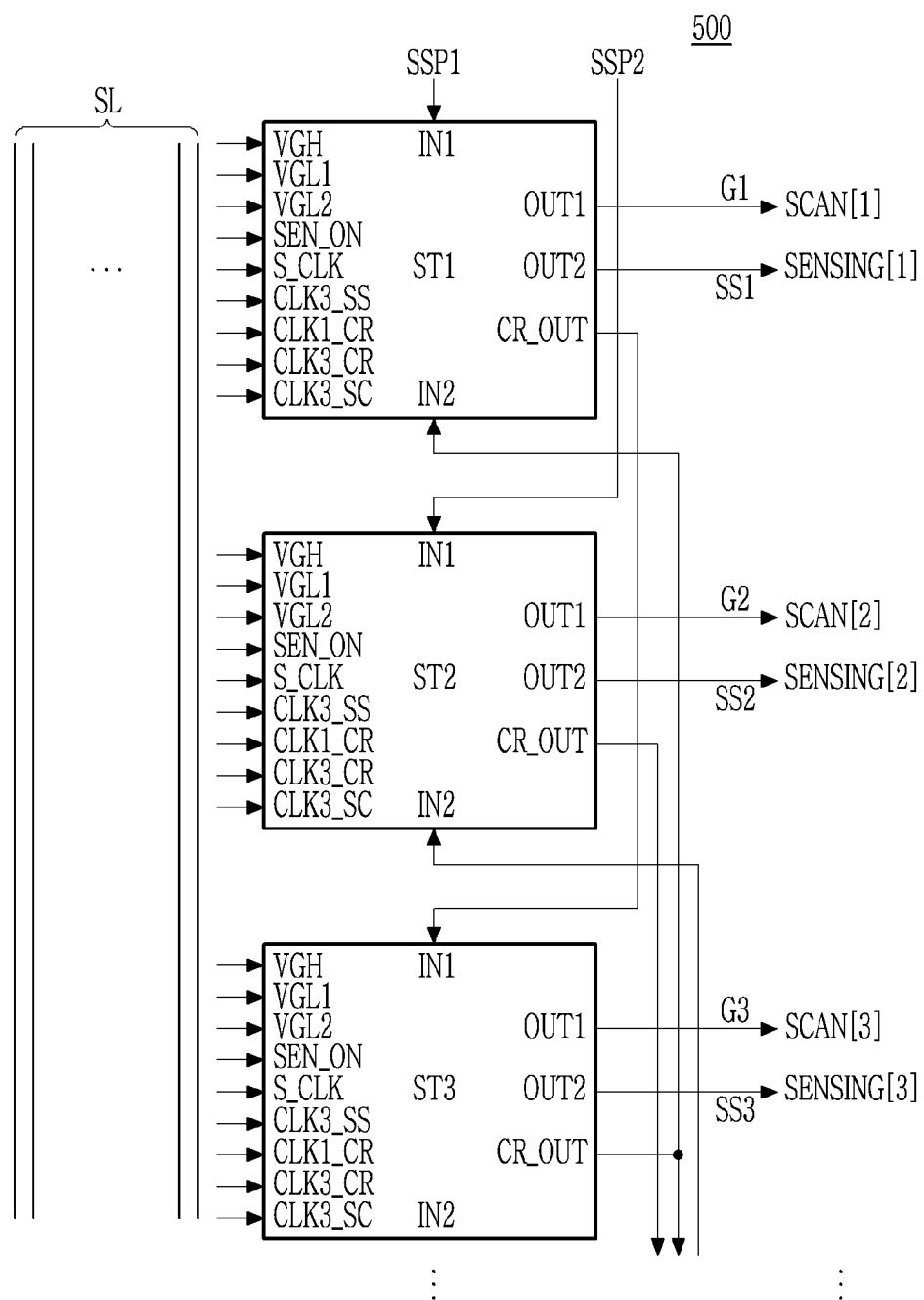
FIG. 17 is a block diagram of an exemplary embodiment of a gate driver of a display device according to the invention.
Figure 18:
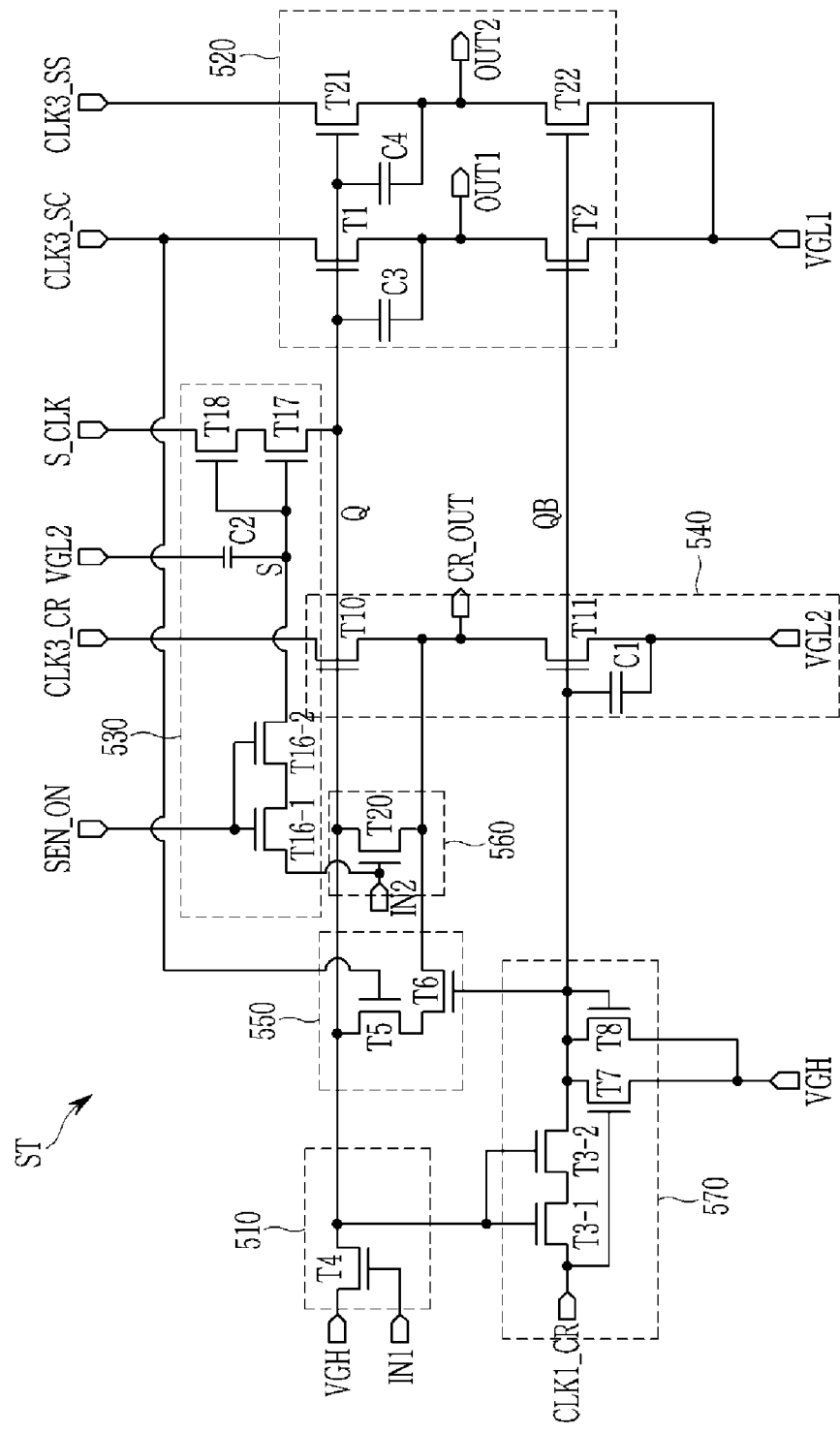
FIG. 18 is a circuit diagram of an exemplary embodiment of one stage of a gate driver of a display device according to the invention.

Next, the display device in an exemplary embodiment is described with reference to FIGS. 16 to 18. FIG. 16 is a view schematically showing a configuration of an exemplary embodiment of a display device according to the invention, FIG. 17 is a block diagram of an exemplary embodiment of a gate driver of a display device according to the invention, and FIG. 18 is an exemplary embodiment of a circuit diagram of one stage of a gate driver of a display device according to the invention.

First, referring to FIG. 16, the display device includes a display panel 300, a data driver 460, a gate driver 500, and a signal controller 600.

The display panel 300 includes a display area DA displaying an image and a non-display area NA in which a gate driver 500 applying a gate voltage to gate lines G1 to Gn, where n is a natural number greater than one, and disposed around the display area DA.

The data lines D1 to Dm, where m is a natural number greater than one, of the display area DA may receive the data voltage from a data driver 460 that may be an integrated circuit ("IC") disposed on a flexible printed circuit board ("FPCB") 450 attached to the display panel 300. The data line D1 to Dm extends from the display area DA to the non-display area NA, thereby forming at least part of a fanout portion (not shown) in the non-display area NA.

The gate driver 500 and data driver 460 are controlled by a signal controller 600. The printed circuit board ("PCB") 400 is disposed outside the FPCB 450 to transmit the signal from signal controller 600 to the data driver 460 and the gate driver 500. The signals provided from the signal controller 600 to the gate driver 500 through the plurality of signal lines SL may include signals such as a vertical start signal, a clock signal, and a signal providing a voltage of a predetermined level (a high voltage and/or a low voltage). In an exemplary embodiment, the signal provided to the gate driver 500 may include fewer or more types of vertical start signals, clock signals, and/or voltages.

A plurality of pixels PX is disposed in the display area. The display area DA includes transistors and storage capacitors. The storage capacitors store a charge for a predetermined period of time, and maintain the voltage and the applied voltage even after the transistor is turned off. In the case of a liquid crystal display, the display area DA includes a liquid crystal capacitor, and the liquid crystal capacitor includes a pixel electrode, a common electrode, and a liquid crystal layer. In the case of a light emitting diode display, the display area DA includes a light-emitting element, and the light-emitting element includes a pixel electrode, a common electrode, and an emission layer. A plurality of gate lines G1 to Gn and a plurality of data lines D1 to Dm are disposed in the display area DA. The gate lines G1 to Gn and the data lines D1 to Dm may cross and be insulated from each other. A plurality of sensing lines (not shown) may be further disposed in the display area DA.

For the liquid crystal display, the pixel PX includes the transistors, the liquid crystal capacitors, and the storage capacitors. The control terminal (or the gate electrode) of the transistor is connected to the gate line, the input terminal (or the source electrode) of the transistor is connected to the data line, and the output terminal (or the drain electrode) of the transistor is connected to one terminal of the liquid crystal capacitor and one terminal of the storage capacitor. The other terminal of the liquid crystal capacitor is connected to the common electrode to receive the common voltage, and the other terminal of the storage capacitor receives a storage voltage. In the case of the light emitting diode display, the pixel PX may include at least two transistors including a switching transistor and a driving transistor, at least one storage capacitor, and a light-emitting element, and may further include at least one compensation transistor.

The data lines D1 to Dm receive the data voltage from the data driver 460, and the gate lines G1 to Gn receive the gate voltage from the gate driver 500.

The data driver 460 may be disposed on the upper side or the lower side of the display panel 300, and may be connected to the data lines D1 to Dm extending in the vertical direction.

The gate driver 500 receives the vertical start signal, the clock signal, a high voltage corresponding to the gate-on voltage, and a low voltage corresponding to the gate-off voltage to generate gate signals (a gate-on voltage and a gate-off voltage) to be applied to the gate lines G1 to Gn. The gate driver 500 receives the vertical start signal, the clock signal, the high voltage, and the low voltage to generate the sensing signal to be applied to the sensing lines. The gate driver 500 includes a plurality of stages ST1-STn generating and outputting the gate signal by these signals, and a plurality of signal lines SL transmitting these signals to the stages ST1-STn. The signal lines SL may be disposed further outside the display area DA than the stages ST1-STn, but are not limited thereto, and some signal lines may be disposed between the stages ST1-STn and the display area DA. Although one signal line is shown in FIG. 16, the signal line SL may include a number of signal lines corresponding to the number of signals applied to the gate driver 500, and may include more or fewer signal lines. The gate driver 500 may be integrated into the non-display area NA of the display panel 300. In an exemplary embodiment, the gate driver 500 may be disposed (e.g., mounted) on a PCB or a FPCB in a form of an IC chip to be electrically connected to the display panel 300.

A vertical start signal, a clock signal, a high voltage, and a low voltage may be applied to the gate driver 500 through the FPCB 450 disposed close to the gate driver 500. These signals may be transmitted from the outside or the signal controller 600 to the FPCB 450 through the PCB 400.

The gate driver 500 may be disposed on the left and/or right side of the display area DA, and may be disposed on the upper side and/or the lower side thereof. When the gate driver 500 is disposed on the left and right sides of the display panel, the gate driver disposed on the left side of the display panel includes odd-numbered stages ST1, ST3, . . . , and the gate driver disposed on the right side of the display panel includes even-numbered stage ST2, ST4, . . . , or vice versa. However, even though the gate driver 500 is disposed on the left and right sides of the display panel, the left and right gate drivers may include all the stages ST1-STn. The stages ST1-STn of the gate driver 500 may include a plurality of transistors and at least one capacitor. These transistors and capacitors may be fabricated in the same process as the transistors included in the pixel PX of the display area.

Next, the gate driver of the display device in an exemplary embodiment is described with reference to FIGS. 17 and 18.

First, referring to FIG. 17, and the gate driver 500 include a plurality of stages ST1, ST2, ST3, . . . that are dependently connected with each other. These stages ST1, ST2, ST3, . . . may be respectively connected to a corresponding number of the gate lines G1, G2, G3, . . . to sequentially output the gate signals SCAN[1], SCAN[2], SCAN[3], . . . to the gate lines G1, G2, G3, . . . . Also, the stages ST1, ST2, ST3, . . . may be respectively connected to a corresponding number of the sensing lines SS1, SS2, SS3, . . . to sequentially output the sensing signals SENSING[1], SENSING [2], SENSING[3], . . . to the sensing lines SS1, SS2, SS3, . . . . Each stage ST1, ST2, ST3, . . . includes a first input terminal IN1, a second input terminal IN2, voltage terminals VGH, VGL1, and VGL2, a sensing terminal SEN_ON, clock terminals S_CLK, CLK3_SS, CLK1_CR, CLK3_CR, and CLK3_SC, a first output terminal OUT1, a second output terminal OUT2, and a carry output terminal CR_OUT.

Referring to FIG. 18 along with FIG. 17, one stage ST among the plurality of stages ST1, ST2, ST3, . . . is shown. A first input terminal IN1 is connected to a carry output terminal CR_OUT of the second previous stage, and receives a carry signal output from the carry output terminal CR_OUT of the second previous stage. However, since a second previous stage does not exist for the first stage ST1 and the second stage ST2, a first vertical start signal SSP1 may be input to an input first input terminal IN1 of the first stage ST1, and a second vertical start signal SSP2 may be input to a first input terminal IN1 of the second stage ST2.

The second input terminal IN2 is connected to the carry output terminal CR_OUT of the second next stage, and receives the carry signal output from the carry output terminal CR_OUT of the second next stage. However, since a second next stage does not exist for the final stage and the previous stage of the final stage, a first vertical start signal SSP1 and a second vertical start signal SSP2 of the next frame may be respectively input to the second input terminal IN2 of the final stage and the previous stage of the final stage.

The voltage terminals VGH, VGL1, and VGL2 may include a high voltage terminal VGH, a first low voltage terminal VGL1, and a second low voltage terminal VGL2. The high voltage of a predetermined level may be input to the high voltage terminal VGH, a first low voltage of a predetermined level may be input to the first low voltage terminal VGL1, and a second low voltage lower than the first low voltage may be input to the second low voltage terminal VGL2. In an exemplary embodiment, the first low voltage may correspond to the gate-off voltage of the gate signal. In an exemplary embodiment, the first low voltage may correspond to the gate-off voltage of the sensing signal. In an exemplary embodiment, the second low voltage may correspond to the gate-off voltage of the carry signal. In an exemplary embodiment, the second low voltage may correspond to a discharge level of a first node Q included in the stage.

The first output terminal OUT1 is electrically connected to the corresponding gate lines G1, G2, G3, . . . to output the gate signal. In an exemplary embodiment, the first output terminal OUT1 of the first stage ST1 is electrically connected to the first gate line G1 to output the first gate signal SCAN[1], and the first output terminal OUT1 of the second stage ST2 is electrically connected to the second gate line G2 to output the second gate signal SCAN[2], for example. After the first gate signal SCAN[1] is output, the second gate signal SCAN[2] is output. Next, the third gate signal SCAN[3] to the final gate signal are sequentially output.

The second output terminal OUT2 is electrically connected to the corresponding sensing lines SS1, SS2, SS3, . . . to output the sensing signal. In an exemplary embodiment, the second output terminal OUT2 of the first stage ST1 is electrically connected to the first sensing lines SS1 to output the first sensing signal SENSING[1], and the second output terminal OUT2 of the second stage ST2 is electrically connected to the second sensing lines SS2 to output the second sensing signal SENSING[2], for example. After the first sensing signal SENSING[1] is output, the second sensing signal SENSING[2] is output. Next, the third sensing signal SENSING[3] to the final sensing signal are sequentially output.

The carry output terminal CR_OUT outputs the carry signal. The carry output terminal CR_OUT may be connected to the first input terminal IN1 of the second next stage and the second input terminal IN2 of the second previous stage.

In detail, the stage ST includes a first node charge unit 510, a buffer unit 520, a sensing unit 530, a carry unit 540, a first node holding unit 550, a first node discharge unit 560, an inverter unit 570, etc.

The first node charge unit 510 transmits the high voltage to the first node Q according to the carry signal or the vertical start signal, which is input to the first input terminal IN1. The high voltage may be the gate-on voltage. The first node charge unit 510 may include a fourth transistor T4. The fourth transistor T4 includes a control terminal connected to the first input terminal IN1, an input terminal connected to the high voltage terminal VGH, and an output terminal connected to the first node Q.

The buffer unit 520 may include a first transistor T1, a second transistor T2, a third capacitor C3, a twenty-first transistor T21, a twenty-second transistor T22, and a fourth capacitor C4.

The third capacitor C3 and the fourth capacitor C4 are charged with the first voltage corresponding to the high voltage in response to the carry signal applied to the first node Q. The third capacitor C3 includes one terminal connected to the first node Q and the other terminal connected to the first output terminal OUT1. The fourth capacitor C4 includes one terminal connected to the first node Q and the other terminal connected to the second output terminal OUT2.

The first transistor T1 includes the control terminal connected to the first node Q, the input terminal connected to the clock terminal CLK3_SC, and the output terminal connected to the first output terminal OUT1. The control terminal and the output terminal of the first transistor T1 are connected to one terminal and the other terminal of the third capacitor C3, respectively. In the state that the first voltage charged by the third capacitor C3 is applied to the control terminal of the first transistor T1, when the clock signal of the high voltage is received by the clock terminal CLK3_SC, the first transistor T1 is bootstrapped. In this case, the first node Q connected to the control terminal of the first transistor T1 is boosted from the first voltage to a boosting voltage.

While the boosting voltage is applied to the control terminal of the first transistor T1, the first transistor T1 may output the clock signal input to the clock terminal CLK3_SC to the first output terminal OUT1 as the gate signal. The clock signal of the high voltage may be output as the gate signal of the gate-on voltage through the first output terminal OUT1.

The twenty-first transistor T21 includes the control terminal connected to the first node Q, the input terminal connected to the clock terminal CLK3_SS, and the output terminal connected to the second output terminal OUT2. The control terminal and output terminal of the twenty-first transistor T21 are connected to one terminal and the other terminal of the fourth capacitor C4, respectively.

The second transistor T2 pulls-down the gate signal. The second transistor T2 includes the control terminal connected to the second node QB, the input terminal connected to the first output terminal OUT1, and the output terminal connected to the first low voltage terminal VGL1. The second transistor T2 pulls down the voltage of the first output terminal OUT1 to the first low voltage applied to the first low voltage terminal VGL1 according to the voltage of the second node QB.

The twenty-second transistor T22 pulls down the sensing signal. The twenty-second transistor T22 includes the control terminal connected to the second node QB, the input terminal connected to the second output terminal OUT2, and the output terminal connected to the first low voltage terminal VGL1. The twenty-second transistor T22 pulls down the voltage of the second output terminal OUT2 into the first low voltage applied to the first low voltage terminal VGL1 according to the voltage of the second node QB.

The sensing unit 530 may include a sixteenth transistor (T16-1 and T16-2), a seventeenth transistor T17, an eighteenth transistor T18, and a second capacitor C2.

The sixteenth transistor (T16-1 and T16-2) transmits the carry signal applied to the second input terminal IN2 to the third node S according to the signal input to the sensing terminal SEN_ON. The sixteenth transistor (T16-1 and T16-2) may include a sixteenth-first transistor T16-1 and a sixteenth-second transistor T16-2. The sixteenth-first transistor T16-1 includes the control terminal connected to the sensing terminal SEN_ON, the input terminal connected to the second input terminal IN2, and the output terminal connected to the sixteenth-second transistor T16-2. The sixteenth-second transistor T16-2 includes the control terminal connected to the sensing terminal SEN_ON, the input terminal connected to the output terminal of the sixteenth-first transistor T16-1, and the output terminal connected to the third node S.

The second capacitor C2 includes one terminal connected to the third node S and the other terminal connected to the second low voltage terminal VGL2. The second capacitor C2 may be charged with the high voltage of the carry signal applied to the second input terminal IN2.

The seventeenth transistor T17 includes the control terminal connected to the third node S, the input terminal connected to the eighteenth transistor T18, and the output terminal connected to the first node Q. The eighteenth transistor T18 includes the control terminal connected to the third node S, the input terminal connected to the clock terminal S_CLK, and the output terminal connected to the input terminal of the seventeenth transistor T17. When the voltage of the third node S is charged with the high voltage, the seventeenth transistor T17 and the eighteenth transistor T18 transmit the clock signal input to the clock terminal S_CLK to the first node Q to transmit the high voltage of the clock signal to the first node Q.

The fourth capacitor C4 of the buffer unit 520 is charged with the first voltage corresponding to the high voltage applied to the first node Q. In the state that the first voltage charged by the fourth capacitor C4 is applied to the control terminal of the twenty-first transistor T21, when the clock signal of the high voltage is received by the clock terminal CLK3_SS, the twenty-first transistor T21 is bootstrapped. In this case, the first node Q connected to the control terminal of the twenty-first transistor T21 is boosted from the first voltage to the boosting voltage. While the boosting voltage is applied to the control terminal of the twenty-first transistor T21, the twenty-first transistor T21 may output the clock signal input to the clock terminal CLK3_SS to the second output terminal OUT2 as the sensing signal. The clock signal of the high voltage may be output as the sensing signal of the gate-on voltage through the second output terminal OUT2.

The carry unit 540 outputs the carry signal through the carry output terminal CR_OUT. Also, the carry unit 540 pulls down the carry signal output to the carry output terminal CR_OUT to the second low voltage applied to the second low voltage terminal VGL2. The carry unit 540 may include a tenth transistor T10, an eleventh transistor T11, and a first capacitor C1. The tenth transistor T10 includes the control terminal connected to the first node Q, the input terminal connected to the clock terminal CLK3_CR, and the output terminal connected to the carry output terminal CR_OUT. The eleventh transistor T11 includes the control terminal connected to the second node QB, the input terminal connected to the carry output terminal CR_OUT, and the output terminal connected to the second low voltage terminal VGL2. The first capacitor C1 includes one terminal connected to the second node QB and the other terminal connected to the second low voltage terminal VGL2.

The first node holding unit 550 maintains the voltage of the first node Q. The first node holding unit 550 may include a fifth transistor T5 and a sixth transistor T6. The fifth transistor T5 includes the control terminal connected to the clock terminal CLK3_SC, the input terminal connected to the first node Q, and the output terminal connected to the sixth transistor T6. The sixth transistor T6 includes the control terminal connected to the second node QB, the input terminal connected to the output terminal of the fifth transistor T5, and the output terminal connected to the carry output terminal CR_OUT. The first node holding unit 550 may maintain the voltage of the first node Q according to the clock signal input to the clock terminal CLK3_SC and the voltage of the second node QB as the second low voltage.

The first node discharge unit 560 may discharge the high voltage of the first node Q in response to the carry signal input to the second input terminal IN2. The first node discharge unit 560 may include a twentieth transistor T20. The twentieth transistor T20 includes the control terminal connected to the second input terminal IN2, the input terminal connected to the first node Q, and the output terminal connected to the carry output terminal CR_OUT.

While the high voltage is applied to the first node Q, the inverter unit 570 applies the clock signal of the gate-off voltage input to the clock terminal CLK1_CR to the second node QB. Also, the inverter unit 570 may apply the high voltage to the second node QB when the clock signal of the gate-on voltage is applied to the clock terminal CLK1_CR. The inverter unit 570 may include a third transistor (T3-1 and T3-2), a seventh transistor T7, and an eighth transistor T8. The third transistor (T3-1 and T3-2) may include a third-first transistor T3-1 and a third-second transistor T3-2. The third-first transistor T3-1 includes the control terminal connected to the first node Q, the input terminal connected to the clock terminal CLK1_CR, and the output terminal connected to the third-second transistor T3-2. The third-second transistor T3-2 includes the control terminal connected to the first node Q, the input terminal connected to the output terminal of the third-first transistor T3-1, and the output terminal connected to the second node QB. The seventh transistor T7 includes the control terminal connected to the clock terminal CLK1_CR, the input terminal connected to the high voltage terminal VGH, and the output terminal connected to the second node QB. The eighth transistor T8 includes the control terminal connected to the second node QB, the input terminal connected to the high voltage terminal VGH, and the output terminal connected to the second node QB. In another exemplary embodiment, the eighth transistor T8 may be omitted.

Figure 19:
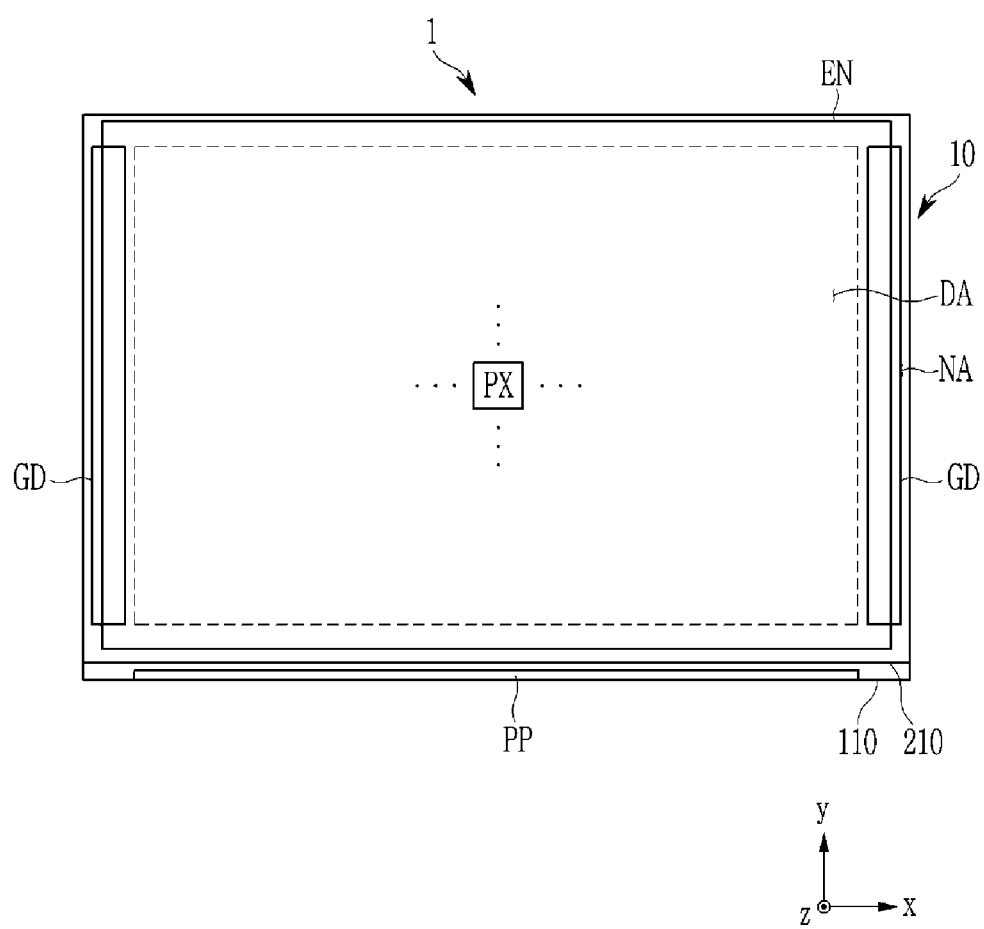
FIG. 19 is a schematic top plan view of an exemplary embodiment of a display device.
Figure 20A:
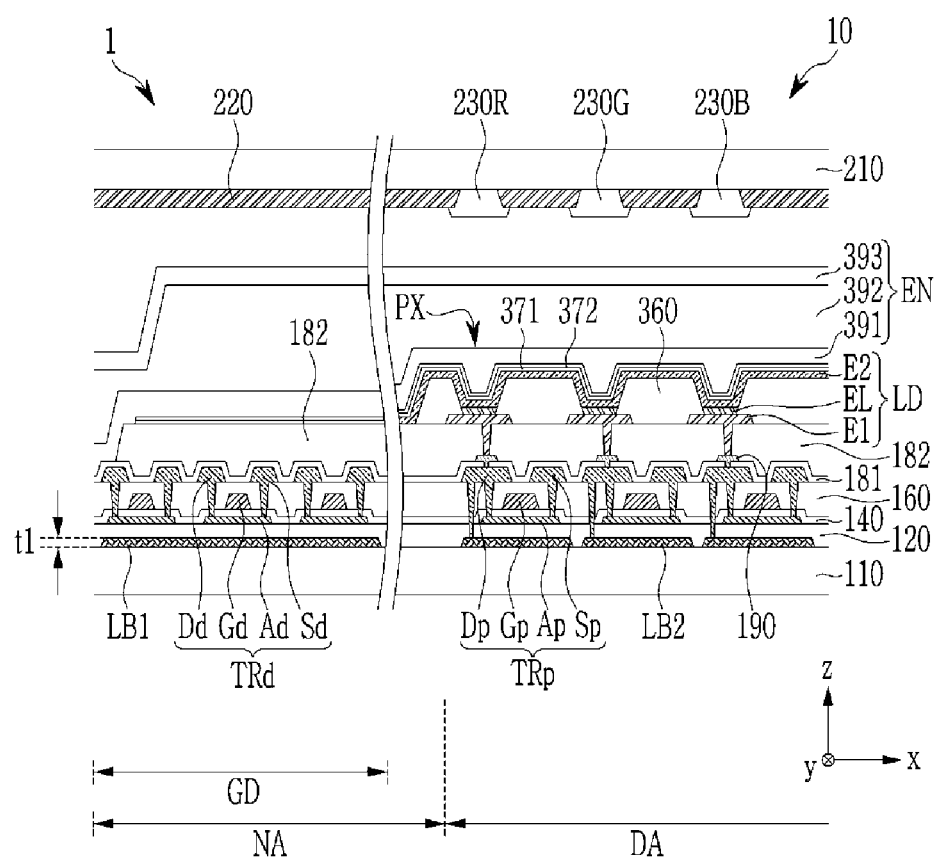
FIGS. 20A, 20B, and 20C are cross-sectional views of exemplary embodiments of a display area and a non-display area, respectively.

Next, an exemplary embodiment of the structure of the display device is described with reference to FIGS. 19 to 21. FIG. 19 is a schematic top plan view of an exemplary embodiment of a display device, FIGS. 20A, 20B, and 20C are cross-sectional views of exemplary embodiments of a display area and a non-display area, respectively, and FIG. 21 is a partial top plan view of a non-display area.

Referring to FIG. 19, the display device 1 includes a display panel 10 including a display area DA and a non-display area NA. The display area DA and the non-display area NA are separated regions in a plan view. In FIG. 19, the inside and the outside of the dotted line quadrangle correspond to the display area DA and the non-display area NA, respectively.

In the display panel 10, the display area DA corresponds to a screen on which the image is displayed. In the non-display area NA around the display area DA, circuits and/or signal lines to generate and/or transmit various signals applied to the display area DA are disposed. The non-display area NA may surround the display area DA.

In the display area of the display panel 10, the pixels PX are disposed in a matrix for example. Signal lines such as gate lines (also known as scan lines), data lines, and driving voltage lines are also disposed in the display area DA. A gate line, a data line, and a driving voltage line are connected to each pixel PX, and each pixel PX may be applied with a gate signal (also referred to as a scan signal), a data signal, and a driving voltage from these signal lines. Each pixel PX in an exemplary embodiment may include a light-emitting element that may be an LED. In the display area DA, signal lines such as the sensing lines or light emission control lines that may be connected to the pixel PX, or signal lines transmitting different signals from that as above-described, may be further disposed.

In the display area DA, a touch sensor layer for sensing a contact or non-contact touch of a user may be disposed. Although the display area DA of the rectangular shape is shown, the display area DA may have various shapes such as a polygon, a circle, an ellipse, and the like other than the quadrangle, and the edges may be rounded polygons.

In the non-display area NA of the display panel 10, a pad portion PP in which pads for receiving the signal from the outside of the display panel 10 are disposed is disposed. The pad portion PP may be positioned, for example, to be elongated in the first direction x along one edge of the display panel 10. The display device 1 may include a flexible printed circuit film that is bonded to the pad portion PP. The pads of the flexible printed circuit film may be electrically connected to the pads of the pad portion PP. The display panel 10 may include a plurality of pad portions PP separated from each other in the first direction x depending on the size of the display panel 10, and one flexible printed circuit film may be bonded to each pad portion PP. In FIG. 19, the pad portion PP is disposed at the lower end of the display panel 10, however the pad portion PP may be disposed at the upper end of the display panel 10, or may be disposed at the lower end and the upper end.

The display device 1 includes a driving unit disposed in the non-display area NA of the display panel 10. The driving unit may generate and/or process various signals for driving the display panel 10. The driving unit may include a data driver for applying the data signal to the data lines, a gate driver GD for applying the gate signal to the gate lines, and a signal controller controlling the data driver and the gate driver.

The gate driver GD may be integrated on the non-display area NA of the display panel 10, particularly on the first substrate 110, and may be disposed on both sides or one side of the display area DA. The data driver may be provided in the form of an IC chip, and may be disposed on the flexible printed circuit film that is bonded to the pad portion PP or in the non-display area NA of the display panel 10. The signal controller may be provided in the form of an IC chip, and may be disposed on a PCB to which the flexible printed circuit film is bonded. The data driver and signal controller may be provided in the form of an integrated chip.

The gate driver GD disposed in the non-display area NA is connected to the gate lines to apply the gate signal to the pixels PX. The gate driver GD is integrated in the non-display area NA. The gate driver GD receives driver controlling signals such as the vertical start signal, the clock signals, and the low voltage corresponding to the gate-off voltage from the signal controller to generate the gate signal (e.g., the gate-on voltage and the gate-off voltage) to be applied to the gate lines. The gate driver GD includes a driving circuit (also referred to as a shift register) that generates and outputs the gate signal by these signals, and the driving circuit includes the stages that are dependently connected to each other. The gate driver GD also includes driver controlling signal lines that transmit the driver control signals to the stages. The stages are connected one-to-one to the gate lines, thereby allowing the gate signals to be sequentially output to the gate lines for each frame. Each stage includes the transistors, and may include at least one capacitor. Some signals of the driver control signals may be provided by devices other than the signal controller.

The display panel 10 includes an encapsulation layer EN entirely covering the display area DA. The encapsulation layer seals the display area, especially the light-emitting elements, to prevent moisture or oxygen from penetrating into the display panel 10, particularly in the display area DA. The edge of the encapsulation layer EN may be disposed between the edge of the display panel 10 and the display area DA.

Next, the cross-section of the partial region of the display area DA and the partial region where the gate driver among the non-display area NA is disposed is described with reference to FIG. 20A.

Referring to the cross-sectional structure, the display panel 10 includes a first substrate 110 and various layers, wires, and elements disposed thereon. The display panel 10 may include a second substrate 210 bonded to the first substrate 110 by a sealant (not shown). In the display area DA of the display panel 10, a large number of pixels is disposed, but only three pixels are briefly described to avoid complexity of the drawing. In addition, although each pixel PX of the display area DA includes the transistors, the capacitor, and the light-emitting element, one transistor TRp and one light-emitting element LD connected thereto are shown and described. Also, some transistors TRd disposed particularly in the gate driver GD among the non-display area NA are shown and described.

In an exemplary embodiment, the first substrate 110 may be a rigid substrate including at least one of glass, quartz, ceramic, and the like, for example. In an exemplary embodiment, the first substrate 110 may be a flexible substrate including a polymer such as a polyimide.

A first metal layer LB1 in the non-display area NA and a second metal layer LB2 in the display area DA may be disposed on the first substrate 110. The first metal layer LB1 and the second metal layer LB2 may prevent external light from reaching the semiconductor layers Ap and Ad of the transistors TRp and TRd, thereby preventing characteristic deterioration of the semiconductor layers Ap and Ad. A leakage current of the transistors TRp and TRd, particularly the driving transistor of which the current characteristic is important in the light emitting diode display, may be controlled by the first metal layer LB1 and the second metal layer LB2. The first metal layer LB1 and the second metal layer LB2 may include a material that does not transmit light of a wavelength band to be shielded, and for example, may include a metal, a metal alloy, or a conductive material equivalent to the metal.

The first metal layer LB1 and the second metal layer LB2 may function as electrodes for receiving a specific voltage on the display panel 10. In this case, the second metal layer LB2 may improve the characteristic as the driving transistor by reducing the current change rate in a saturation region of the voltage-current characteristic graph of the transistor TRp.

Also, the first metal layer LB1 and the second metal layer LB2 may be electrically connected to other signal lines (e.g., the gate lines, the driving voltage lines, etc.) or may be in a floating state.

In an exemplary embodiment, the thickness tl of the first metal layer LB1 and the second metal layer LB2 may be about 1000 angstroms to about 4000 angstroms, for example. The thickness of the first metal layer LB1 and the second metal layer LB2 may be relatively large compared to other constituent elements.

A buffer layer 120 may be disposed on the first metal layer LB1 and the second metal layer LB2. The buffer layer 120 may serve to block an impurity that may be diffused from the first substrate 110 to the semiconductor layers Ap and Ad in the process of forming the semiconductor layers Ap and Ad and to reduce the stress applied to the first substrate 110. In an exemplary embodiment, the buffer layer 120 may include an inorganic insulating material such as a silicon oxide and a silicon nitride.

This specification describes an exemplary embodiment in which the buffer layer 120 is provided to be flat while covering the first metal layer LB1 and the second metal layer LB2, but is not limited thereto, and the buffer layer 120 may have a step along the first metal layer LB1 and second metal layer LB2.

The semiconductor layers Ap and Ad of the transistors TRp and TRd may be disposed on the buffer layer 120. The semiconductor layers Ap and Ad may include a channel region overlapped with the gate electrodes Gp and Gd, and doped source and drain regions on respective sides thereof. In an exemplary embodiment, the semiconductor layers Ap and Ad may include polysilicon, amorphous silicon, or an oxide semiconductor.

The semiconductor layers Ap and Ad in an exemplary embodiment may be disposed on the first metal layer LB1 and the second metal layer LB2. In more detail, the semiconductor layer Ad disposed in the gate driver GD may be disposed on the top surface of the first metal layer LB1, and the semiconductor layer Ap disposed in the display area DA may be disposed on the top surface of the second metal layer LB2. Each of the semiconductor layers Ap and Ad may not overlap the sides of the first metal layer LB1 or he second metal layer LB2. That is, the edge of each semiconductor layers Ap and Ad may be disposed inside the edge of the first metal layer LB1 or the edge of the second metal layer LB2 in a plan view.

On the semiconductor layers Ap and Ad, a first insulating layer 140 including an inorganic insulating material such as a silicon oxide, a silicon nitride, and the like, or an organic insulating material, may be disposed. The first insulating layer 140 may be also referred to as a gate insulating layer.

On the first insulating layer 140, a gate conductor including the gate lines, the driver controlling signal lines, and the gate electrodes Gp and Gd of the transistors TRp and TRd may be disposed. In an exemplary embodiment, the gate conductor may include the metal or the metal alloy such as molybdenum (Mo), copper (Cu), aluminum (Al), silver (Ag), chromium (Cr), tantalum (Ta), titanium (Ti), and the like, or a multilayer such as titanium (Ti)/molybdenum (Mo).

A second insulating layer 160 may be disposed on the first insulating layer 140 and the gate conductor. In an exemplary embodiment, the second insulating layer 160 may include the inorganic insulating material such as a silicon oxide, a silicon nitride, and the like, or the organic insulating material. The second insulating layer 160 may be also referred to as an interlayer insulating layer.

On the second insulating layer 160, the data conductor including the data line, the driving voltage line, the common voltage line, and the source electrodes Sp and Sd and the drain electrodes Dp and Dd of the transistors TRp and TRd may be disposed.

The source electrodes Sp and Sd and drain electrodes Dp and Dd may be connected to the source region and the drain region of the semiconductor layers Ap and Ad via the contact holes defined in the second insulating layer 160 and the first insulating layer 140, respectively. One of the source electrode Sp and the drain electrode Dp may be connected to the second metal layer through a contact hole defined in the second insulating layer 160, the first insulating layer 140, and the buffer layer 120.

In an exemplary embodiment, the data conductor may include the metal or the metal alloy such as copper (Cu), aluminum (Al), silver (Ag), chromium (Cr), tantalum (Ta), titanium (Ti), and the like.

In an exemplary embodiment, the data conductor may be the multilayer such as titanium/copper (Ti/Cu), titanium/aluminum (Ti/Al), titanium/copper/titanium (Ti/Cu/Ti), titanium/aluminum/titanium (Ti/Al/Ti), molybdenum/aluminum/titanium (Mo/Al/Mo), and the like.

The gate electrode Gp, the source electrode Sp, and the drain electrode Dp form the transistor TRp together with the semiconductor layer Ap. The gate electrode Gd, the source electrode Sd, and the drain electrode Dd form the transistor TRd together with the semiconductor layer Ad. In the illustrated exemplary embodiment, the drain electrode Dp is connected to the metal layer LB2 through the contact hole defined in the second insulating layer 160, the first insulating layer 140, and the buffer layer 120. In the transistors TRp and TRd, the gate electrodes Gp and Gd are disposed above the semiconductor layers Ap and Ad, but the structure of the transistors is not limited thereto and may be variously changed.

A third insulating layer 181 including the inorganic insulating material such as silicon nitride, silicon oxide, and the like may be disposed on the data conductor. The third insulating layer 181 of the inorganic insulating layer may be also referred to as a passivation layer. In another exemplary embodiment, the third insulating layer 181 may be omitted.

An ohmic contact (or a contact member) 190 may be disposed on the third insulating layer 181. The ohmic contact (or the contact member) 190 may be disposed in the display area DA and connected to the drain electrode Dp through the contact hole. The first electrode E1 and the drain electrode Dp to be described later may be connected through the ohmic contact (or the contact member) 190.

The ohmic contact (or the contact members) 190 improves the adherence of the drain electrode Dp and the first electrode E1, respectively, which are in contact, and may prevent oxidation of the drain electrode Dp. In the exemplary embodiment, when the drain electrode Dp includes copper, it may prevent oxidation of the copper. For this, the ohmic contact (or the contact member) 190 may include the conductive material capable of preventing the corrosion of the drain electrode Dp, for example, the conductive material preventing the corrosion of copper, by capping the drain electrode Dp. In an exemplary embodiment, the ohmic contact (or the contact member) 190 may include the conductive material of a metal oxide such as ITO, IZO, and the like.

On the third insulating layer 181 and the ohmic contact (or the contact member) 190, a fourth insulating layer 182 including the organic insulating material may be disposed. The fourth insulating layer 182 may be an organic insulating layer, for example, that may include a polyimide, acryl-based polymers, and siloxane-based polymers. The fourth insulating layer 182 may be also referred to as a planarization layer.

The first electrode E1 may be disposed on the fourth insulating layer 182. The first electrode E1 in an exemplary embodiment may be connected to the ohmic contact (or the contact member) 190 through the contact hole defined in the fourth insulating layer 182. The first electrode E1 may be connected to the drain electrode Dp through the ohmic contacts 190.

In an exemplary embodiment, the first electrode E1 is the metal or the metal alloys such as silver (Ag), nickel (Ni), gold (Au), platinum (Pt), aluminum (Al), copper (Cu), aluminum-neodymium (AlNd), and aluminum-nickel-lanthanum (AlNiLa). In an exemplary embodiment, the first electrode E1 may include a transparent conductive material such as ITO, IZO, and the like. In an exemplary embodiment, the first electrode E1 may be a multilayer such as ITO/Ag/ITO and ITO/aluminum (Al).

On the fourth insulating layer 182, a fifth insulating layer 360 in which an opening overlapping the first electrode E1 is defined may be disposed. The opening of the fifth insulating layer 360 may define each pixel area, and may be also referred to as a pixel definition layer. The fifth insulating layer 360 may include the organic insulating material or the inorganic insulating material.

The emission layer EL is disposed on the first electrode E1 and the second electrode E2 is disposed on the emission layer EL. The second electrode E2 may be supplied with the common voltage ELVSS. In an exemplary embodiment, the second electrode E2 may have light transmittance by forming a thin layer of a metal having a low work function such as calcium (Ca), barium (Ba), magnesium (Mg), aluminum (Al), and silver (Ag). In an exemplary embodiment, the second electrode E2 may include the transparent conductive material such as ITO or IZO.

The first electrode E1, the emission layer EL, and the second electrode E2 of each pixel PX form the light-emitting element LD such as the LED. The first electrode E1 may be an anode of the LED, and the second electrode E2 may be a cathode of the LED. The first electrode E1 may be also referred to as a pixel electrode, and the second electrode E2 may be also referred to as a common electrode. The light-emitting element LD may be a light-emitting element that emits blue light or a light-emitting element that emits a white light. In an alternative exemplary embodiment, the light-emitting element LD may include the light-emitting elements emitting three primary colors, for example, the light-emitting element emitting red light, the light-emitting element emitting green light, and the light-emitting element emitting blue light.

A capping layer 371 may be disposed on the second electrode E2, and a functional layer 372 may be disposed on the capping layer 371. The capping layer 371 may increase light efficiency by adjusting a refractive index. The functional layer 372 may serve to prevent damage to underlying layers and increase optical efficiency when forming the encapsulation layer EN. In an exemplary embodiment, the capping layer 371 may include the inorganic insulating material, and the functional layer 372 may include a material such as lithium fluoride (LiF). The capping layer 371 and the functional layer 372 may extend to the non-display area NA. The capping layer 371 and the functional layer 372 may cover a portion of the non-display area NA or may be disposed to cover the entire area.

The encapsulation layer EN may be disposed on the capping layer 371 and the functional layer 372. The encapsulation layer EN seals the light-emitting element LD to prevent the penetration of moisture or oxygen from the outside. The encapsulation layer EN covers the entire display area DA, and the edges of the encapsulation layer EN may be disposed in the non-display area NA.

In the encapsulation layer EN, at least one inorganic layer and at least one organic layer are stacked. In the illustrated exemplary embodiment, the encapsulation layer EN is a thin film encapsulation layer including a first inorganic layer 391, an organic layer 392, and second inorganic layer 393. In the encapsulation layer EN, the first inorganic layer 391 and the second inorganic layer 393 mainly serve to prevent the penetration of moisture, etc., and the organic layer 392 mainly flattens the surface of the second inorganic layer 393 in the surface of the encapsulation layer EN, particularly in the display area DA. In an exemplary embodiment, the first inorganic layer 391 and the second inorganic layer 393 may include the inorganic insulating material such as silicon oxide and silicon nitride. In an exemplary embodiment, the organic layer 392 may include at least one of an acryl-based resin, a methacrylic-based resin, polyisoprene, a vinyl-based resin, an epoxy-based resin, a urethane-based resin, a cellulosic-based resin, and a perylene-based resin, for example.

The first inorganic layer 391 and the second inorganic layer 393 are wider than the organic layer 392, and the first inorganic layer 391 and the second inorganic layer 393 may be in contact near the edge of the encapsulation layer EN. The edge of the first inorganic layer 391 and the edge of the second inorganic layer 393 may approximately coincide. By widely forming the first inorganic layer 391 and the second inorganic layer 393 in this way, it is possible to prevent the penetration of moisture or oxygen from the side of the display area DA, and to delay the penetration by lengthening and complicating the penetration path of moisture or oxygen.

This specification has described the encapsulation layer in which the inorganic layers and the organic layers are alternately stacked, but it is not limited thereto, and may include an encapsulation layer of a flat shape.

A second substrate 210 bonded with the first substrate 110 by a sealant (not shown) enclosing the edge of the display panel 10 is disposed on the encapsulation layer EN. To expose the pad portion PP outside for the bonding of the printed circuit film, in the region where the pad portion PP is disposed, for example, the lower end of the display panel 10, the second substrate 210 is shorter than the first substrate 110.

In an exemplary embodiment, the second substrate 210 may include a transparent and rigid material such as glass, quartz, ceramic, or the like. The second substrate 210 may be spaced apart from the encapsulation layer EN by a predetermined distance.

A light blocking member 220, and color filters 230R, 230G, and 230B may be disposed on the surface of the second substrate 210 toward the first substrate 110. The color filters 230R, 230G, and 230B may include a red color filter 230R, a green color filter 230G, and a blue color filter 230B. A capping layer may be disposed on the color filters 230R, 230G, and 230B.

The light blocking member 220 is disposed in a region except for the pixel area (e.g., the region overlapping the emission layer EL), thereby preventing the light transmission in the region except for the pixel area. The light blocking member 220 may be disposed between the red color filter 230R and the green color filter 230G, between the green color filter 230G and the blue color filter 230B, and between the blue color filter 230B and the red color filter 230R. The light blocking member 220 may define the region where the red color filter 230R, the green color filter 230G, and the blue color filter 230B are disposed.

When the plurality of light-emitting elements LD disposed in the display area DA is the light-emitting elements emitting blue light, the red color filter 230R may convert blue light into red light, the green color filter 230G may convert blue light into green light, and the blue color filter 230B may transmit blue light as it is. Accordingly, the red color filter 230R and the green color filter 230G may be also referred to as color conversion layers, and the blue color filter 230B may be also referred to as a transmissive layer. The red color filter 230R may include at least one of a quantum dot and a phosphor for converting blue light into red light. The green color filter 230G may include at least one of a quantum dot and a phosphor for converting blue light into green light. The blue color filter 230B may include a resin that transmits blue light, and may further include a dye or pigment. A blue light cutting filter (e.g., a yellow color filter) that transmits wavelengths other than the blue wavelength band and blocks the blue wavelength band may be disposed between the red color filter 230R and the green color filter 230G, and the second substrate 210.

A touch sensor layer including touch electrodes for sensing a touch may be disposed on the second substrate 210, and a polarization layer may be disposed to reduce external light reflection.

Next, the cross-sectional for the partial region of the display area DA and the partial region in which the gate driver is disposed among the non-display area NA is described with reference to FIG. 20B. The description of the same constituent elements as the constituent elements above-described in FIG. 20A is omitted.

A third-first insulating layer 181a including the inorganic insulating material such as a silicon nitride and a silicon oxide may be disposed on the data conductor including the source electrode Sp and the drain electrode Dp. The third-first insulating layer 181a of the inorganic insulating layer may be also referred to as the passivation layer.

An additional conductive layer (Sp2 and Dp2) having substantially the same plan shape as that of the data conductor Sp and Dp may be disposed on the third-first insulating layer 181a. The additional conductive layer Sp2 and Dp2 may include a plurality of the conductive patterns disposed thereunder, having substantially the plan shape as the data conductor including the source electrode Sp and the drain electrode Dp, and electrically connected to the data conductor including the source electrode Sp and the drain electrode Dp. In an exemplary embodiment, the additional conductive layer (Sp2 and Dp2) may be omitted.

The conductive patterns including the additional conductive layer (Sp2 and Dp2) may be applied with the same voltage as that of the data conductor including the source electrode Sp and the drain electrode Dp, thereby lowering the resistance. The additional conductive layer (Sp2 and Dp2) may include the same or similar material as that of the data conductor including the source electrode Sp and the drain electrode Dp.

A third-second insulating layer 181b may be disposed on the additional conductive layer (Sp2 and Dp2). In an exemplary embodiment, the third-second insulating layer 181b may include the inorganic insulating material such as a silicon nitride or a silicon oxide.

An ohmic contact (or a contact member) 190 may be disposed on the third-second insulating layer 181b. The ohmic contact (or the contact member) 190 may be connected to the drain electrode additional conductive layer Dp2 disposed in the display area DA and overlapping the drain electrode Dp among the additional conductive layer (Sp2 and Dp2) through the contact hole. The first electrode E1 and the drain electrode Dp to be described later may be connected through the ohmic contact 190.

The ohmic contact 190 improves the adherence of the drain electrode additional conductive layer Dp2 and the first electrode E1 that are in contact, and may prevent oxidation of the exposed drain electrode additional conductive layer Dp2. Particularly, when the drain electrode additional conductive layer Dp2 includes copper, the oxidation of copper may be prevented. For this, the ohmic contact (or contact member) 190 may include a conductive material that may prevent the corrosion of the drain electrode additional conductive layer Dp2, for example, a conductive material that may prevent the corrosion of copper by capping the drain electrode additional conductive layer Dp2. In an exemplary embodiment, the ohmic contacts 190 may include a conductive material such as a metal oxide such as ITO or IZO.

A fourth insulating layer 182 including the organic insulating material may be disposed on the third-second insulating layer 181b and the ohmic contact 190. In an exemplary embodiment, the fourth insulating layer 182 is the organic insulating layer that may include, for example, a polyimide, an acryl-based polymer, a siloxane-based polymer, and the like. The fourth insulating layer 182 may be also referred to as a planarization layer.

Next, the cross-section of the partial region of the display area DA and the partial region in which the gate driver is disposed among the non-display area NA are described with reference to FIG. 20C. The description of the same constituent elements as the constituent elements above-described in FIG. 20B is omitted.

Figure 20B:
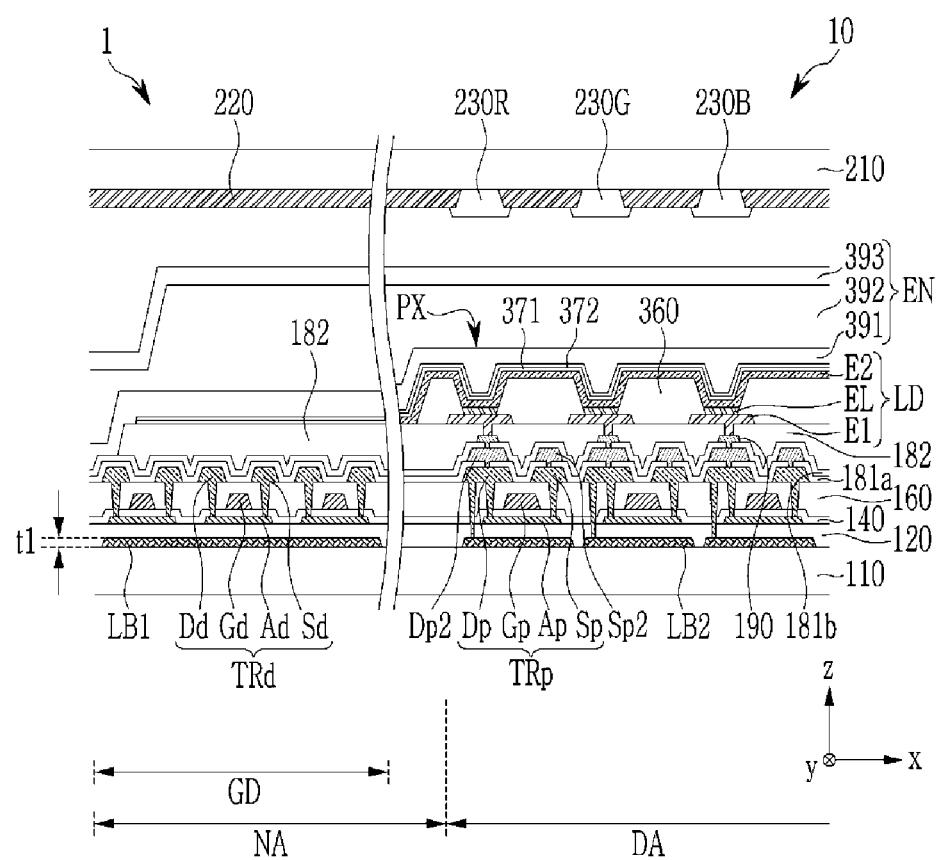
Figure 20C:
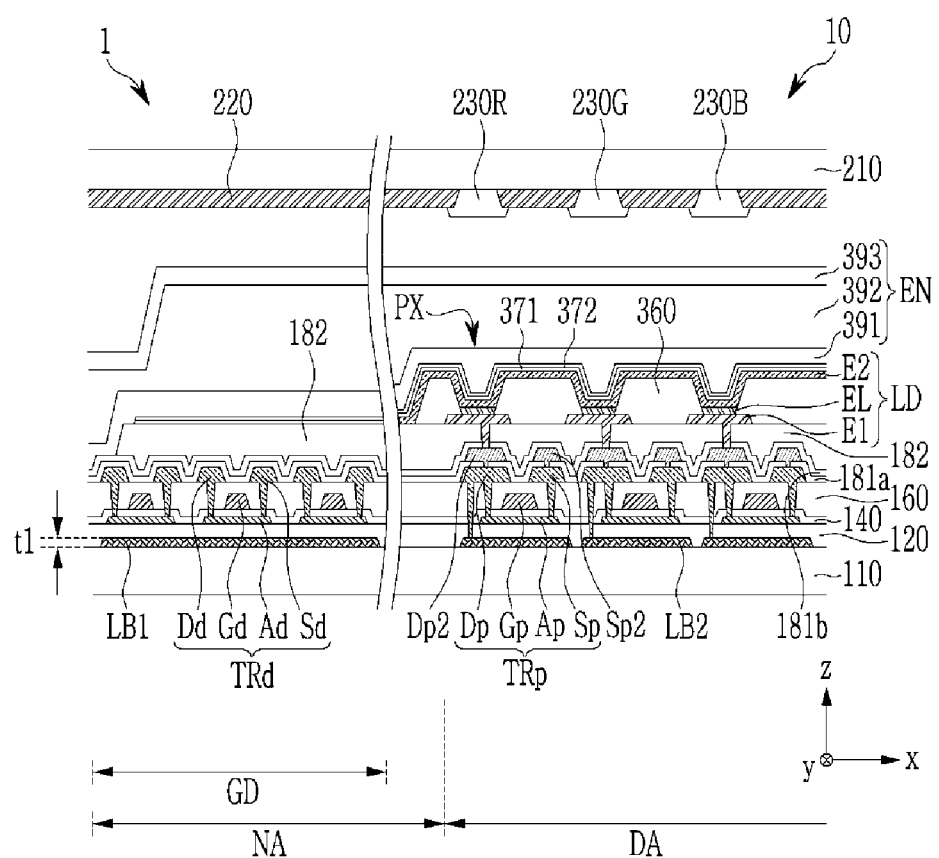
Figure 21:
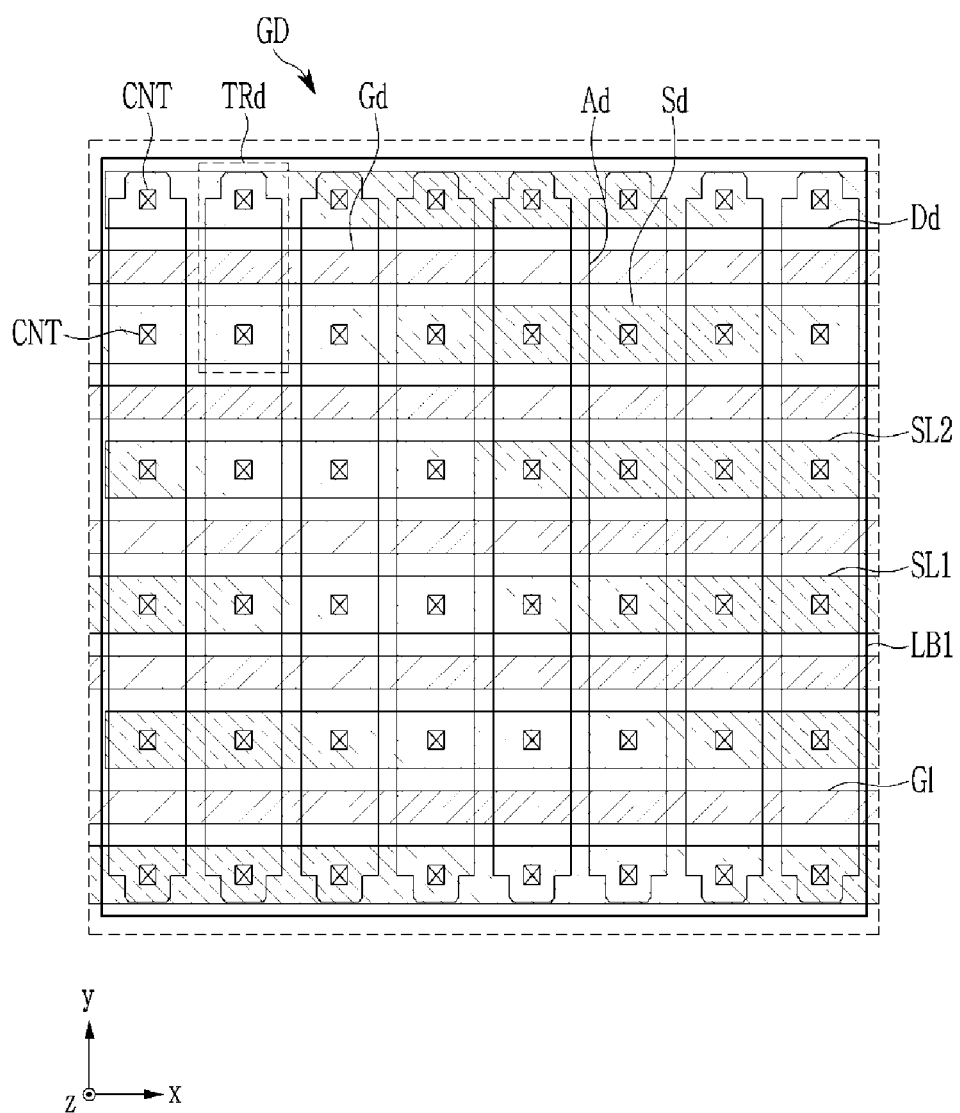
FIG. 21 is a partial top plan view of a non-display area.

Referring to FIG. 20C, the display device in an exemplary embodiment may not include the ohmic contacts (or the contact members) 190 described in FIG. 20B. The fourth insulating layer 182 may be disposed directly on the third-second insulating layer 181b. The first electrode E1 may be in contact with the drain electrode additional conductive layer Dp2 through the contact hole of the fourth insulating layer 182 and the third-second insulating layer 181b. The first electrode E1 may be connected to the drain electrode Dp through the drain electrode additional conductive layer Dp2. Next, the plan shape of the plurality of transistors TRd disposed in the gate driver GD is described with reference to one among FIGS. 20A to 20C and 21. In this case, a plurality of transistors TRd may be any transistors included in the gate driver GD, and may be the first transistor T1 described in FIG. 18. The plurality of transistors TRd disposed in the gate driver GD may be electrically connected.

Referring to FIG. 21, the first metal layer LB1 may be disposed in the gate driver GD in an exemplary embodiment. The first metal layer LB1 may overlap at least a portion of a plurality of transistors TRd disposed in the gate driver GD. As described above, a plurality of transistors TRd may be the first transistor T1 shown in FIG. 18, and the first metal layer LB1 may overlap a plurality of first transistors TRd. In an exemplary embodiment, the first metal layer LB1 may have a flat plate shape so as to overlap all of a plurality of first transistors TRd positioned in the gate driver GD.

The first metal layer LB1 may receive a predetermined voltage. When the voltage is applied to the first metal layer LB1, the current flowing in comparison with the same voltage may be increased by applying a back bias voltage. In this case, since the area of the first transistor TRd occupying the gate driver GD may be reduced, the area of the non-display area NA may be reduced.

Although not shown in this specification, the first metal layer LB1 may be connected to the gate electrode or the source electrode through the contact hole outside the display region in order to receive a predetermined voltage, but is not limited thereto.

The semiconductor layer Ad may be disposed on the first metal layer LB1 and the buffer layer 120. The gate driver GD may include a plurality of semiconductor layers Ad. The plurality of semiconductor layers Ad may be repeatedly disposed along the first direction x. The semiconductor layer Ad may have a stripe shape extending along the second direction y, but is not limited thereto.

A plurality of gate lines G1 including a gate electrode Gd may be disposed on the semiconductor layer Ad and the first insulating layer 140. Each of the plurality of gate lines G1 may have a stripe shape extending along the first direction x. A plurality of gate lines G1 may be repeatedly disposed along the second direction y.

Next, a first signal line SL1 including a source electrode Sd and a second signal line SL2 including a drain electrode Dd may be disposed on the gate lines G1 and the second insulating layer 160.

Each of the first signal line SL1 and the second signal line SL2 may have a form extending along the first direction x, and may have, for example, a stripe form. The first signal line SL1 and the second signal line SL2 may be disposed alternately along the second direction y.

The source electrode Sd included in the first signal line SL1 may be connected to the semiconductor layer Ad through a contact hole CNT defined in the first insulating layer 140 and the second insulating layer 160. The drain electrode Dd included in the second signal line SL2 may be connected to the semiconductor layer Ad though the contact hole CNT defined in the first insulating layer 140 and the second insulating layer 160.

In an exemplary embodiment, the transistor TRd disposed in the gate driver GD may include the gate electrode Gd, the semiconductor layer Ad, the source electrode Sd, and the drain electrode Dd, and may be the first transistor T1 described in FIG. 18 for example. Referring to FIG. 18, the gate electrode Gd disposed in the gate driver GD may be connected to the first node Q, the clock signal may be applied to the source electrode Sd, and a predetermined gate signal may be output through the drain electrode Dd.

In an exemplary embodiment, the first metal layer LB1 may overlap most of a region occupied by the transistor TRd corresponding to the first transistor in the gate driver GD. The first metal layer LB1 may have a flat plate shape overlapping the region.

The semiconductor layer Ad may be disposed only on the upper surface of the first metal layer LB1. The edge of the semiconductor layer Ad may be disposed inside the edge of the first metal layer LB1 in a plan view. The plane width of the semiconductor layer Ad may be smaller than the plane width of the first metal layer LB1.

The first metal layer LB1 may have a fairly large thickness. In this case, the semiconductor layer Ad included in the gate driver GD in an exemplary embodiment may be disposed only on the first metal layer LB1 and thus may be provided without the step, thereby the display device with excellent reliability may be provided without a disconnection of the semiconductor layer Ad.

Next, the display device in an exemplary embodiment is described with reference to FIGS. 22A to 22C and 23. The constituent elements described with reference to FIGS. 20A to 20C and 21 are omitted.

Figure 22A:
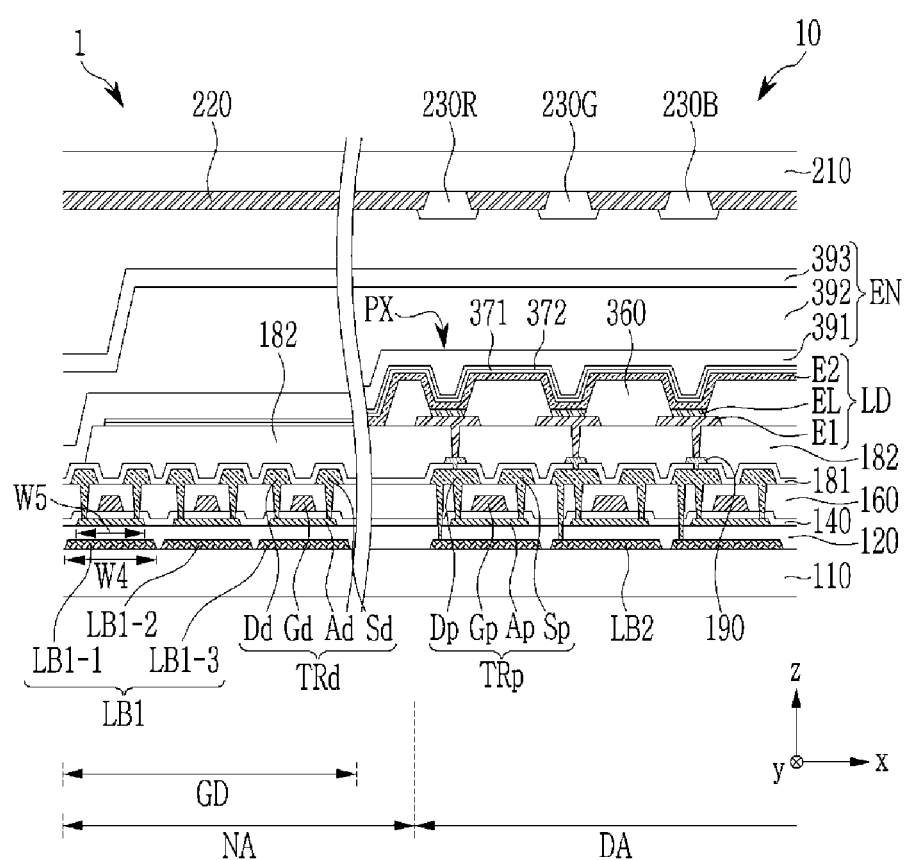
FIGS. 22A, 22B, and 22C are cross-sectional views of exemplary embodiments of a display area and a non-display area respectively.
Figure 23:
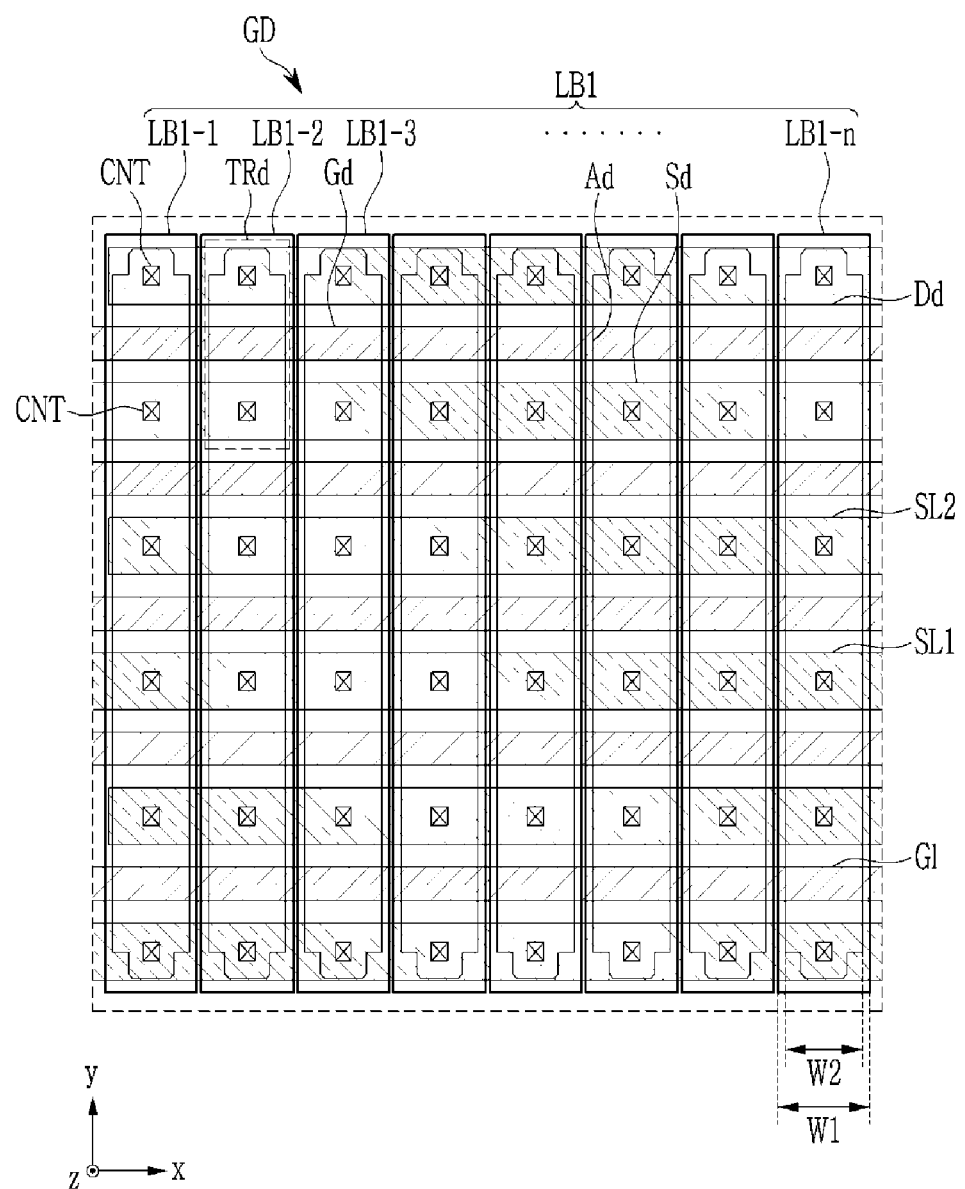
FIG. 23 is a partial top plan view of an exemplary embodiment of a non-display area.

First, referring to FIGS. 22A and 23, the gate driver GD includes a plurality of semiconductor layers Ad. The gate driver GD in an exemplary embodiment may include n semiconductor layers Ad repeatedly disposed along the first direction x.

The first metal layer LB1 overlapping the non-display area NA, particularly the gate driver GD in an exemplary embodiment, may include a plurality of first auxiliary metal layers LB1-1 to LB1-n. The gate driver GD may include n first auxiliary metal layers LB1-1 to LB1-n, similar to the semiconductor layer Ad.

Each first auxiliary metal layer LB1-n may have a stripe shape extending along the second direction y like the semiconductor layer Ad. A plurality of first auxiliary metal layers LB1-1 to LB1-n may be repeatedly disposed along the first direction x. A plurality of first auxiliary metal layers LB1-1 to LB1-n may be spaced apart from each other along the first direction x in a plan view. In this case, the interval between the adjacent first auxiliary metal layers may be smaller than the interval between the adjacent semiconductor layers.

One first auxiliary metal layer LB1-n may overlap one semiconductor layer Ad. In this case, the width W4 of the first auxiliary metal layer LB1-n may be greater than the width W5 of the semiconductor layer Ad. The semiconductor layer Ad may be disposed on an upper surface of the first auxiliary metal layer LB1-n. The semiconductor layer Ad may completely overlap the first auxiliary metal layer LB1-n. The area occupied by the first auxiliary metal layer LB1-n in the gate driver GD may be larger than the area occupied by the semiconductor layer Ad.

The specification describes an exemplary embodiment in which one first auxiliary metal layer LBn overlaps with one semiconductor layer Ad, but is not limited thereto. In an exemplary embodiment, one first auxiliary metal layer LBn may overlap with two, three, or more semiconductor layers Ad, where the edge of the semiconductor layer Ad may be disposed inside the edge of the first auxiliary metal layer LBn, for example.

When the semiconductor layer has the step while being disposed along the side of the first metal layer LB1, the semiconductor layer may be disconnected as the thickness of the first metal layer increases, and the reliability of the display device may decrease.

In an exemplary embodiment, the first metal layer LB1 may have a fairly large thickness. In this case, the semiconductor layer Ad included in the gate driver GD in an exemplary embodiment may be disposed only on the first metal layer LB1 and thus may be provided without the step, thereby the display device with excellent reliability may be provided without the disconnection of the semiconductor layer Ad.

Figure 22B:
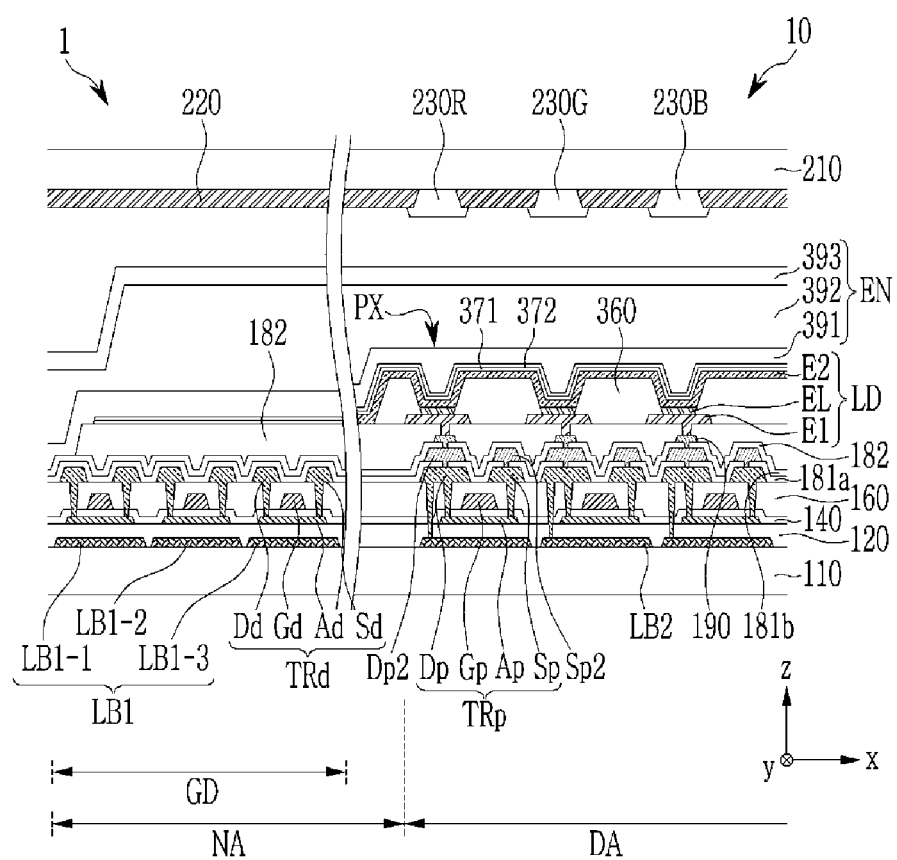

The non-display area NA in the exemplary embodiment of FIG. 22B may be similar to that in the exemplary embodiment of FIG. 22A. The non-display area NA according to the exemplary embodiment of FIG. 22B may further include a third-second insulating layer 181b disposed between the third-first insulating layer 181a and the fourth insulating layer 182. Also, the display area DA may be the same as the display area DA described in FIG. 20B.

Figure 22C:
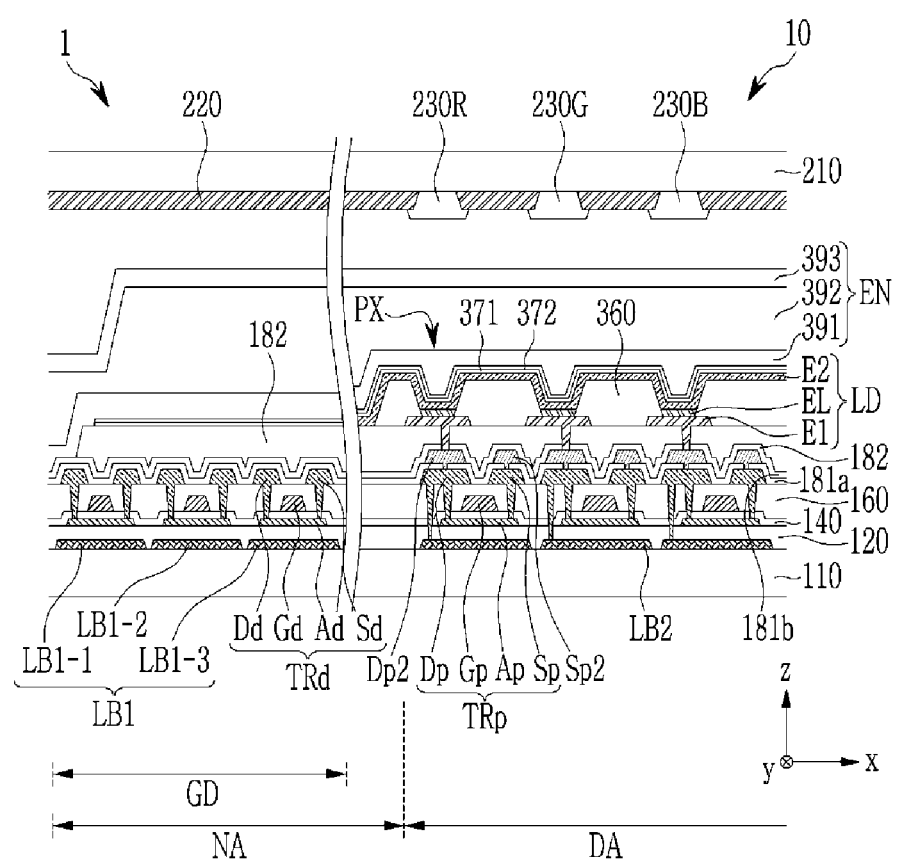

The non-display area NA according to the exemplary embodiment of FIG. 22C may be similar to the exemplary embodiment of FIG. 22B. Also, the display area DA according to the exemplary embodiment of FIG. 22C may be the same as the display area DA described in FIG. 20C.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
a substrate;
a metal layer disposed on the substrate;
a first conductive layer including a lower pattern overlapping on the metal layer;
an active layer disposed on the first conductive layer;
a second conductive layer disposed on the active layer and including a first gate electrode;
a pixel electrode disposed on the second conductive layer; and
an emission layer and a common electrode disposed on the pixel electrode,
wherein each of the first conductive layer and the metal layer receives a voltage,
wherein the first conductive layer is electrically connected to one of a drain region and a source region of the active layer, and
the metal layer is electrically connected to a remaining one of the drain region and the source region of the active layer,
wherein
the metal layer overlaps an entirety of a surface of the substrate, and
an opening overlapping the active layer is defined in the metal layer.

2. The display device of claim 1, further comprising
a third conductive layer disposed between the second conductive layer and the pixel electrode, and including a common voltage line, a driving voltage line, and a data line.

3. The display device of claim 2, wherein
the metal layer includes at least one of a first voltage metal layer connected to the driving voltage line and a second voltage metal layer connected to the common voltage line.

4. The display device of claim 3, wherein
the metal layer includes the first voltage metal layer and the second voltage metal layer, and
the first voltage metal layer and the second voltage metal layer are spaced apart from each other.

5. The display device of claim 4, wherein
an opening overlapping the active layer is defined in the first voltage metal layer and the second voltage metal layer.

6. The display device of claim 2, wherein
the data line includes a first data line, a second data line, and a third data line, and
the metal layer includes at least one among a first sub-metal layer connected to the first data line, a second sub-metal layer connected to the second data line, and a third sub-metal layer connected to the third data line.

7. The display device of claim 6, wherein
the metal layer includes the first sub-metal layer, the second sub-metal layer, and the third sub-metal layer, and
an opening overlapping the active layer is defined in the first sub-metal layer, the second sub-metal layer, and the third sub-metal layer.

8. The display device of claim 6, wherein
the first sub-metal layer, the second sub-metal layer, and the third sub-metal layer are spaced apart from each other.

9. A display device comprising:
a substrate;
a metal layer disposed on the substrate;
a first conductive layer including a lower pattern overlapping the metal layer;
an active layer disposed on the first conductive layer;
a second conductive layer disposed on the active layer and including a first gate electrode;
a pixel electrode disposed on the second conductive layer; and
an emission layer and a common electrode disposed on the pixel electrode,
wherein a thickness of the metal layer is about 6000 angstroms to about 10,000 angstroms,
wherein each of the first conductive layer and the metal layer receives a voltage,
wherein the first conductive layer is electrically connected to one of a drain region and a source region of the active layer, and
the metal layer is electrically connected to a remaining one of the drain region and the source region of the active layer,
the metal layer overlaps an entirety of a surface of the substrate, and
an opening overlapping the active layer is defined in the metal layer.

10. The display device of claim 9, further comprising
an insulating layer disposed between the metal layer and the lower pattern.

11. The display device of claim 9, further comprising
a third conductive layer disposed between the second conductive layer and the pixel electrode and including a common voltage line, a driving voltage line, and a data line.

12. The display device of claim 11, wherein
the metal layer includes a first voltage metal layer connected to the driving voltage line and a second voltage metal layer connected to the common voltage line.

13. The display device of claim 12, wherein
the first voltage metal layer and the second voltage metal layer are spaced apart from each other.

14. The display device of claim 12, wherein
an opening overlapping the active layer is defined in the first voltage metal layer and the second voltage metal layer.

15. The display device of claim 11, wherein
the data line includes a first data line, a second data line, and a third data line, and
the metal layer includes a first sub-metal layer connected to the first data line, a second sub-metal layer connected to the second data line, and a third sub-metal layer connected to the third data line.

16. The display device of claim 15, wherein
an opening overlapping the active layer is defined in the first sub-metal layer, the second sub-metal layer, and the third sub-metal layer.

17. The display device of claim 15, wherein
the first sub-metal layer, the second sub-metal layer, and the third sub-metal layer are spaced apart from each other.

\* \* \* \* \*